(12) United States Patent
Shin et al.

(10) Patent No.: US 11,699,386 B2
(45) Date of Patent: Jul. 11, 2023

(54) DISPLAY DEVICE AND TILED DISPLAY DEVICE INCLUDING THE SAME

(71) Applicant: Samsung Display Co., Ltd., Yongin-si (KR)

(72) Inventors: Dong Hee Shin, Asan-si (KR); Sun Kwun Son, Suwon-si (KR); Na Hyeon Cha, Yongin-si (KR); Dong Hyeon Ki, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/454,185

(22) Filed: Nov. 9, 2021

(65) Prior Publication Data
US 2022/0284849 A1    Sep. 8, 2022

(30) Foreign Application Priority Data

Mar. 3, 2021   (KR) ......................... 10-2021-0027996

(51) Int. Cl.
*G09G 3/32*   (2016.01)

(52) U.S. Cl.
CPC .......... *G09G 3/32* (2013.01); *G09G 2300/026* (2013.01); *G09G 2310/0267* (2013.01); *G09G 2310/0275* (2013.01); *G09G 2310/08* (2013.01)

(58) Field of Classification Search
CPC .............. G09G 3/32; G09G 2300/026; G09G 2310/0267; G09G 2310/0275; G09G 2310/08; G09G 3/003; G09G 2300/0426; G09G 3/035; G09G 2300/0408; G09G 2310/0286; G09G 3/20; G09G 3/3266; C11C 19/28; G06F 3/1446
See application file for complete search history.

(56) References Cited

U.S. PATENT DOCUMENTS

| | | | |
|---|---|---|---|
| 2016/0155391 A1* | 6/2016 | Takesue ................ | G06F 3/1438 345/690 |
| 2017/0337884 A1* | 11/2017 | Kurokawa ........... | G09G 3/3629 |
| 2019/0066604 A1* | 2/2019 | Kong ................... | G09G 3/3291 |
| 2021/0056908 A1* | 2/2021 | Park ..................... | G09G 3/3275 |
| 2021/0202685 A1* | 7/2021 | Ban ..................... | H01L 27/3293 |

FOREIGN PATENT DOCUMENTS

| | | |
|---|---|---|
| KR | 10-2016-0110840 A | 9/2016 |
| KR | 10-2017-0080049 A | 7/2017 |
| KR | 10-1878189 B1 | 7/2018 |

* cited by examiner

*Primary Examiner* — Andrew Sasinowski
(74) *Attorney, Agent, or Firm* — Lewis Roca Rothgerber Christie LLP

(57) ABSTRACT

A display device includes: a display panel including a plurality of display areas, the display areas including scan lines, data lines, and pixels connected to the scan lines and the data lines; a first source driving circuit connected to the data lines of a first display area from among the display areas; a second source driving circuit connected to the data lines of a second display area from among the display areas; a first scan driving circuit configured to receive a first clock signal from the first source driving circuit and to output first scan signals to a first group of scan lines from among the scan lines based on the first clock signal; and a second scan driving circuit configured to receive a second clock signal from the second source driving circuit and to output second scan signals to a second group of scan lines.

20 Claims, 24 Drawing Sheets

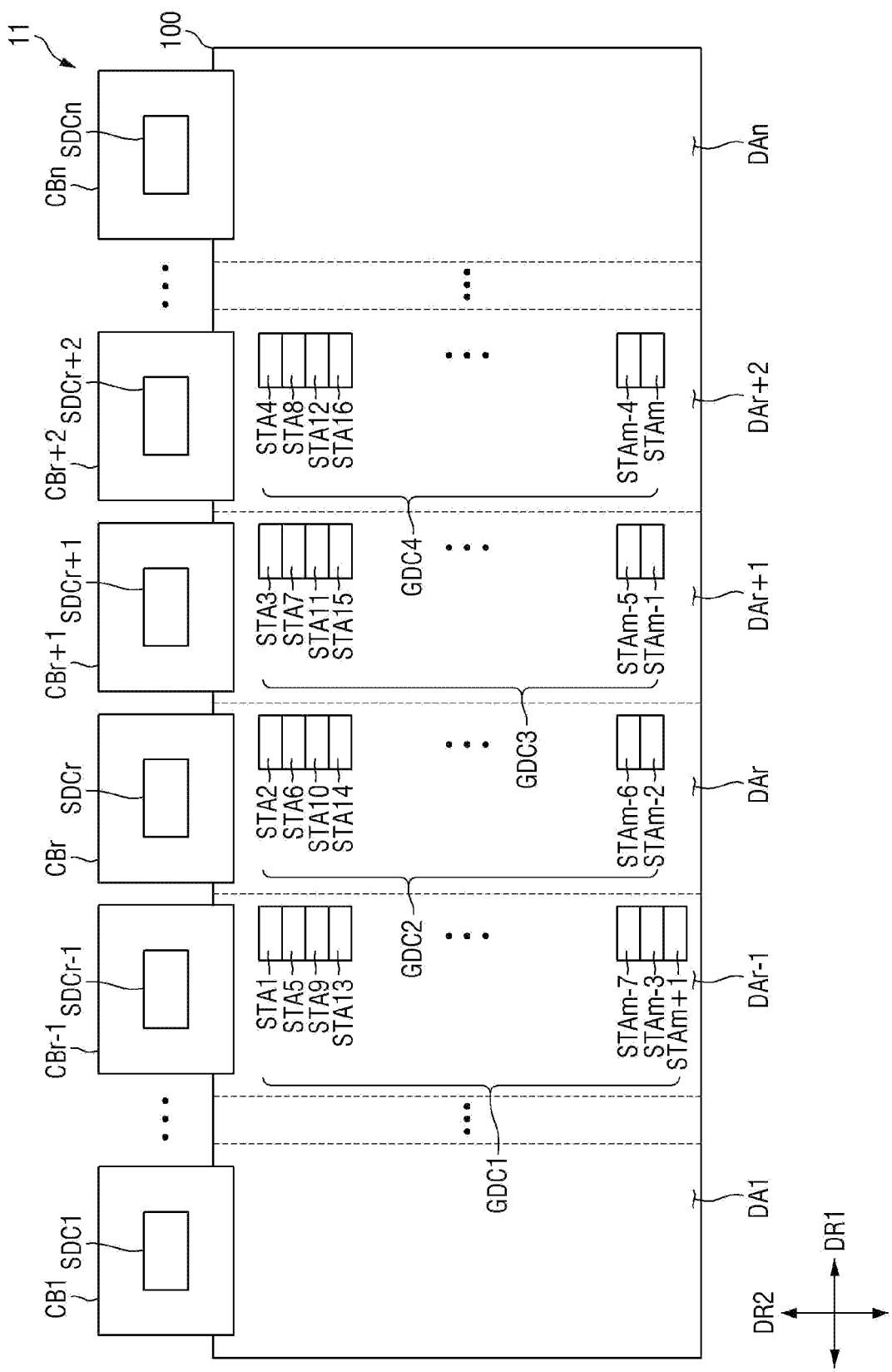

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2021-0027996, filed on Mar. 3, 2021, in the Korean Intellectual Property Office (KIPO), the entire content of which is incorporated by reference herein.

BACKGROUND

1. Field

The present disclosure relates to a display device and a tiled display device including the same.

2. Description of the Related Art

As the information society has developed, the demand for display devices for displaying images has diversified. For example, display devices have been applied to various electronic devices such as smart phones, digital cameras, notebook computers, navigation systems, and smart televisions (TVs). Examples of display devices include a flat panel display device such as a liquid crystal display (LCD) device, a field emission display (FED) device, an organic light-emitting display device, or the like. For example, a light-emitting display device, which is a type of flat panel display device, includes light-emitting elements capable of emitting light by themselves and can thus display an image without a requirement of a backlight unit providing light to a display panel.

In a large-scale display device, the defect rate of light-emitting elements may increase due to an increase in the number of pixels, and therefore the productivity and reliability may decrease. To address these problems, a tiled display device may be realized by connecting multiple display devices having a relatively small size to one another to configure a large-size screen. The tiled display device may include a seam for connecting each pair of adjacent display devices. If the seam is too thick, the distance between each pair of adjacent display devices in the tiled display device may increase. As a result, an image displayed by the tiled display device may appear disconnected between each pair of adjacent display devices in the tiled display device due to the presence of the seam.

SUMMARY

Aspects of some embodiments of the present disclosure provide a display device capable of preventing or reducing visibility of the seam between each pair of individual display devices in a tiled display device and thereby preventing or suppressing images displayed by the corresponding individual display devices in a tiled display device from appearing disconnected from each other.

Aspects of some embodiments of the present disclosure provide a tiled display device capable of preventing or reducing visibility of the seam between each pair of individual display devices therein and thereby preventing or suppressing images displayed by the corresponding individual display devices from appearing disconnected from each other.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, a display device includes: a display panel including a plurality of display areas, the plurality of display areas including scan lines, data lines, and pixels connected to the scan lines and the data lines; a first source driving circuit connected to the data lines of a first display area from among the plurality of display areas; a second source driving circuit connected to the data lines of a second display area from among the plurality of display areas; a first scan driving circuit configured to receive a first clock signal from the first source driving circuit and to output first scan signals to a first group of scan lines from among the scan lines based on the first clock signal; and a second scan driving circuit configured to receive a second clock signal from the second source driving circuit and to output second scan signals to a second group of scan lines from among the scan lines.

The first scan driving circuit may be located adjacent to a first side of the display panel. The second scan driving circuit may be located adjacent to a second side of the display panel.

The first and second scan driving circuits may be located in a middle of the display panel.

The first group of scan lines may be odd-numbered scan lines. The second group of scan lines may be even-numbered scan lines.

The first scan driving circuit may include a first group of stages that are connected to the first group of scan lines, clock terminals of the first group of stages may be connected in common to a first clock line for receiving the first clock signal, and clock bar terminals of the first group of stages may be connected in common to a first clock bar line for receiving a first clock bar signal having a different phase from the first clock signal.

The second scan driving circuit includes a second group of stages that are connected to the second group of scan lines, clock terminals of the second group of stages may be connected in common to a second clock line for receiving the second clock signal, and clock bar terminals of the second group of stages are connected in common to a second clock bar line for receiving a second clock bar signal having a different phase from the second clock signal.

The first scan driving circuit may include a first group of stages that are connected to the first group of scan lines. Each of the first group of stages may include a first scan transistor configured to output the first clock signal, applied to clock terminals in accordance with a voltage of a first node, to one of the first group of scan lines, and a first scan capacitor that is located between a gate electrode and a source electrode of the first scan transistor.

The first scan transistor may be located between a pair of pixels adjacent to each other in a first direction. The first scan transistor may be located between another pair of pixels adjacent to each other in the first direction.

The first scan transistor and the first scan capacitor may be arranged along a second direction that intersects the first direction.

The first direction may be a direction in which the first group of scan lines extend. The second direction may be a direction in which the data lines extend.

The display device may further comprise: a third source driving circuit connected to the data lines of a third display area from among the plurality of display areas; a fourth source driving circuit connected to the data lines of a fourth display area from among the plurality of display areas; a third scan driving circuit configured to receive a third clock signal from the third source driving circuit and to output third scan signals to a third group of scan lines from among the scan lines based on the third clock signal; and a fourth scan driving circuit configured to receive a fourth clock signal from the fourth source driving circuit and to output fourth scan signals to a fourth group of scan lines from among the scan lines based on the fourth clock signal.

The first and second scan driving circuits may be located on a first side of the display panel. The third and fourth scan driving circuits may be located on a second side of the display panel.

The first scan driving circuit may be located closer to the first side of the display panel than the second scan driving circuit. The fourth scan driving circuit may be located closer to the second side of the display panel than the third scan driving circuit.

The first group of scan lines may be (4s-3)-th scan lines, s being a positive integer. The second group of scan lines may be (4s-2)-th scan lines. The third group of scan lines may be (4s-1)-th scan lines. The fourth group of scan lines may be 4s-th scan lines.

The third scan driving circuit may include a third group of stages that are connected to the third group of scan lines, clock terminals of the third group of stages are connected in common to a third clock line for receiving the third clock signal, and clock bar terminals of the third group of stages are connected in common to a third clock bar line for receiving a third clock bar signal having a different phase from the third clock signal.

The fourth scan driving circuit may include a fourth group of stages that are connected to the fourth group of scan lines, clock terminals of the fourth group of stages are connected in common to a fourth clock line for receiving the fourth clock signal, and clock bar terminals of the fourth group of stages are connected in common to a fourth clock bar line for receiving a fourth clock bar signal having a different phase from the fourth clock signal.

Phases of the first, second, third, and fourth clock signals may be sequentially delayed.

According to some embodiments of the present disclosure, a tiled display device comprises: a plurality of display devices; and a seam located between the display devices. Each of the display devices includes a display panel including a plurality of display areas, the plurality of display areas including scan lines, data lines, and pixels connected to the scan lines and the data lines, a first scan driving circuit being located in a first display area from among the plurality of display areas, and a second scan driving circuit being located in a second display area from among the plurality of display areas. A first stage of the first scan driving circuit and a second stage of the second scan driving circuit may be arranged in a same row.

The first display area may be located on a first side of the display panel. The second display area may be located on a second side of the display panel.

The first and second display areas may be located in a middle of the display panel.

According to the aforementioned and other embodiments of the present disclosure, in a case where a plurality of odd-numbered stages are located in a first display area and a plurality of even-numbered stages are located in an n-th display area, the number of stages arranged in the first display area can be reduced as compared to a case where all the stages are located in one display area. Thus, as the last stage of the first display area can be arranged in an m-th row, the distance between first pixels of the m-th row and the edge of a display panel can be shortened. As a result, images displayed by multiple display devices included in a tiled display device can be prevented from appearing disconnected regardless of the presence of a seam between the display devices.

BRIEF DESCRIPTION OF THE DRAWINGS

The above and other embodiments of the present disclosure will become more apparent by describing embodiments thereof with reference to the attached drawings, in which:

FIG. 22 is a layout view of a first display device according to some embodiments of the present disclosure.

DETAILED DESCRIPTION

Figure 1:
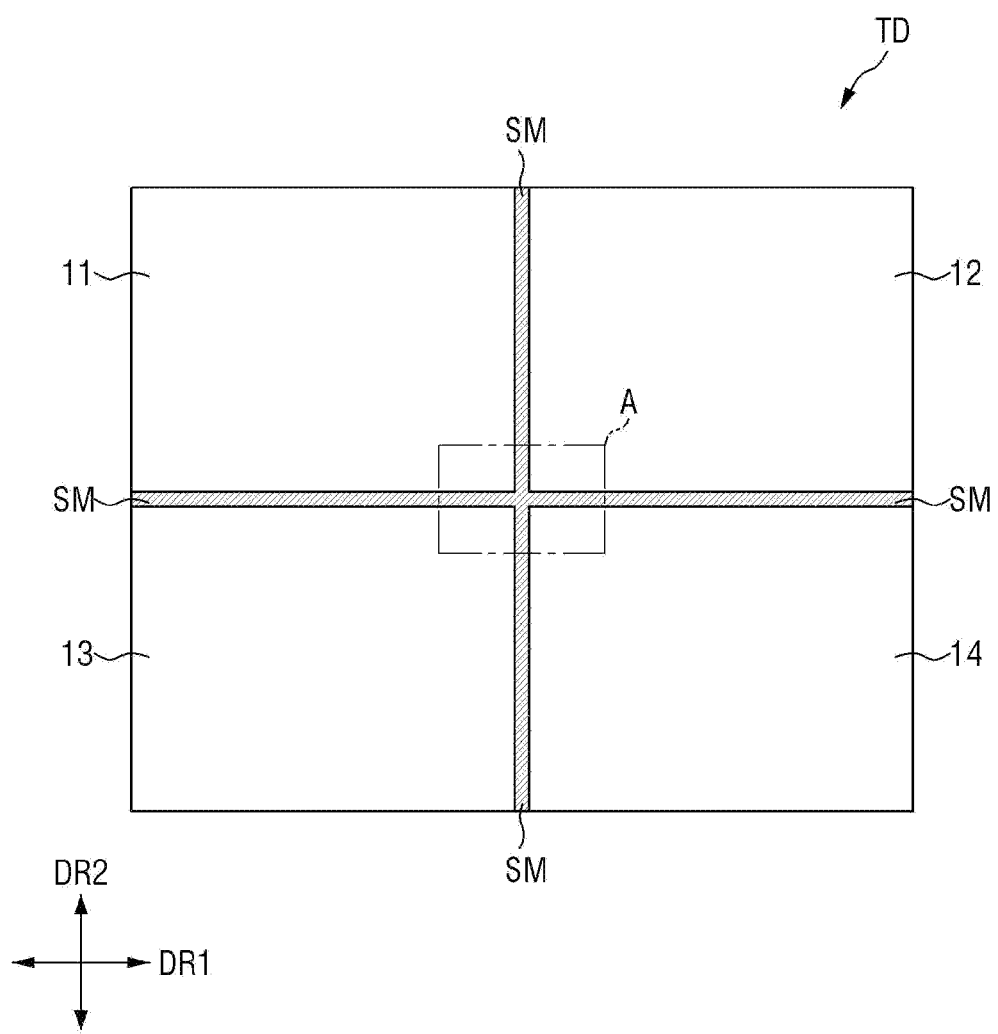
FIG. 1 is a plan view of a tiled display device according to some embodiments of the present disclosure.

Aspects and features of some embodiments of the present disclosure and methods of accomplishing the same may be understood more readily by reference to the detailed description of embodiments and the accompanying drawings.

Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and/or techniques that are not necessary to those having ordinary skill in the art for a complete understanding of the aspects of the present disclosure might be omitted.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A or B, or A and B. As used herein, the term "and/or" includes any and all combinations of one or more of the associated listed items. For example, the expression such as "A and/or B" may include A or B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a tiled display device according to some embodiments of the present disclosure.

Referring to FIG. 1, a tiled display device TD may include a plurality of display devices (11, 12, 13, and 14). In one example, the tiled display device TD may include first, second, third, and fourth display devices 11, 12, 13, and 14.

The display devices (11, 12, 13, and 14) may be arranged in a lattice pattern. In one example, the first and second display devices 11 and 12 may be arranged along a first direction DR1, the first and third display devices 11 and 13 may be arranged along a second direction DR2, the third and fourth display devices 13 and 14 may be arranged along the first direction DR1, and the second and fourth display devices 12 and 14 may be arranged along the second direction DR2.

The number of display devices (11, 12, 13, and 14) and the layout of the display devices (11, 12, 13, and 14) are not particularly limited. The number of display devices (11, 12, 13, and 14) and the layout of the display devices (11, 12, 13, and 14) may vary depending on the size and the shape of the display devices (11, 12, 13, and 14) and the size and the shape of the tiled display device TD.

The display devices (11, 12, 13, and 14) may have the same size, but the present disclosure is not limited thereto. Alternatively, the display devices (11, 12, 13, and 14) may have different sizes.

The display devices (11, 12, 13, and 14) may have a rectangular shape having long sides and short sides. The display devices (11, 12, 13, and 14) may be arranged with their long sides or short sides connected to one another. Some or all of the display devices (11, 12, 13, and 14) may be arranged along the boundaries of the tiled display device TD and may form the sides of the tiled display device TD. At least one of the display devices (11, 12, 13, and 14) may be located at at least one of the corners of the tiled display device TD and may form a pair of adjacent sides of the tiled display device TD. In other embodiments, at least one of the display devices (11, 12, 13, and 14) may be surrounded by, or adjacent to, other display devices.

The tiled display device TD may generally have a planar shape, but the present disclosure is not limited thereto. Alternatively, the tiled display device TD may have a stereoscopic shape and may thus provide a sense of depth to a user. In one example, in a case where the tiled display device TD has a stereoscopic shape, at least one of the display devices (11, 12, 13, and 14) may have a curved shape. In another example, each of the display devices (11, 12, 13, and 14) may have a planar shape, but the tiled display device TD may have a stereoscopic shape because of the display devices (11, 12, 13, and 14) being connected at a suitable angle (e.g., a predetermined angle) with one another.

The tiled display device TD may include a seam(s) SM between the display devices (11, 12, 13, and 14). In one example, the seam SM may be located between the first and second display devices 11 and 12, between the first and third display devices 11 and 13, between the second and fourth display devices 12 and 14, and between the third and fourth display devices 13 and 14.

The seam SM may include a bonding member or an adhesive member. In this case, the display devices (11, 12, 13, and 14) may be connected to one another via the bonding member or the adhesive member of the seam SM.

The display devices (11, 12, 13, and 14) may have the same reflectance as, or a similar reflectance to, the seam SM for external light. Thus, visibility of the seam SM to the user may be reduced or prevented when the display devices (11, 12, 13, and 14) are not displaying images in the tiled display device TD. Accordingly, even though there exists the seam SM, images displayed by the display devices (11, 12, 13, and 14) might not appear disconnected, and as a result, the sense of immersion of an image displayed by the tiled display device TD can be improved.

Figure 2:
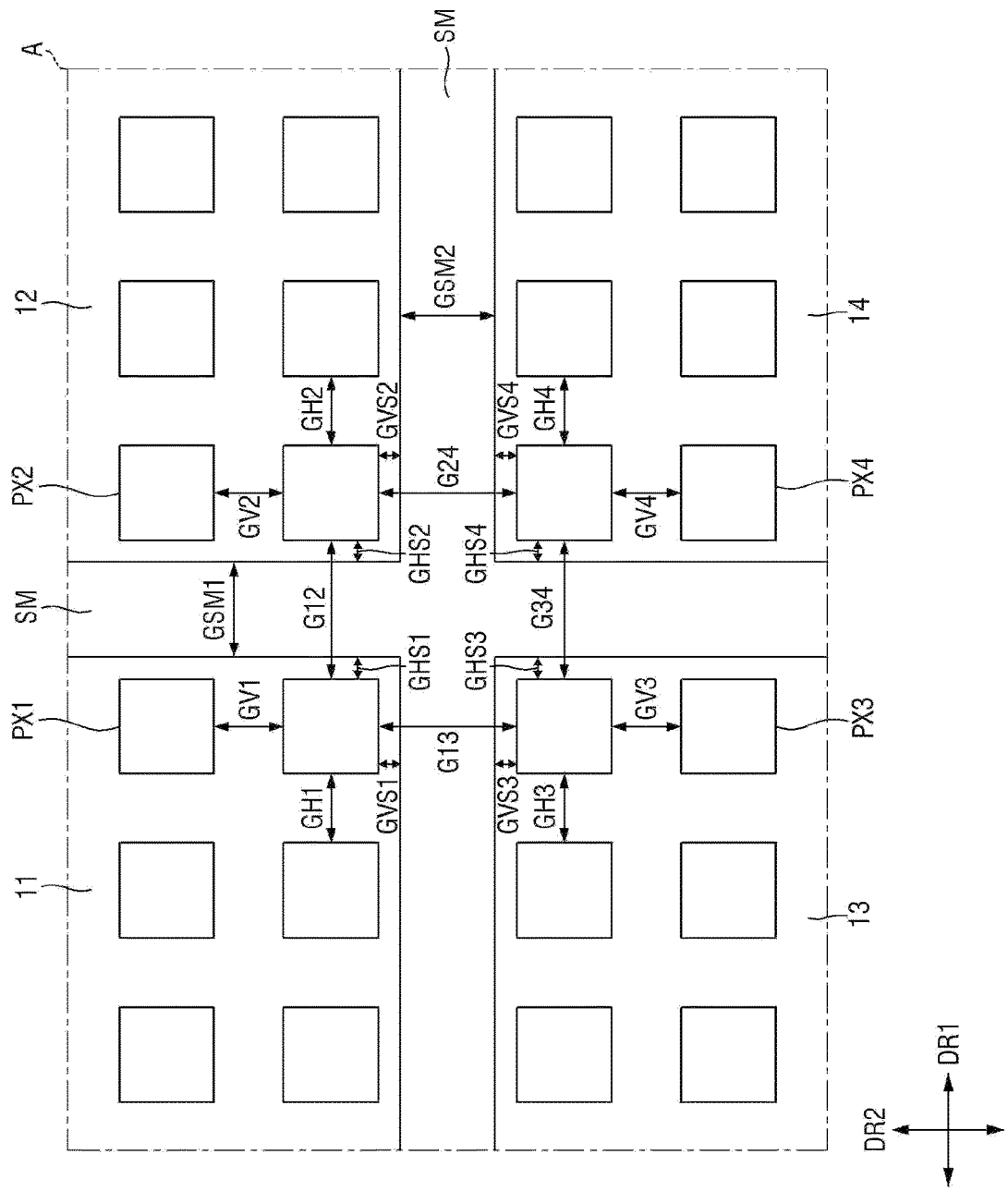
FIG. 2 is a layout view illustrating an area A of FIG. 1, for example, first pixels of a first display device of FIG. 1, second pixels of a second display device of FIG. 1, third pixels of a third display device of FIG. 1, and fourth pixels of a fourth display device of FIG. 1.

FIG. 2 is a layout view illustrating an area A of FIG. 1, for example, first pixels of a first display device of FIG. 1, second pixels of a second display device of FIG. 1, third pixels of a third display device of FIG. 1, and fourth pixels of a fourth display device of FIG. 1.

Referring to FIG. 2, the seam SM may be in the shape of a cross or a plus sign in a plan view in a middle part of the tiled display device TD where the first, second, third, and fourth display devices 11, 12, 13, and 14 adjoin one another. The seam SM may be located between the first and second display devices 11 and 12, between the first and third display devices 11 and 13, between the second and fourth display devices 12 and 14, and between the third and fourth display devices 13 and 14.

The first display device 11 may include first pixels PX1 that are arranged along rows and columns of a matrix along the first and second directions DR1 and DR2 to display an image. The second display device 12 may include second pixels PX2 that are arranged along rows and columns of a matrix along the first and second directions DR1 and DR2 to display an image. The third display device 13 may include third pixels PX3 that are arranged along rows and columns of a matrix along the first and second directions DR1 and DR2 to display an image. The fourth display device 14 may include fourth pixels PX4 that are arranged along rows and columns of a matrix along the first and second directions DR1 and DR2 to display an image.

Each pair of adjacent first pixels PX1 in the first direction DR1 may be spaced from each other by a first horizontal distance GH1, and each pair of adjacent second pixels PX2 in the first direction DR1 may be spaced from each other by a second horizontal distance GH2. The first and second horizontal distances GH1 and GH2 may be substantially the same.

The seam SM may be located between each pair of adjacent first and second pixels PX1 and PX2 in the first direction DR1. A distance G12 between each pair of adjacent first and second pixels PX1 and PX2 in the first direction DR1 may be the sum of a distance GHS1, in the first direction DR1, between the seam SM and the first pixels PX1 that are adjacent to the seam SM, a distance GHS2, in the first direction DR1, between the seam SM and the second pixels PX2 that are adjacent to the seam SM, and a width GSM1, in the first direction DR1, of the seam SM.

As the distance GHS1 or GHS2 or the width GSM1 increases, the distance G12 may also increase. Thus, to reduce or minimize the distance G12, the distance GHS1 may be smaller than the first horizontal distance GH1, and the distance GHS2 may be smaller than the second horizontal distance GH2.

Each pair of adjacent third pixels PX3 in the first direction DR1 may be spaced from each other by a third horizontal distance GH3, and each pair of adjacent fourth pixels PX4 in the first direction DR1 may be spaced from each other by a fourth horizontal distance GH4. The third and fourth horizontal distances GH3 and GH4 may be substantially the same.

The seam SM may be located between each pair of adjacent third and fourth pixels PX3 and PX4 in the first direction DR1. A distance G34 between each pair of adjacent third and fourth pixels PX3 and PX4 in the first direction DR1 may be the sum of a distance GHS3, in the first direction DR1, between the seam SM and the third pixels PX3 that are adjacent to the seam SM, a distance GHS4, in the first direction DR1, between the seam SM and the fourth pixels PX4 that are adjacent to the seam SM, and the width GSM1, in the first direction DR1, of the seam SM.

As the distance GHS3 or GHS4 or the width GSM1 increases, the distance G34 may also increase. Thus, to reduce or minimize the distance G34, the distance GHS3 may be smaller than the third horizontal distance GH3, and the distance GHS4 may be smaller than the fourth horizontal distance GH4.

Each pair of adjacent first pixels PX1 in the second direction DR2 may be spaced from each other by a first vertical distance GV1, and each pair of adjacent third pixels PX3 in the second direction DR2 may be spaced from each other by a third vertical distance GV3. The first and third vertical distances GV1 and GV3 may be substantially the same.

The seam SM may be located between each pair of adjacent first and third pixels PX1 and PX3 in the second direction DR2. A distance G13 between each pair of adjacent first and third pixels PX1 and PX3 in the second direction DR2 may be the sum of a distance GVS1, in the second direction DR2, between the seam SM and the first pixels PX1 that are adjacent to the seam SM, a distance GVS3, in the second direction DR2, between the seam SM and the third pixels PX3 that are adjacent to the seam SM, and a width GSM2, in the second direction DR2, of the seam SM.

As the distance GVS1 or GVS3 or the width GSM2 increases, the distance G13 may also increase. Thus, to reduce or minimize the distance G13, the distance GVS1 may be smaller than the first vertical distance GV1, and the distance GVS3 may be smaller than the third vertical distance GV3.

Each pair of adjacent second pixels PX2 in the second direction DR2 may be spaced from each other by a second vertical distance GV2, and each pair of adjacent fourth pixels PX4 in the second direction DR2 may be spaced from each other by a fourth vertical distance GV4. The second and fourth vertical distances GV2 and GV4 may be substantially the same.

The seam SM may be located between each pair of adjacent second and fourth pixels PX2 and PX4 in the second direction DR2. A distance G24 between each pair of adjacent second and fourth pixels PX2 and PX4 in the second direction DR2 may be the sum of a distance GVS2, in the second direction DR2, between the seam SM and the second pixels PX2 that are adjacent to the seam SM, a distance GVS4, in the second direction DR2, between the seam SM and the fourth pixels PX4 that are adjacent to the seam SM, and the width GSM2, in the second direction DR2, of the seam SM.

As the distance GVS2 or GVS4 or the width GSM2 increases, the distance G24 may also increase. Thus, to reduce or minimize the distance G24, the distance GVS2 may be smaller than the second vertical distance GV2, and the distance GVS4 may be smaller than the fourth vertical distance GV4.

As illustrated in FIG. 2, the distances between the seam SM and pixels located along the inner sides of each of the first, second, third, and fourth display devices 11, 12, 13, and 14 may be smaller than the distance between adjacent pixels PX in each of the first, second, third, and fourth display devices 11, 12, 13, and 14 such that the seam SM may not become visible between images displayed by the first, second, third, and fourth display devices 11, 12, 13, and 14.

Figure 3:
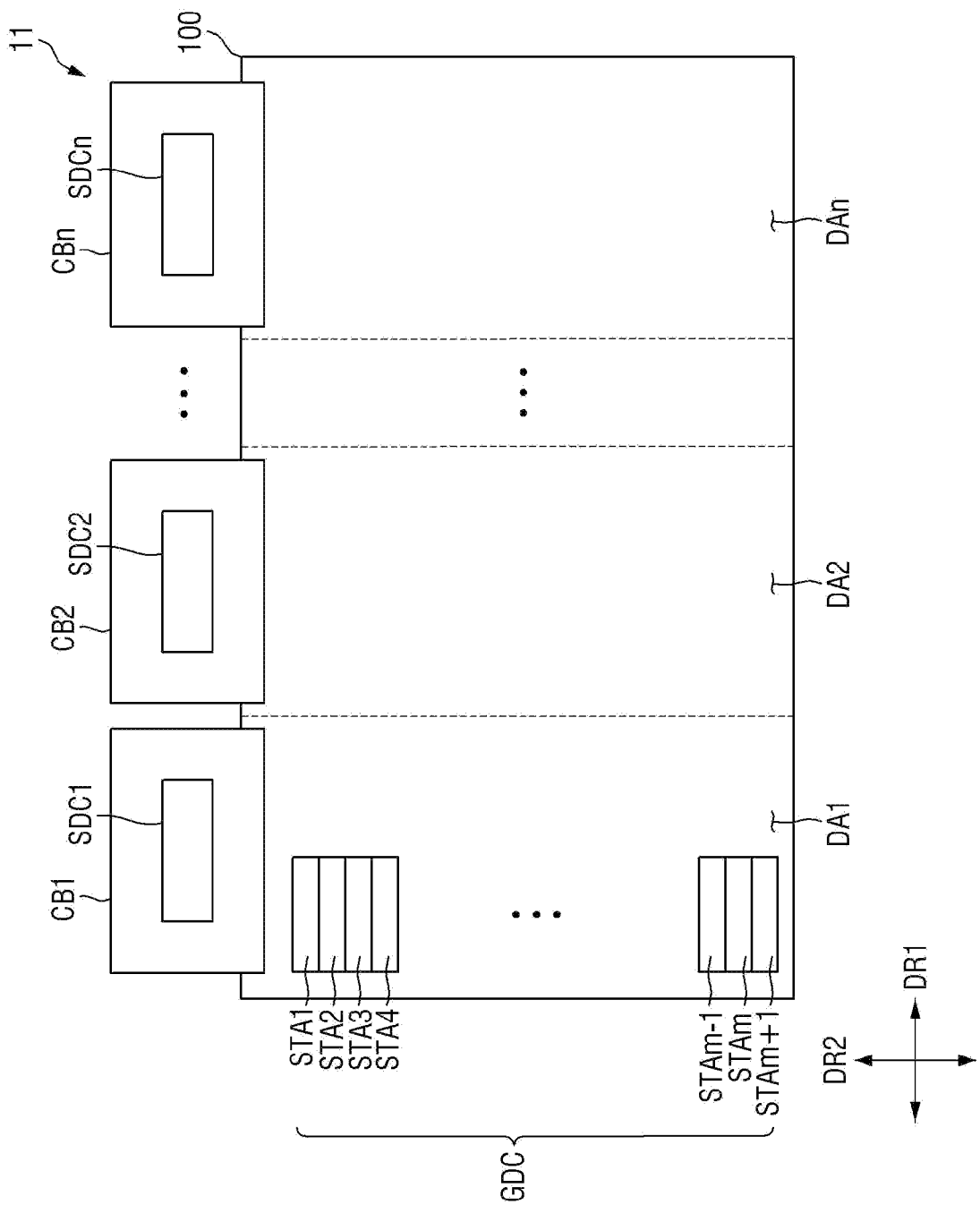
FIG. 3 is a layout view of a first display device according to some embodiments of the present disclosure.

FIG. 3 is a layout view of a first display device according to some embodiments of the present disclosure.

Referring to FIG. 3, a first display device 11 may include a first display panel 100, a plurality of first through n-th circuit boards CB1 through CBn (where n is a positive integer of 3 or greater), a plurality of first through n-th source driving circuits SDC1 through SDCn, and a scan driving circuit GDC. The first display panel 100 may include a plurality of first through n-th display areas DA1 through DAn.

The first through n-th circuit boards CB1 through CBn may be located on one side of the first display panel 100, for example, on the upper side of the first display panel 100. The first through n-th circuit boards CB1 through CBn may be attached on pads that are located on one side of the first display panel 100, via a conductive adhesive member such as an anisotropic conductive film. Thus, the first through n-th circuit boards CB1 through CBn may be electrically connected to the first display panel 100. The first through n-th circuit boards CB1 through CBn may be flexible films, chip-on-films, flexible printed circuit boards, or printed circuit boards.

The first through n-th source driving circuits SDC1 through SDCn may be located to correspond to the first through n-th circuit boards CB1 through CBn. In one example, the first source driving circuit SDC1 may be located on the first circuit board CB1, the second source driving circuit SDC2 may be located on the second circuit board CB2, and the n-th source driving circuit SDCn may be located on the n-th circuit board CBn. The first through n-th source driving circuits SDC1 through SDCn may be formed as integrated circuits. The first through n-th source driving circuits SDC1 through SDCn may be attached to the first through n-th circuit boards CB1 through CBn via a conductive adhesive member such as an anisotropic conductive film.

The first through n-th source driving circuits SDC1 through SDCn may receive digital video data, may generate data voltages in accordance with the digital video data, and may output the data voltages to data lines of the first display panel 100. The first source driving circuit SDC1 may generate scan control signals for driving the scan driving circuit GDC and may output the scan control signals to the scan driving circuit GDC.

The first display area DA1 may include data lines connected to the first source driving circuit SDC1 through the first circuit board CB1. In this case, the data lines of the first display area DA1 may receive data voltages from the first source driving circuit SDC1. Accordingly, the first pixels PX1 of the first display area DA1 may receive data voltages from the first source driving circuit SDC1 and may thus be able to display an image. That is, the first display area DA1 may be defined as an area that is provided with data voltages from the first source driving circuit SDC1.

The second display area DA2 may include data lines connected to the second source driving circuit SDC2 through the second circuit board CB2. In this case, the data lines of the second display area DA2 may receive data voltages from the second source driving circuit SDC2. Accordingly, the first pixels PX1 of the second display area DA2 may receive data voltages from the second source driving circuit SDC2 and may thus be able to display an image. That is, the second display area DA2 may be defined as an area that is provided with data voltages from the second source driving circuit SDC2.

The n-th display area DAn may include data lines connected to the n-th source driving circuit SDCn through the n-th circuit board CBn. In this case, the data lines of the n-th display area DAn may receive data voltages from the n-th source driving circuit SDCn. Accordingly, the first pixels PX1 of the n-th display area DAn may receive data voltages from the n-th source driving circuit SDCn and may thus be able to display an image. That is, the n-th display area DAn may be defined as an area that is provided with data voltages from the n-th source driving circuit SDCn.

The scan driving circuit GDC may be located in the first display area DA1. The scan driving circuit GDC may receive the scan control signals from the first source driving circuit SDC1. The scan control signals may include a plurality of clock signals and a plurality of clock bar signals.

The scan driving circuit GDC may be located in part of the first display area DA1. In one example, the scan driving circuit GDC may be located on one side of the first display area DA1, for example, on the left side of the first display area DA1, as illustrated in FIG. 3, but the present disclosure is not limited thereto. In an example, the scan driving circuit GDC may be located on the right side or in the middle of the first display area DA1.

The scan driving circuit GDC may include a plurality of first, second, third, fourth, ..., (m−1)-th, m-th, and (m+1)-th stages STA1, STA2, STA3, ..., STA4, ..., STAm−1, STAm, and STAm+1. The first, second, third, fourth, ..., (m−1)-th, m-th, and (m+1)-th stages STA1, STA2, STA3, ..., STA4, ..., STAm−1, STAm, and STAm+1 may extend in the first direction DR1 and may be arranged along the second direction DR2. The first, second, third, fourth, ..., (m−1)-th, m-th, and (m+1)-th stages STA1, STA2, STA3, STA4, ..., STAm−1, STAm, and STAm+1 may generate scan signals in accordance with the scan control signals from the first source driving circuit SDC1. The first, second, third, fourth, ..., (m−1)-th, m-th, and (m+1)-th stages STA1, STA2, STA3, STA4, ..., STAm−1, STAm, and STAm+1 may be connected to scan lines and may sequentially output scan signals.

Figure 4:
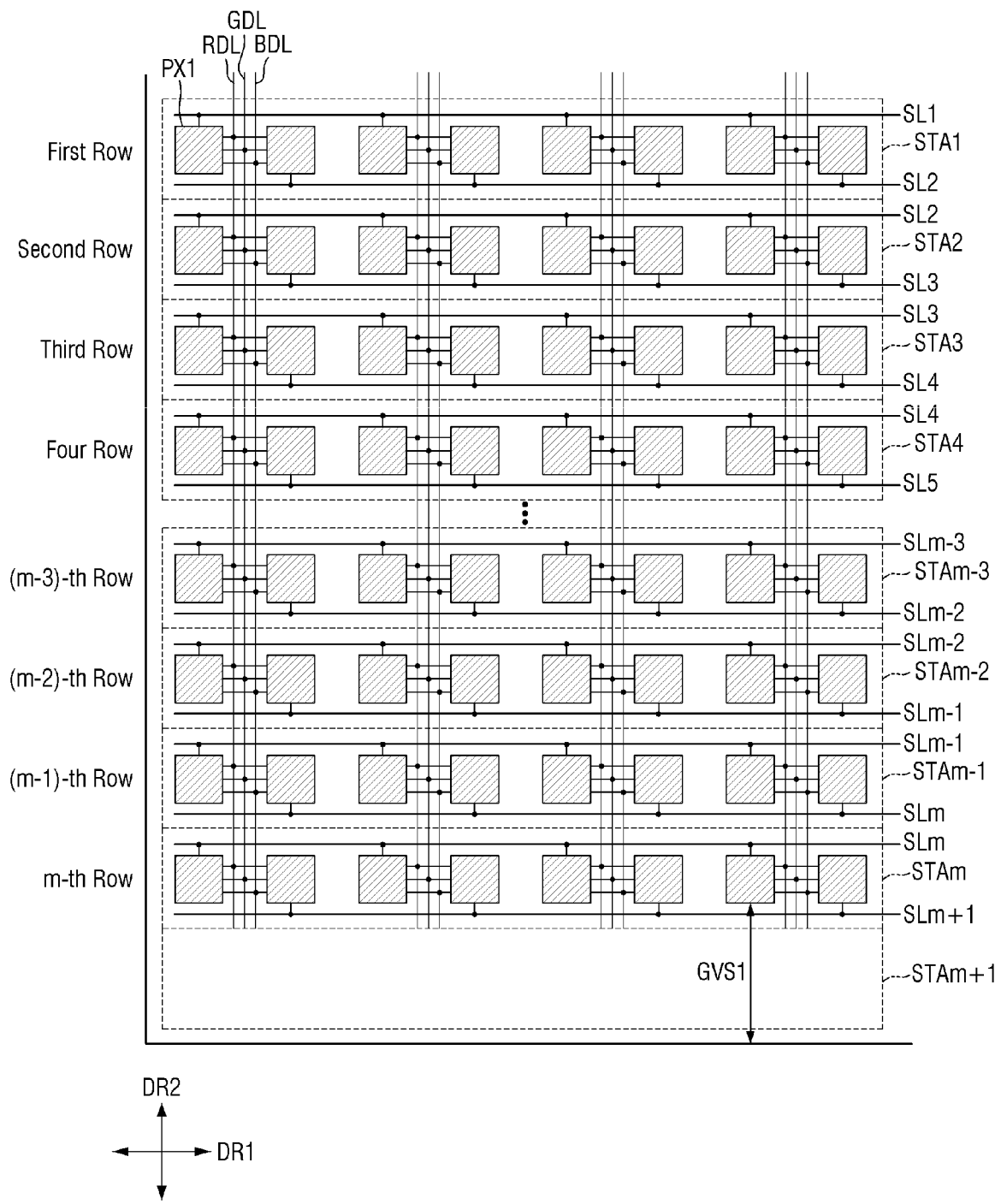
FIG. 4 is a layout view illustrating first, second, third, fourth, (m−3)-th, (m−2)-th, (m−1)-th, m-th, and (m+1)-th stages and first pixels of a first display area of FIG. 3.

FIG. 4 is a layout view illustrating the first, second, third, fourth, (m−3)-th, (m−2)-th, (m−1)-th, m-th, and (m+1)-th stages of FIG. 3 and first pixels of the first display area of FIG. 3.

Referring to FIG. 4, scan lines SL, data lines (RDL, GDL, and BDL), and first pixels PX1 may be located in the first display area DA1. The data lines (RDL, GDL, and BDL) may extend in the second direction DR2 and may be arranged along the first direction DR1. The scan lines SL may extend in the first direction DR1 and may be arranged along the second direction DR2.

Each of the first pixels PX1 may include a plurality of subpixels. In one example, each of the first pixels PX1 may include three subpixels (e.g., first, second, and third subpixels SPX1, SPX2, and SPX3 (see FIG. 10)). In this case, each of the first pixels PX1 may be connected to one of first, second, third, fourth, ..., (m−1)-th, m-th, and (m+1)-th scan lines SL1, SL2, SL3, SL4, ..., SLm−1, SLm, and SLm+1, and three data lines (e.g., first-color, second-color, and third-color data lines or red, green, and blue data lines RDL, GDL, and BDL). The first subpixel SPX1 of each of the first pixels PX1 may be connected to one of the first, second, third, fourth, ..., (m−1)-th, m-th, and (m+1)-th scan lines SL1, SL2, SL3, SL4, ..., SLm−1, SLm, and SLm+1 and a red data line RDL. The second subpixel SPX2 of each of the first pixels PX1 may be connected to one of the first, second, third, fourth, ..., (m−1)-th, m-th, and (m+1)-th scan lines SL1, SL2, SL3, SL4, ..., SLm−1, SLm, and SLm+1 and a green data line GDL. The third subpixel SPX3 of each of the first pixels PX1 may be connected to one of the first, second, third, fourth, ..., (m−1)-th, m-th, and (m+1)-th scan lines SL1, SL2, SL3, SL4, ..., SLm−1, SLm, and SLm+1 and a blue data line BDL.

Data lines (RDL, GDL, and BDL) or one of a scan transistor GT1 (see FIG. 8), a capacitor GC1 (see FIG. 8), a clock signal input terminal CKT (see FIG. 8), a clock bar signal input terminal CBT (see FIG. 8), and a carry clock signal input terminal RT (see FIG. 8) of each of the first, second, third, fourth, ..., (m−1)-th, m-th, and (m+1)-th stages STA1, STA2, STA3, ..., STA4, ..., STAm−1, STAm, and STAm+1 may be located between every two adjacent first pixels PX1 in the first direction DR1.

Every two adjacent first pixels PX1 in the first direction DR1 may be connected to different scan lines and may be connected to the same data lines (RDL, GDL, and BDL). In one example, two adjacent first pixels PX1 in the first direction DR1 that belong to a first row may be connected to different scan lines (e.g., the first and second scan lines SL1 and SL2). In this example, one of the two adjacent first pixels PX1 may receive data voltages from data lines (RDL, GDL, and BDL) located between the two adjacent first pixels PX1 in response to a scan signal being applied to the first scan line SL1, and the other first pixel PX1 may receive data voltages from the data lines (RDL, GDL, and BDL) in response to a scan signal being applied to the second scan line SL2.

Each of the first, second, third, fourth, ..., (m−1)-th, m-th, and (m+1)-th stages STA1, STA2, STA3, ..., STA4, ..., STAm−1, STAm, and STAm+1 may be connected to one of the first, second, third, fourth, ..., (m−1)-th, m-th, and (m+1)-th scan lines SL1, SL2, SL3, SL4, ..., SLm−1, SLm, and SLm+1 and may output a scan signal.

The first, second, third, fourth, ..., (m−1)-th, and m-th stages STA1, STA2, STA3, ..., STA4, ..., STAm−1, and STAm may be arranged in their respective rows. Each of the first, second, third, fourth, ..., (m−1)-th, and m-th stages STA1, STA2, STA3, STA4, ..., STAm−1, and STAm may be located near first pixels PX1 arranged in their respective rows, but may not overlap with the first pixels PX1. That is, each of the first, second, third, fourth, ..., (m−1)-th, and m-th stages STA1, STA2, STA3, ..., STA4, ..., STAm−1, and STAm may be located in a region in their respective rows where first pixels PX1 are not located.

In one example, as illustrated in FIG. 4, the first stage STA1 may be located near first pixels PX1 arranged in the first row. The first stage STA1 may be connected to the first scan line SL1 and may output a scan signal. The first stage STA1 may not overlap with the first pixels PX1 arranged in the first row. That is, the first stage STA1 may be located in the first row, but not in a region where first pixels PX1 are located. For example, the scan transistor GT1, the capacitor GC1, the clock signal input terminal CKT, the clock bar signal input terminal CBT, and the carry clock signal input terminal RT of the first stage STA1 may be located in remaining spaces between first pixels PX1 in the first direction DR1, in remaining spaces between the first pixels PX1 and second pixels PX2 in the second direction DR2, or in remaining spaces on the upper sides, in the second direction DR2, of the first pixels PX1.

The second, third, fourth, ..., (m−3)-th, (m−2)-th, (m−1)-th, and m-th stages STA2, STA3, ..., STA4, ..., STAm−3, STAm−2, STAm−1, and STAm are substantially the same as the first stage STA1, and thus, detailed descriptions thereof will be omitted.

No first pixels PX1 are arranged in an (m+1)-th row, but the (m+1)-th stage STAm+1, which is connected to the (m+1)-th scan line SLm+1 and outputs a scan signal, is essential because the (m+1)-th scan line SLm+1 is needed. The (m+1)-th stage STAm+1 may be located below the m-th stage STAm. That is, the (m+1)-th stage STAm+1 may be located below first pixels PX1 arranged in an m-th row. Due to the presence of the (m+1)-th stage STAm+1, the distance GVS1, in the second direction DR2, between the first pixels PX1 arranged in the m-th row and the edge of the first display panel 100 may increase. As the distance GVS1, in the second direction DR2, between the first pixels PX1 arranged in the m-th row and the edge of the first display panel 100 increases, the distance between first pixels PX1 of the first display device 11 and third pixels PX3 of a third display device 13 may also increase. Thus, images displayed by the first and third display devices 11 and 13 may appear disconnected due to the presence of the seam SM.

Figure 5:
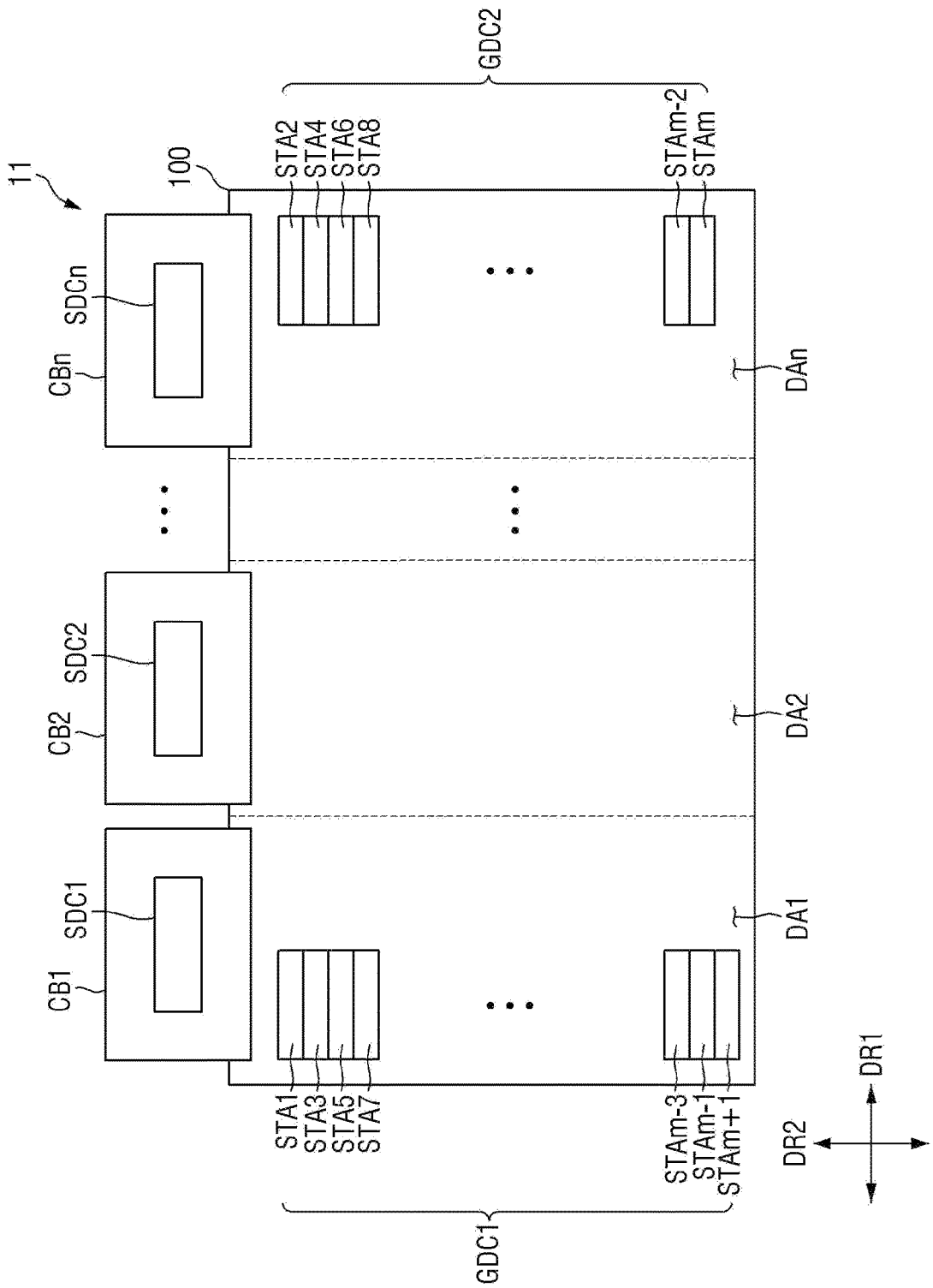
FIG. 5 is a layout view of a first display device according to some embodiments of the present disclosure.

FIG. 5 is a layout view of a first display device according to some embodiments of the present disclosure.

The embodiments of FIG. 5 differs from the embodiments of FIG. 3 in that a scan driving circuit GDC includes first and second scan driving circuits GDC1 and GDC2. The embodiments of FIG. 5 will hereinafter be described, focusing mainly on the differences with the embodiments of FIG. 3.

Referring to FIG. 5, the scan driving circuit GDC may include the first and second scan driving circuits GDC1 and GDC2 that are located in first and n-th display areas DA1 and DAn, respectively.

The first scan driver GDC1 may receive a first scan control signal from a first source driving circuit SDC1. The first scan control signal may include a first clock signal and a first clock bar signal. The first clock signal and the first clock bar signal may have opposite phases. In one example, in a case where the first clock signal has a first-level voltage, the first clock bar signal may have a second-level voltage, and in a case where the first clock signal has the second-level voltage, the first clock bar signal may have the first-level voltage.

The first scan driving circuit GDC1 may be located in part of the first display area DA1. In one example, the first scan driving circuit GDC1 may be located on one side of the first display area DA1, for example, on the left side of the first display area DA1, as illustrated in FIG. 5, but the present disclosure is not limited thereto. In another example, the first scan driving circuit GDC1 may be located on the right side or in the middle of the first display area DA1.

The first scan driving circuit GDC1 may include a plurality of odd-numbered stages (STA1, STA3, . . . , STAm−3, STAm−1, and STAm+1). The odd-numbered stages (STA1, STA3, . . . , STAm−3, STAm−1, and STAm+1) may be defined as a first group of stages. The odd-numbered stages (STA1, STA3, . . . , STAm−3, STAm−1, and STAm+1) may extend in the first direction DR1 and may be arranged along the second direction DR2. The odd-numbered stages (STA1, STA3, . . . , STAm−3, STAm−1, and STAm+1) may generate odd-numbered scan signals in accordance with the first scan control signal from the first source driving circuit SDC1. The odd-numbered stages (STA1, STA3, . . . , STAm−3, STAm−1, and STAm+1) may be connected to odd-numbered scan lines and may sequentially output the odd-numbered scan signals.

The second scan driver GDC2 may receive a second scan control signal from an n-th source driving circuit SDCn. The second scan control signal may include a second clock signal and a second clock bar signal. The second clock signal and the second clock bar signal may have opposite phases. In one example, in a case where the second clock signal has the first-level voltage, the second clock bar signal may have the second-level voltage, and in a case where the second clock signal has the second-level voltage, the second clock bar signal may have the first-level voltage.

The second scan driving circuit GDC2 may be located in part of the n-th display area DAn. In one example, the second scan driving circuit GDC2 may be located on one side of the n-th display area DAn, for example, on the right side of the n-th display area DAn, as illustrated in FIG. 5, but the present disclosure is not limited thereto. In another example, the second scan driving circuit GDC2 may be located on the right side or in the middle of the n-th display area DAn.

The second scan driving circuit GDC2 may include a plurality of even-numbered stages (STA2, STA4, . . . , STAm−2, and STAm). The even-numbered stages (STA2, STA4, . . . , STAm−2, and STAm) may be defined as a second group of stages. The even-numbered stages (STA2, STA4, . . . , STAm−2, and STAm) may extend in the first direction DR1 and may be arranged along the second direction DR2. The even-numbered stages (STA2, STA4, . . . , STAm−2, and STAm) may generate even-numbered scan signals in accordance with the second scan control signal from the n-th source driving circuit SDCn. The even-numbered stages (STA2, STA4, . . . , STAm−2, and STAm) may be connected to even-numbered scan lines and may sequentially output the even-numbered scan signals.

In a case where the first and second scan driving circuits GDC1 and GDC2 are located in the first and n-th display areas DA1 and DAn, respectively, as illustrated in FIG. 5, the scan lines connected to the first scan driving circuit GDC1 may extend from the first display area DA1 to the n-th display area DAn, and the scan lines connected to the second scan driving circuit GDC2 may extend from the n-th display area DAn to the first display area DA1. In this case, the distance from the first scan driving circuit GDC1 to the right ends of the scan lines may be substantially the same as the distance from the second scan driving circuit GDC2 to the left ends of the scan lines. Thus, the differences in RC delays in scan signals between the first and second scan driving circuit GDC1 and GDC2 can be reduced or minimized.

Figure 6A:
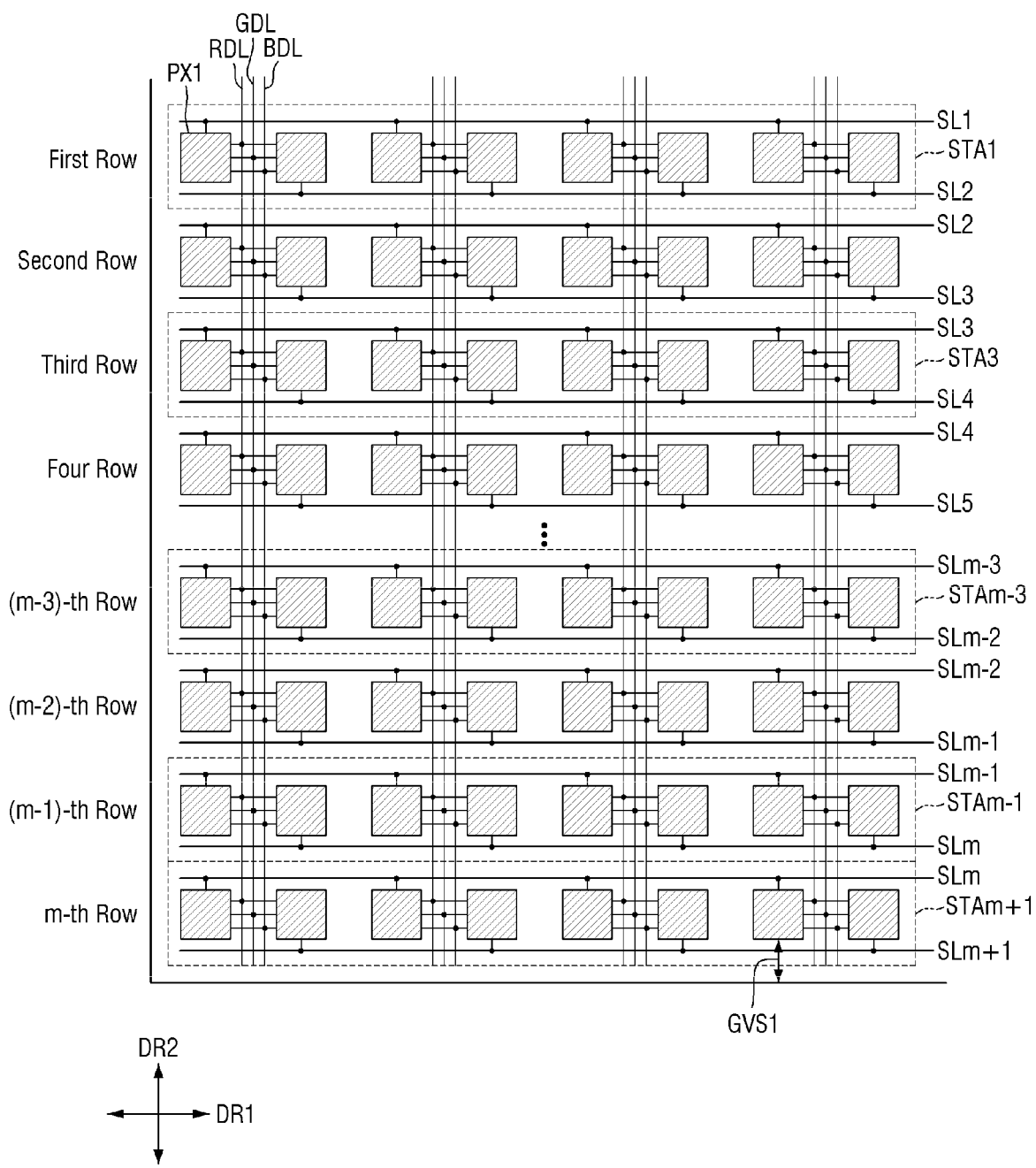
FIG. 6A is a layout view illustrating first, third, (m−3)-th, (m−1)-th, and (m+1)-th stages and first pixels of a first display area of FIG. 5.
Figure 6B:
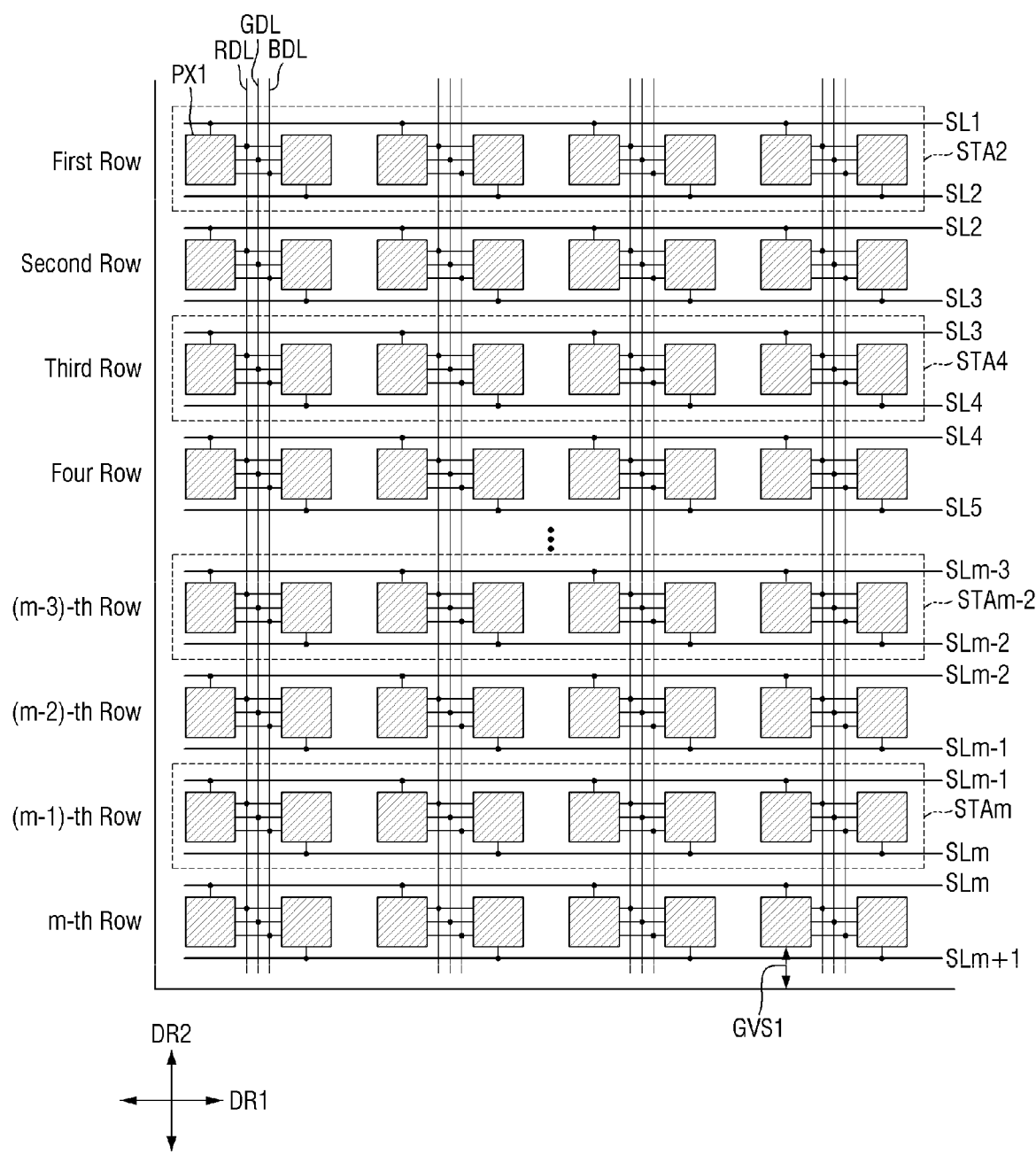
FIG. 6B is a layout view illustrating second, fourth, (m−2)-th, and m-th stages and first pixels of an n-th display area of FIG. 5.

FIG. 6A is a layout view illustrating the first, third, (m−3)-th, (m−1)-th, and (m+1)-th stages and first pixels of the first display area of FIG. 5. FIG. 6B is a layout view illustrating the second, fourth, (m−2)-th, and m-th stages and first pixels PX1 of the n-th display area of FIG. 5.

The embodiments of FIGS. 6A and 6B differ from the embodiments of FIG. 4 in that the first scan driving circuit GDC1 including the first, third, (m−3)-th, (m−1)-th, and (m+1)-th stages STA1, STA3, STAm−3, STAm−1, and STAm+1 is located in the first display area DA1 and the second scan driving unit GDC2 including the second, fourth, (m−2)-th, and m-th stages STA2, STA4, STAm−2, and STAm is located in the n-th display area DAn.

Referring to FIGS. 6A and 6B, each of the odd-numbered stages (STA1, STA3, . . . , STAm−3, STAm−1, and STAm+1) may be connected to one scan line and may output a scan signal. The odd-numbered stages (STA1, STA3, . . . , STAm−3, STAm−1, STAm+1) may be arranged in their respective rows. Each of the odd-numbered stages (STA1, STA3, . . . , STAm−3, STAm−1, STAm+1) may be located near first pixels PX1 arranged in their respective rows, but may not overlap with the first pixels PX1. That is, each of the odd-numbered stages (STA1, STA3, . . . , STAm−3, STAm−1, STAm+1) may be located in a region in their respective rows where first pixels PX1 are not located.

In one example, as illustrated in FIG. 6A, the first stage STA1 may be located near first pixels PX1 arranged in a first row, the third stage STA3 may be located near first pixels PX1 arranged in a third row, the (m−3)-th stage STAm−3 may be located near first pixels PX1 arranged in an (m−3)-th row, the (m−1)-th stage STAm−1 may be located near first pixels PX1 arranged in an (m−1)-th row, and the (m+1)-th stage STAm+1 may be located near first pixels PX1 arranged in an m-th row.

Each of the even-numbered stages (STA2, STA4, . . . , STAm−2, and STAm) may be connected to one scan line and may output a scan signal. The even-numbered stages (STA2, STA4, . . . , STAm−2, and STAm) may be arranged in their respective rows. Each of the even-numbered stages (STA2, STA4, . . . , STAm−2, and STAm) may be located near first pixels PX1 arranged in their respective rows, but may not overlap with the first pixels PX1. That is, each of the even-numbered stages (STA2, STA4, . . . , STAm−2, and STAm) may be located in a region in their respective rows where first pixels PX1 are not located.

In one example, as illustrated in FIG. 6B, the second, fourth, . . . , (m−2)-th, and m-th stages STA2, STA4, . . . , STAm−2, and STAm may be arranged in the same rows as the first, third, . . . , (m−3)-th, and (m−1)-th stages STA1, STA3, . . . , STAm−3, and STAm−1, respectively. In this case, the second stage STA2 may be located near first pixels PX1 arranged in the first row, the fourth stage STA4 may be located near the first pixels PX1 arranged in the third row, the (m−2)-th stage STAm−2 may be located near the first pixels PX1 arranged in the (m−3)-th row, and the m-th stage STAm may be located near the first pixels PX1 arranged in the (m−1)-th row.

In another example, the second, fourth, . . . , (m−2)-th, and m-th stages STA2, STA4, . . . , STAm−2, and STAm may be arranged in different rows from the first, third, . . . , (m−3)-th, and (m−1)-th stages STA1, STA3, . . . , STAm−3, and STAm−1, respectively. In this case, the second stage STA2 may be located near first pixels PX1 arranged in a second row, the fourth stage STA4 may be located near first pixels PX1 arranged in a fourth row, the (m−2)-th stage STAm−2 may be located near first pixels PX1 arranged in an (m−2)-th row, and the m-th stage STAm may be located near first pixels PX1 arranged in an m-th row.

In a case where the odd-numbered stages (STA1, STA3, . . . , STAm−3, STAm−1, and STAm+1) are located in the first display area DA1 and the even-numbered stages (STA2, STA4, . . . , STAm−2, and STAm) are located in the n-th display area DAn, as illustrated in FIGS. 6A and 6B, the first scan driving circuit GDC1 may not include the m-th stage STAm. Thus, the (m+1)-th stage STAm+1 of the first scan driving circuit GDC1 may be located near th first pixels PX1 arranged in the m-th row. As a result, a distance GVS1, in the second direction DR2, between the first pixels PX1 arranged in the m-th row and the edge of the first display panel 100 may decrease. As the distance GVS1, in the second direction DR2, between the first pixels PX1 arranged in the m-th row and the edge of the first display panel 100 decreases, the distance between first pixels PX1 of the first display device 11 and third pixels PX3 of a third display device 13 may also decrease. Thus, an appearance of disconnection, or discontinuity, of the images displayed by the first and third display devices 11 and 13 can be reduced or prevented despite the presence of the seam SM.

A second display device 12, the third display device 13, and a fourth display device 14 may be substantially the same as the first display device 11 of FIGS. 5-6B, and thus, detailed descriptions thereof will be omitted.

Figure 7:
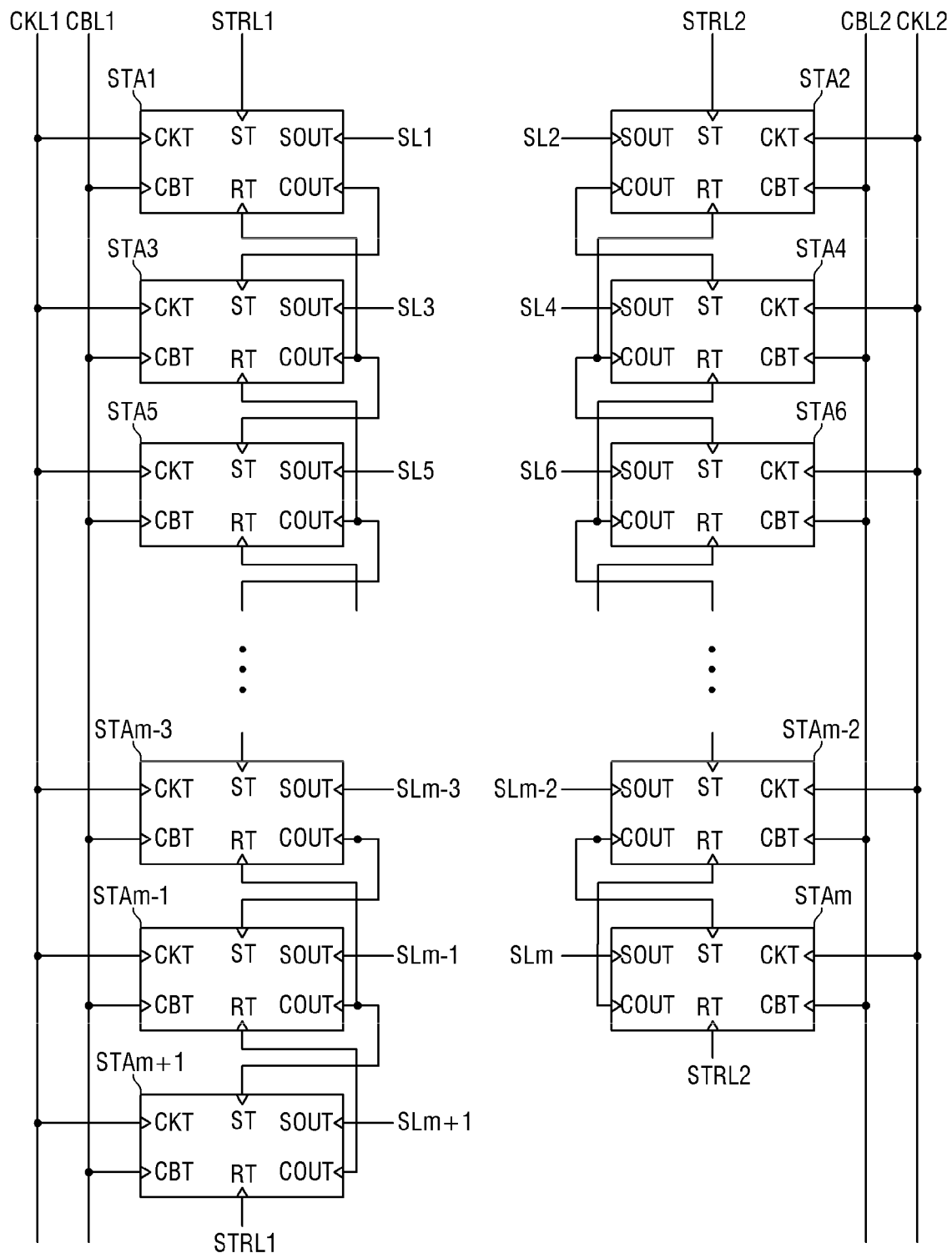
FIG. 7 is a circuit diagram illustrating the first through (m+1)-th stages of FIG. 5.

FIG. 7 is a circuit diagram illustrating the first through (m+1)-th stages of FIG. 5.

Referring to FIG. 7, each of the odd- and even-numbered stages (STA1, STA3, STA5, . . . , STAm−3, and STAm−1) and (STA2, STA4, STA6, . . . , STAm−2, and STAm) may include a start signal input terminal ST, a reset signal input terminal RT, a clock signal input terminal CKT, a clock bar signal input terminal CBT, a scan signal output terminal SOUT, and a carry signal output terminal COUT.

The start signal input terminal ST may be connected to a first start line STRL1, a second start line STRL2, or a carry signal output terminal COUT of a previous stage. For example, the start signal input terminal ST of the first stage STA1 may be connected to the first start line STRL1, and the start signal input terminal ST of the second stage STA2 may be connected to the second start line STRL2. The start signal input terminals ST of all the odd-numbered stages (STA1, STA3, STA5, . . . , STAm−3, STAm−1, and STAm+1) except for the first stage STA1 may be connected to the carry signal output terminals COUT of their respective previous stages. In one example, the start signal input terminal ST of the third stage STA3 may be connected to the carry signal output terminal COUT of the first stage STA1. Also, the start signal input terminals ST of all the even-numbered stages (STA2, STA4, STA6, . . . , STAm−2, and STAm) except for the second stage STA2 may be connected to the carry signal output terminals COUT of their respective previous stages. In one example, the start signal input terminal ST of the fourth stage STA4 may be connected to the carry signal output terminal COUT of the second stage STA2.

The reset signal input terminals RT of all the odd-numbered stages (STA1, STA3, STA5, . . . , STAm−3, STAm−1, and STAm+1) except for the (m+1)-th stage STAm+1 may be connected to the carry signal output terminals COUT of their respective subsequent stages. In one example, the reset signal input terminal RT of the first stage STA1 may be connected to the carry signal output terminal COUT of the third stage STA3. The reset signal input terminals RT of all the even-numbered stages (STA2, STA4, STA6, . . . , STAm−2, and STAm) except for the m-th stage STAm may be connected to the carry signal output terminals COUT of their respective subsequent stages. In one example, the reset signal input terminal RT of the second stage STA2 may be connected to the carry signal output terminal COUT of the fourth stage STA4. The reset signal input terminal RT of the (m+1)-th stage STAm+1 may be connected to either the first start line STRL1 or the carry signal output terminal COUT of an odd-numbered dummy stage. The reset signal input terminal RT of the m-th stage STAm may be connected to either the second start line STRL2 or the carry signal output terminal COUT of an even-numbered dummy stage.

The odd-numbered stages (STA1, STA3, STA5, . . . , STAm−3, STAm−1, and STAm+1) may be connected in common to a first clock line CKL1 and a first clock bar line CBL1. That is, the clock signal input terminals CKT of the odd-numbered stages (STA1, STA3, STA5, . . . , STAm−3, STAm−1, and STAm+1) may all be connected to the first clock line CKL1, and the clock bar signal input terminals CBT of the odd-numbered stages (STA1, STA3, STA5, . . . , STAm−3, STAm−1, and STAm+1) may all be connected to the first clock bar line CBL1.

The even-numbered stages (STA2, STA4, STA6, . . . , STAm−2, and STAm) may be connected in common to a second clock line CKL2 and a second clock bar line CBL2. That is, the clock signal input terminals CKT of the even-numbered stages (STA2, STA4, STA6, . . . , STAm−2, and STAm) may all be connected to the second clock line CKL2, and the clock bar signal input terminals CBT of the even-numbered stages (STA2, STA4, STA6, . . . , STAm−2, and STAm) may all be connected to the second clock bar line CBL2.

The odd-numbered stages (STA1, STA3, STA5, . . . , STAm−3, STAm−1, and STAm+1) may be connected to odd-numbered scan lines (SL1, SL3, SL5, . . . , SLm−3, SLm−1, and SLm+1). The odd-numbered scan lines (SL1, SL3, SL5, . . . , SLm−3, SLm−1, and SLm+1) may be defined as a first group of scan lines. The scan signal output terminals SOUT of the odd-numbered stages (STA1, STA3, STA5, . . . , STAm−3, STAm−1, and STAm+1) may be connected to the odd-numbered scan lines (SL1, SL3, SL5, . . . , SLm−3, SLm−1, and SLm+1). In one example, the first stage STA1 may be connected to a first scan line SL1, the third stage STA3 may be connected to a third scan line SL3, the fifth stage STA5 may be connected to a fifth scan line SL5, the (m−3)-th stage STAm−3 may be connected to an (m−3)-th scan line SLm−3, the (m−1)-th stage STAm−1 may be connected to an (m−1)-th scan line SLm−1, and the (m+1)-th stage STAm+1 may be connected to an (m+1)-th scan line SLm+1.

The even-numbered stages (STA2, STA4, STA6, . . . , STAm−2, and STAm) may be connected to even-numbered scan lines (SL2, SL4, SL6, . . . , SLm−2, and SLm). The even-numbered scan lines (SL2, SL4, SL6, . . . , SLm−2, and SLm) may be defined as a second group of scan lines. The scan signal output terminals SOUT of the even-numbered stages (STA2, STA4, STA6, . . . , STAm−2, and STAm) may be connected to the even-numbered scan lines (SL2, SL4, SL6, . . . , SLm−2, and SLm). In one example, the second stage STA2 may be connected to a second scan line SL2, the fourth stage STA4 may be connected to a fourth scan line SL4, the sixth stage STA6 may be connected to a sixth scan line SL6, the (m−2)-th stage STAm−2 may be connected to an (m−2)-th scan line SLm−2, and the m-th stage STAm may be connected to an m-th scan line SLm.

The carry signal output terminals COUT of the odd-numbered stages (STA1, STA3, STA5, . . . , STAm−3, STAm−1, and STAm+1) may be connected to the reset signal input terminals RT of their respective previous stages and the start signal input terminals ST of their respective subsequent stages. However, the carry signal output terminal COUT of the first stage STA1 may be connected to the start signal input terminal ST of the third stage STA3, and the carry signal output terminal COUT of the (m+1)-th stage STAm+1 may be connected to the reset signal input terminal RT of the (m−1)-th stage STAm−1.

The carry signal output terminals COUT of the even-numbered stages (STA2, STA4, STA6, . . . , STAm−2, and STAm) may be connected to the reset signal input terminals RT of their respective previous stages and the start signal input terminals ST of their respective subsequent stages. However, the carry signal output terminal COUT of the second stage STA2 may be connected to the start signal input terminal ST of the fourth stage STA4, and the carry signal output terminal COUT of the m-th stage STAm may be connected to the reset signal input terminal RT of the (m−2)-th stage STAm−2.

Figure 8:
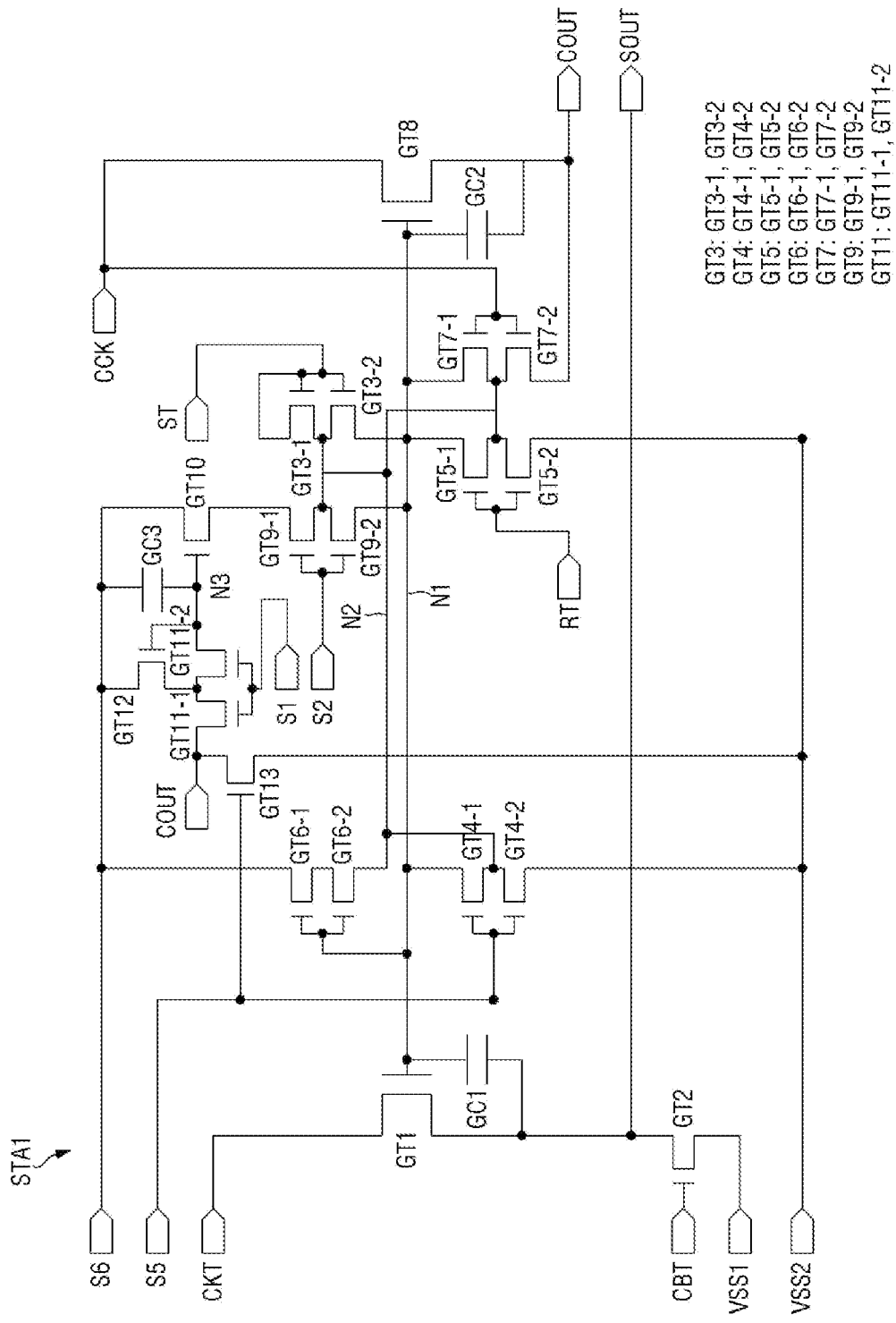
FIG. 8 is a detailed circuit diagram of the first stage of FIG. 7.

FIG. 8 is a detailed circuit diagram of the first stage of FIG. 7.

Referring to FIG. 8, the first stage STA1 may receive scan control signals and may output a scan signal. In one example, the first stage STA1 may receive, as the scan control signals, a clock signal, which is input to the clock signal input terminal CKT, a clock bar signal, which is input to the clock bar input unit CBT, a carry clock signal, which is input to the carry clock signal input terminal CCK, a first input signal, which is input to a first input unit S1, a second input signal, which is input to a second input unit S2, a fifth input signal, which is input to a fifth input unit S5, a sixth input signal, which is input to a sixth input unit S6, a first power supply voltage, which is input to a first power supply input unit VSS1, and a second power supply voltage, which is input to a second power supply input unit VSS2. However, the scan control signals are not particularly limited.

The first stage STA1 may include a plurality of scan transistors and a plurality of scan capacitors. In one example, the first stage STA1 may include first through thirteenth scan transistors GT1 through GT13 and first through third scan capacitors GC1 through GC3.

The first scan transistor GT1 may be turned on by the voltage of a first node N1 to provide the clock signal, which is input to the clock signal input terminal CKT, to the scan signal output terminal SOUT. In one example, the first scan transistor GT1 may be a pull-up transistor of the first stage STA1, but the present disclosure is not limited thereto. The gate electrode of the first scan transistor GT1 may be connected to the first node N1, the drain electrode of the first scan transistor GT1 may be connected to the clock signal input terminal CKT, and the source electrode of the first scan transistor GT1 may be connected to the scan signal output terminal SOUT.

The first scan capacitor GC1 may be connected between the first node N1 and the scan signal output terminal SOUT. The first scan capacitor GC1 may be connected between the gate electrode and the source electrode of the first scan transistor GT1. Thus, the first scan capacitor GC1 can maintain (or hold a charge corresponding to) the difference in electric potential between the gate electrode and the source electrode of the first scan transistor GT1.

The second scan transistor GT2 may be turned on by the clock bar signal from the clock bar input unit CBT, to discharge to the scan signal output terminal SOUT a voltage that is as low as the first power supply voltage that is input to the first power supply input unit VSS1. In one example, the second scan transistor GT2 may be a pull-down transistor of the first stage STA1, but the present disclosure is not limited thereto. The gate electrode of the second scan transistor GT2 may be connected to the clock bar signal input terminal CBT, the drain electrode of the second scan transistor GT2 may be connected to the scan signal output terminal SOUT, and the source electrode of the second scan transistor GT2 may be connected to the first power supply input unit VSS1.

The third scan transistor GT3 may be turned on by the start signal from the start signal input terminal ST or a carry signal of a stage previous to the first stage STA1 to provide the start signal or the carry signal of the previous stage to the first node N1. In one example, the third scan transistor GT3 may be a dual transistor including (3-1)-th and (3-2)-th scan transistors GT3-1 and GT3-2. The gate electrode and the drain electrode of the (3-1)-th scan transistor GT3-1 may be connected to the start signal input terminal ST, and the source electrode of the (3-1)-th scan transistor GT3-1 may be connected to the drain electrode of the (3-2)-th scan transistor GT3-2. The gate electrode of the (3-2)-th scan transistor GT3-2 may be connected to the start signal input terminal ST, the drain electrode of the (3-2)-th scan transistor GT3-2 may be connected to the source electrode of the (3-1)-th scan transistor GT3-1, and the source electrode of the (3-2)-th scan transistor GT3-2 may be connected to the first node N1. As the source electrode of the (3-1)-th scan transistor GT3-1 and the drain electrode of the (3-2)-th scan transistor GT3-2 are connected to a second node N2, the leakage current between the (3-1)-th and (3-2)-th scan transistors GT3-1 and GT3-2 may be reduced or minimized.

The fourth scan transistor GT4 may be turned on by the fifth input signal from the fifth input unit S5 to discharge the first node N1. The fourth scan transistor GT4 may be a dual transistor including (4-1)-th and (4-2)-th scan transistors GT4-1 and GT4-2. The gate electrode of the (4-1)-th scan transistor GT4-1 may be connected to the fifth input unit S5, the drain electrode of the (4-1)-th scan transistor GT4-1 may be connected to the first node N1, and the source electrode of the (4-1)-th scan transistor GT4-1 may be connected to the drain electrode of the (4-2)-th scan transistor GT4-2. The gate electrode of the (4-2)-th scan transistor GT4-2 may be connected to the fifth input unit S5, the drain electrode of the (4-2)-th scan transistor GT4-2 may be connected to the source electrode of the (4-1)-th scan transistor GT4-1, and the source electrode of the (4-2)-th scan transistor GT4-2 may be connected to the second power supply input unit VSS2. As the source electrode of the (4-1)-th scan transistor GT4-1 and the drain electrode of the (4-2)-th scan transistor GT4-2 are connected to the second node N2, the leakage current between the (4-1)-th and (4-2)-th scan transistors GT4-1 and GT4-2 may be reduced or minimized.

The fifth scan transistor GT5 may be turned on by a carry signal of a stage subsequent to the first stage STA1, from the reset input unit RT, to discharge the first node N1. The fifth scan transistor GT5 may be a dual transistor including (5-1)-th and (5-2)-th scan transistors GT5-1 and GT5-2. The gate electrode of the (5-1)-th scan transistor GT5-1 may be connected to the reset input unit RT, the drain electrode of the (5-1)-th scan transistor GT5-1 may be connected to the first node N1, and the source electrode of the (5-1)-th scan transistor GT5-1 may be connected to the drain electrode of the (5-2)-th scan transistor GT5-2. The gate electrode of the (5-2)-th scan transistor GT5-2 may be connected to the reset input unit RT, the drain electrode of the (5-2)-th scan transistor GT5-2 may be connected to the source electrode of the (5-1)-th scan transistor GT5-1, and the source electrode of the (5-2)-th scan transistor GT5-2 may be connected to the second power supply input unit VSS2. As the source electrode of the (5-1)-th scan transistor GT5-1 and the drain electrode of the (5-2)-th scan transistor GT5-2 are connected to the second node N2, the leakage current between the (5-1)-th and (5-2)-th scan transistors GT5-1 and GT5-2 may be reduced or minimized.

The sixth scan transistor GT6 may be turned on by the voltage of the first node N1 to provide the sixth input signal from the sixth input unit S6 to the second node N2. The sixth scan transistor GT6 may be a dual transistor including (6-1)-th and (6-2)-th scan transistors GT6-1 and GT6-2. The gate electrode of the (6-1)-th scan transistor GT6-1 may be connected to the first node N1, the drain electrode of the (6-1)-th scan transistor GT6-1 may be connected to the sixth input unit S6, and the source electrode of the (6-1)-th scan transistor GT6-1 may be connected to the drain electrode of the (6-2)-th scan transistor GT6-2. The gate electrode of the (6-2)-th scan transistor GT6-2 may be connected to the first node N1, the drain electrode of the (6-2)-th scan transistor GT6-2 may be connected to the source electrode of the (6-1)-th scan transistor GT6-1, and the source electrode of the (6-2)-th scan transistor GT6-2 may be connected to the second node N2.

The seventh scan transistor GT7 may be turned on by the carry clock signal from the carry clock signal input terminal CCK to output the voltage of the first node N1 to the carry signal output terminal COUT. The seventh scan transistor GT7 may be a dual transistor including (7-1)-th and (7-2)-th scan transistors GT7-1 and GT7-2. The gate electrode of the (7-1)-th scan transistor GT7-1 may be connected to the carry clock signal input terminal CCK, the drain electrode of the (7-1)-th scan transistor GT7-1 may be connected to the first node N1, and the source electrode of the (7-1)-th scan transistor GT7-1 may be connected to the drain electrode of the (7-2)-th scan transistor GT7-2. The gate electrode of the (7-2)-th scan transistor GT7-2 may be connected to the carry clock signal input terminal CCK, the drain electrode of the (7-2)-th scan transistor GT7-2 may be connected to the source electrode of the (7-1)-th scan transistor GT7-1, and the source electrode of the (7-2)-th scan transistor GT7-2 may be connected to the carry signal output terminal COUT. As the source electrode of the (7-1)-th scan transistor GT7-1 and the drain electrode of the (7-2)-th scan transistor GT7-2 are connected to the second node N2, the leakage current between the (7-1)-th and (7-2)-th scan transistors GT7-1 and GT7-2 may be reduced or minimized.

The eighth scan transistor GT8 may be turned on by the voltage of the first node N1 to provide the carry clock signal from the carry clock signal input terminal CCK to the carry signal output terminal COUT. The gate electrode of the eighth scan transistor GT8 may be connected to the first node Ni, the drain electrode of the eighth scan transistor GT8 may be connected to the carry clock signal input terminal CCK, and the source electrode of the eighth scan transistor GT8 may be connected to the carry signal output terminal COUT.

The second scan capacitor GC2 may be connected between the first node N1 and the carry signal output terminal COUT. The second scan capacitor GC2 may be connected between the gate electrode and the source electrode of the eighth scan transistor GT8. Thus, the second scan capacitor GC2 can maintain (or hold a charge corresponding to) the difference in electric potential between the gate electrode and the source electrode of the eighth scan transistor GT8.

The ninth scan transistor GT9 may be turned on by the second input signal from the second input unit S2 to connect the source electrode of the tenth scan transistor GT10 to the first node N1. The ninth scan transistor GT9 may be a dual transistor including (9-1)-th and (9-2)-th scan transistors GT9-1 and GT9-2. The gate electrode of the (9-1)-th scan transistor GT9-1 may be connected to the second input unit S2, the drain electrode of the (9-1)-th scan transistor GT9-1 may be connected to the source electrode of the tenth scan transistor GT10, and the source electrode of the (9-1)-th scan transistor GT9-1 may be connected to the drain electrode of the (9-2)-th scan transistor GT9-2. The gate electrode of the (9-2)-th scan transistor GT9-2 may be connected to the second input unit S2, the drain electrode of the (9-2)-th scan transistor GT9-2 may be connected to the source electrode of the (9-1)-th scan transistor GT9-1, and the source electrode of the (9-2)-th scan transistor GT9-2 may be connected to the first node N1. As the source electrode of the (9-1)-th scan transistor GT9-1 and the drain electrode of the (9-2)-th scan transistor GT9-2 are connected to the second node N2, the leakage current between the (9-1)-th and (9-2)-th scan transistors GT9-1 and GT9-2 may be reduced or minimized.

The tenth scan transistor GT10 may be turned on by the voltage of a third node N3 to provide the sixth input signal from the sixth input unit S6 to the drain electrode of the (9-1)-th scan transistor GT9-1. The gate electrode of the tenth scan transistor GT10 may be connected to the third node N3, the drain electrode of the tenth scan transistor GT10 may be connected to the sixth input unit S6, and the source electrode of the tenth scan transistor GT10 may be connected to the drain electrode of the (9-1)-th scan transistor GT9-1.

The third scan capacitor GC3 may be connected between the third node N3 and an input terminal for the sixth input signal (e.g., S6). The third scan capacitor GC3 may be connected between the gate electrode and the drain electrode of the tenth scan transistor GT10. Thus, the third scan capacitor GC3 can maintain (or hold a charge corresponding to) the difference in electric potential between the gate electrode and the drain electrode of the tenth scan transistor GT10.

The eleventh scan transistor GT11 may be turned on by the first input signal from the first input unit S1 to connect the carry signal output terminal COUT to the third node N3. The eleventh scan transistor GT11 may be a dual transistor including (11-1)-th and (11-2)-th scan transistors GT11-1 and GT11-2. The gate electrode of the (11-1)-th scan transistor GT11-1 may be connected to the first input unit S1, the drain electrode of the (11-1)-th scan transistor GT11-1 may be connected to the carry signal output terminal COUT, and the source electrode of the (11-1)-th scan transistor GT11-1 may be connected to the drain electrode of the (11-2)-th scan transistor GT11-2. The gate electrode of the (11-2)-th scan transistor GT11-2 may be connected to the first input unit S1, the drain electrode of the (11-2)-th scan transistor GT11-2 may be connected to the source electrode of the (11-1)-th scan transistor GT11-1, and the source electrode of the (11-2)-th scan transistor GT11-2 may be connected to the third node N3. As the source electrode of the (11-1)-th scan transistor GT11-1 and the drain electrode of the (11-2)-th scan transistor GT11-2 are connected to the source electrode of the twelfth scan transistor GT12, the leakage current between the (11-1)-th and (11-2)-th scan transistors GT11-1 and GT11-2 may be reduced or minimized.

The twelfth scan transistor GT12 may be turned on by the voltage of the third node N3 to connect the sixth input signal from the sixth input unit S6 to the source electrode of the (11-1)-th scan transistor GT11-1 or the drain electrode of the (11-2)-th scan transistor GT11-2. The gate electrode of the twelfth scan transistor GT12 may be connected to the third node N3, the drain electrode of the twelfth scan transistor GT12 may be connected to the sixth input unit S6, and the source electrode of the twelfth scan transistor GT12 may be connected to the source electrode of the (11-1)-th scan transistor GT11-1 and the drain electrode of the (11-2)-th scan transistor GT11-2. Thus, the twelfth scan transistor GT12 can maintain the difference in electric potential between the (11-1)-th and (11-2)-th scan transistors GT11-1 and GT11-2.

The thirteenth scan transistor GT13 may be turned on by the fifth input signal from the fifth input unit S5 to connect the carry signal output terminal COUT to the second voltage input unit VSS2. The gate electrode of the thirteenth scan transistor GT13 may be connected to the fifth input unit S5, the drain electrode of the thirteenth scan transistor GT13 may be connected to the carry signal output terminal COUT, and the source electrode of the thirteenth scan transistor GT13 may be connected to the second power supply input unit VSS2.

As illustrated in FIG. 8, the first stage STA1 may be located in the first display area DA1 and may receive, as the scan control signals, the clock signal, the clock bar signal, the carry clock signal, the first input signal, the second input signal, the fifth input signal, the sixth input signal, the first power supply voltage, and the second power supply voltage. As the first stage STA1 includes the first through thirteenth scan transistors GT1 through GT13 and the first through third scan capacitors GC1 through GC3, the first stage STA1 may output a scan signal and a carry signal.

The other odd-numbered stages, e.g., the third, . . . , (m−3)-th, (m−1)-th, and (m+1)-th stages STA3, . . . , STAm−3, STAm−1, and STAm+1, and the even-numbered stages (STA2, STA4, . . . , STAm−2, and STAm) may be substantially the same as the first stage STA1 of FIG. 8, and thus, detailed descriptions thereof will be omitted.

Figure 9:
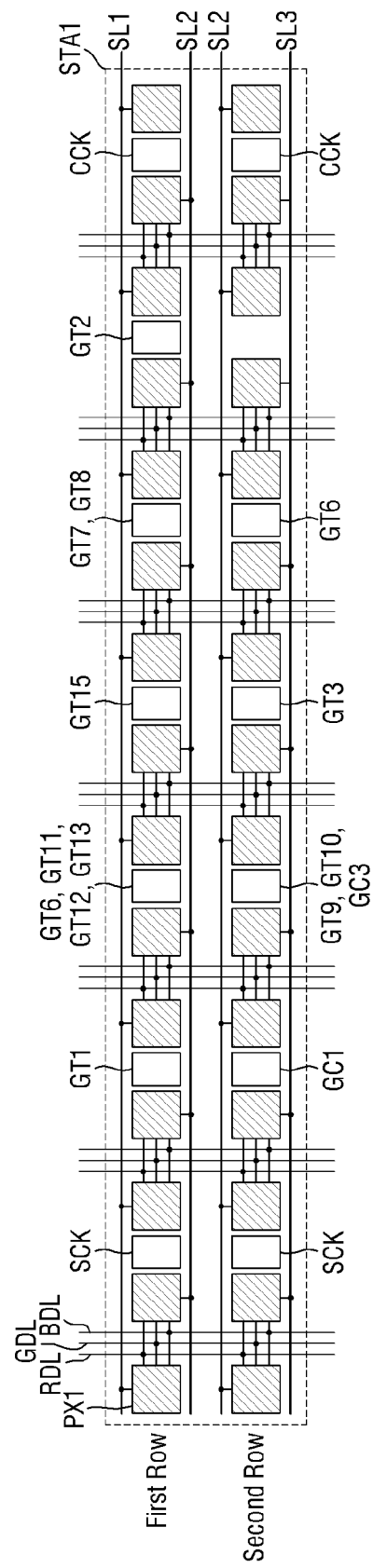
FIG. 9 is a layout view illustrating the layout of the elements of the first stage of FIG. 8 and first pixels.

FIG. 9 is a layout view illustrating the layout of the elements of the first stage of FIG. 8 and first pixels.

FIG. 6 illustrates the first stage STA1 as being arranged in one row, e.g., the first row, but for convenience, FIG. 9 illustrates the elements of the first stage STA1 as being arranged in two rows, e.g., the first and second rows. The fourth scan transistor GT4, the second scan capacitor GC2, and the scan output terminal SOUT of the first stage STA1 are omitted in FIG. 9 for the convenience of explanation.

Referring to FIG. 9, the elements of the first stage STA1 may be located in a region where first pixels PX1 are not located. The elements of the first stage STA1 may be located in remaining spaces between first pixels PX1 in the first direction DR1, but the present disclosure is not limited thereto. That is, the elements of the first stage STA1 may be located in remaining spaces between the first pixels PX1 and second pixels PX2 in the second direction DR2 or in remaining spaces on the upper sides, in the second direction DR2, of the first pixels PX1. The elements of the first stage STA1 refer to the first through thirteenth scan transistors GT1 through GT13 and the first through third scan capacitors GC1 through GC3.

The clock signal input terminal CKT, a scan output terminal SOUT (e.g., see FIG. 8), the first scan transistor GT1, the ninth scan transistor GT9, the eleventh scan transistor GT11, the twelfth scan transistor GT12, the thirteenth scan transistor GT13, the fifth scan transistor GT5, the seventh scan transistor GT7, the eighth scan transistor GT8, the second scan transistor GT2, and the carry clock signal input terminal CCK may be sequentially arranged in a left-to-right direction in the remaining spaces between the first pixels PX1 in the first row.

The clock signal input terminal CKT, the scan output terminal SOUT, the first scan capacitor GC1, the ninth scan transistor GT9, the tenth scan transistor GT10, the third scan capacitor GC3, the third scan transistor GT3, the sixth scan transistor GT6, an empty space, and the carry clock signal input terminal CCK may be sequentially arranged in the left-to-right direction in remaining spaces between the first rows in the second row.

The other odd-numbered stages, e.g., the third, . . . , (m−3)-th, (m−1)-th, and (m+1)-th stages STA3, . . . , STAm−3, STAm−1, and STAm+1, and the even-numbered stages (STA2, STA4, . . . , STAm−2, and STAm) may have substantially the same layout as the first stage STA1 of FIG. 9, and thus, detailed descriptions thereof will be omitted.

As illustrated in FIG. 9, the elements of each of the odd- and even-numbered stages (STA1, STA3, . . . , STAm−3, STAm−1, and STAm+1) and (STA2, STA4, . . . , STAm−2, and STAm) may be appropriately distributed in remaining spaces between first pixels PX1. Thus, as there is no need of space for the odd-numbered stages (STA1, STA3, . . . , STAm−3, STAm−1, and STAm+1) and the even-numbered stages (STA2, STA4, . . . , STAm−2, and STAm), a non-display area for arranging the elements of each of the odd- and even-numbered stages (STA1, STA3, . . . , STAm−3, STAm−1, and STAm+1) and (STA2, STA4, . . . , STAm−2, and STAm) may be omitted. Thus, despite the presence of the seam SM, images displayed by the first and second display devices 11 and 12 or images displayed by the first and third display devices 11 and 13 can be prevented from appearing disconnected.

Figure 10:
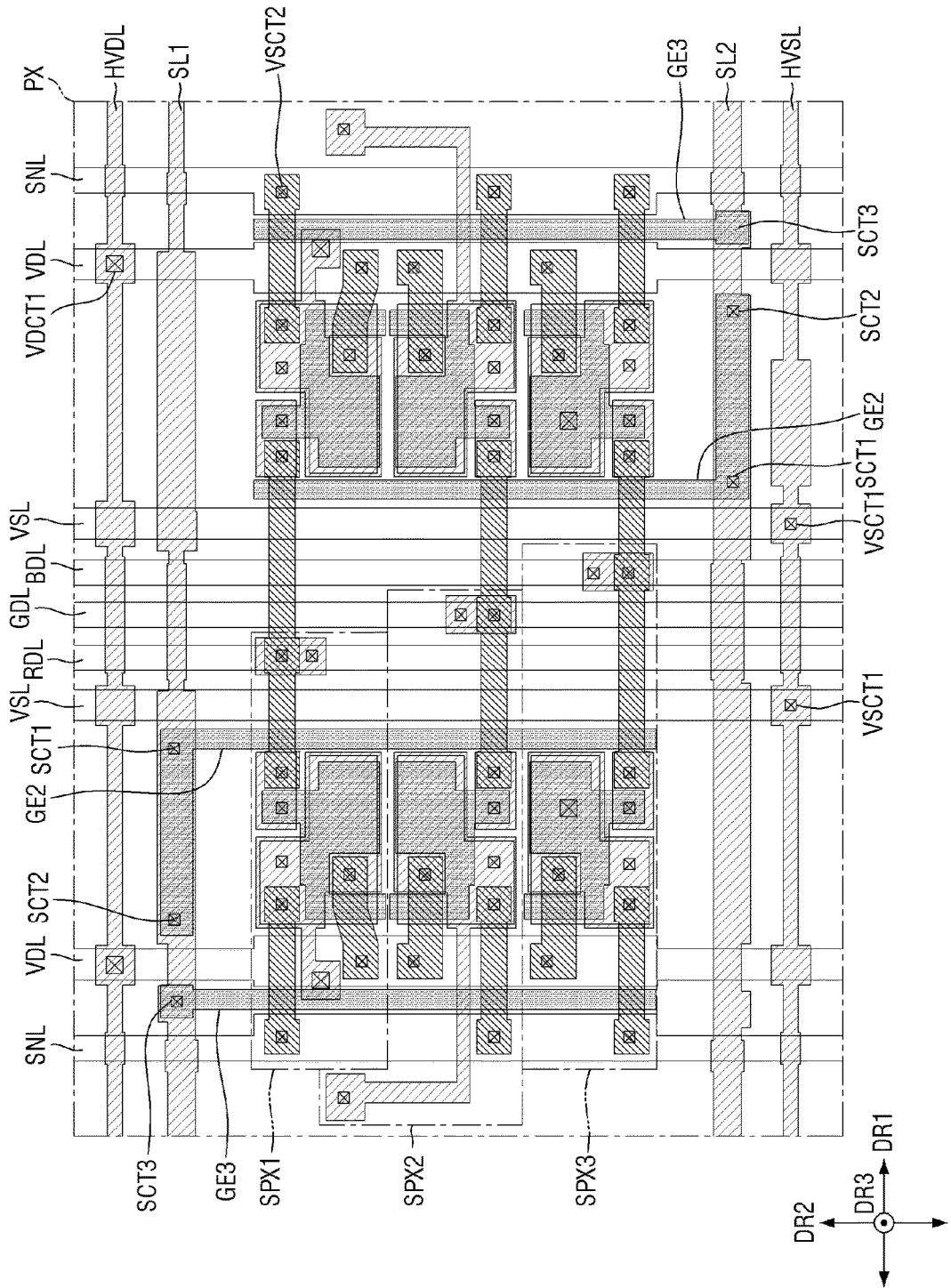
FIG. 10 is a layout view illustrating two first pixels of FIG. 9 that are adjacent to each other with data lines interposed therebetween.
Figure 11:
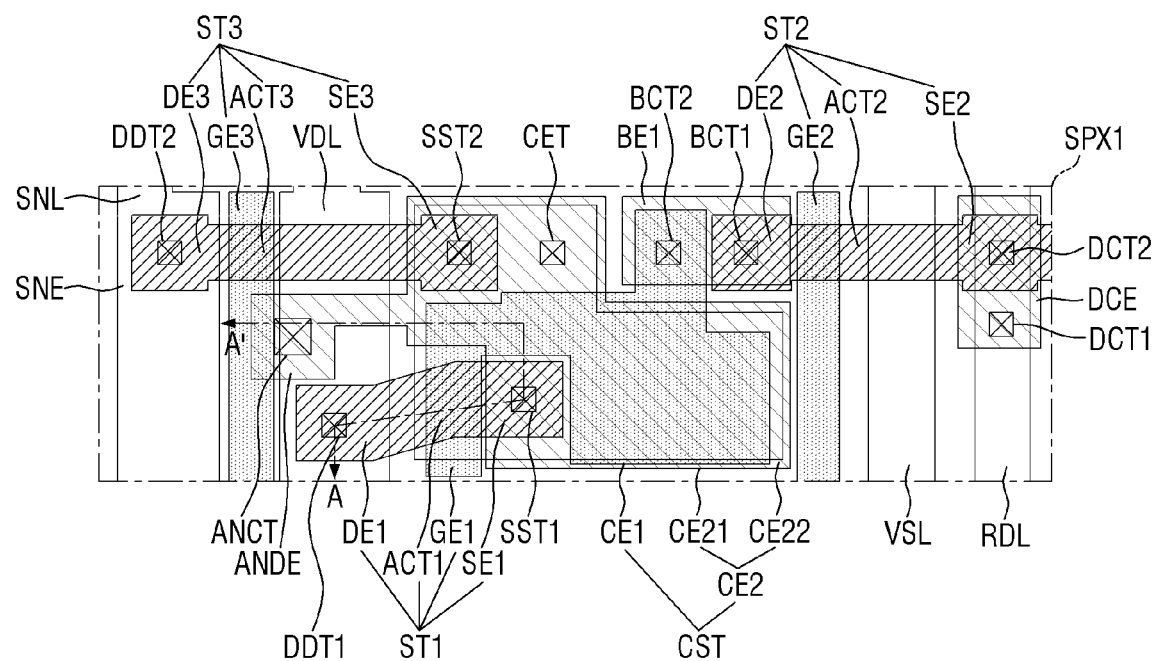
FIG. 11 is a layout view of a first subpixel of FIG. 10.
Figure 12:
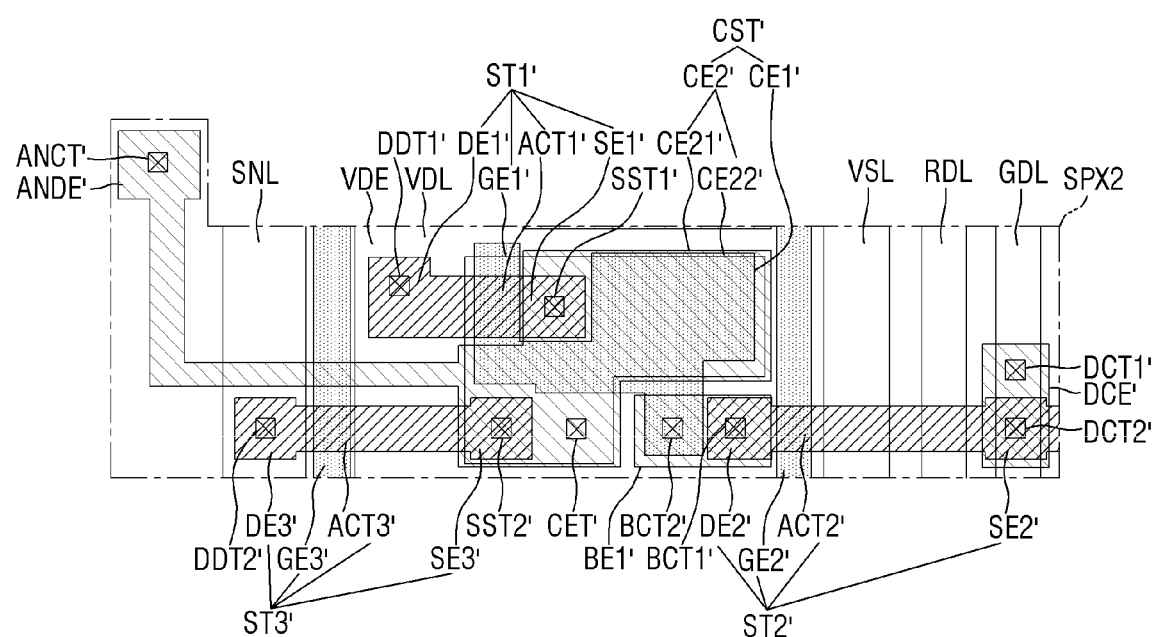
FIG. 12 is a layout view of a second subpixel of FIG. 10.
Figure 13:
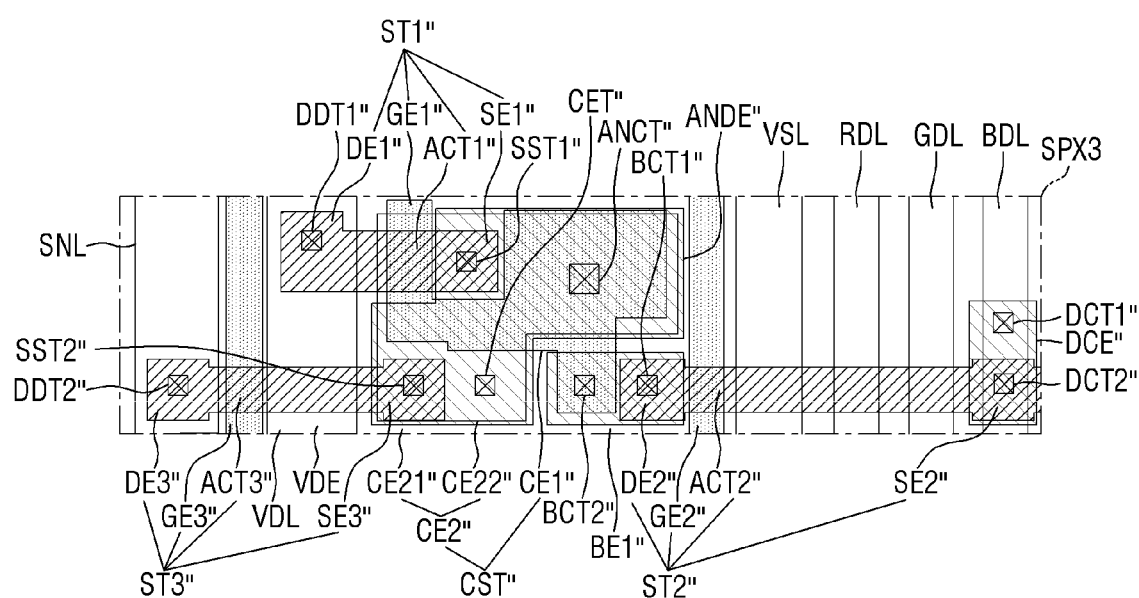
FIG. 13 is a layout view of a third subpixel of FIG. 10.

FIG. 10 is a layout view illustrating two first pixels of FIG. 9 that are adjacent to each other with data lines interposed therebetween. FIG. 11 is a layout view of a first subpixel of FIG. 10. FIG. 12 is a layout view of a second subpixel of FIG. 10. FIG. 13 is a layout view of a third subpixel of FIG. 10.

Referring to FIGS. 10-13, the first scan line SL1, the second scan line SL2, a first horizontal power supply line HVSL, and a second horizontal power supply line HVDL may extend in the first direction DR1 (or an X-axis direction). The first scan line SL1, the second scan line SL2, the first horizontal power supply line HVSL, and the second horizontal power supply line HVDL may be arranged in parallel to one another. The first scan line SL1, the second scan line SL2, the first horizontal power supply line HVSL, and the second horizontal power supply line HVDL may be spaced from one another in the second direction DR2 (or a Y-axis direction).

Red, green, and blue data lines RDL, GDL, and BDL, first power supply lines VSL, second power supply lines VDL, and sensing lines SNL may be arranged in parallel to one another. The red, green, and blue data lines RDL, GDL, and BDL, the first power supply lines VSL, the second power supply lines VDL, and the sensing lines SNL may be arranged in parallel to one another. The red, green, and blue data lines RDL, GDL, and BDL, the first power supply lines VSL, the second power supply lines VDL, and the sensing lines SNL may be spaced from one another in the first direction DR1 (or the X-axis direction).

Each of the first power supply lines VSL may be connected to the first horizontal power supply line HVSL through at least one first power supply contact hole VSCT1. Thus, the first horizontal power supply line HVSL may have substantially the same electric potential as the first power supply lines VSL. That is, the first horizontal power supply line HVSL may receive the first power supply voltage.

Each of the second power supply lines VDL may be connected to a second horizontal power supply line HVDL through at least one second power supply contact hole VDCT1. Thus, the second horizontal power supply line HVDL may have substantially the same electric potential as the second power supply lines VDL. That is, the second horizontal power supply line HVDL may receive the second power supply voltage.

Each of the first and second scan lines SL1 and SL2 may be connected to a second gate electrode GE2 through first and second scan contact holes SCT1 and SCT2. The first and second scan contact holes SCT1 and SCT2 may be spaced from each other. One of the first and second scan contact holes SCT1 and SCT2 may not be provided. The second gate electrode GE2 may include a first extension that extends in the first direction DR1 (or the X-axis direction) and a second extension that extends in the second direction DR2 (or the Y-axis direction). The first extension of the second gate electrode GE2 may overlap with the first or second scan line SL1 or SL2. The second extension of the second gate electrode GE2 may be located adjacent to whichever of the red, green, and blue data lines RDL, GDL, and BDL is closest thereto.

Each of the first and second scan lines SL1 and SL2 may be connected to a third gate electrode GE3 through a third scan contact hole SCT3. The third gate electrode GE3 may extend in the second direction DR2 (or the Y-axis direction).

One of the two first pixels PX1, which are adjacent to each other with the red, green, and blue data lines RDL, GDL, and BDL interposed therebetween, may be connected to the first scan line SL1, and the other first pixel PX1 may be connected to the second scan line SL2. In one example, the left first pixel PX1, which is to the left of the red, green, and blue data lines RDL, GDL, and BDL, may be connected to the first scan line SL1, and the right first pixel PX1, which is to the right of the red, green, and blue data lines RDL, GDL, and BDL, may be connected to the second scan line SL2.

Each of the first pixels PX1 may include first, second, and third subpixels SPX1, SPX2, and SPX3. The first subpixel SPX1 may output red light in accordance with a data voltage from the red data line RDL. The second subpixel SPX2 may output green light in accordance with a data voltage from the green data line GDL. The third subpixel SPX3 may output blue light in accordance with a data voltage from the blue data line BDL. However, the colors of light output from the first, second, and third subpixels SPX1, SPX2, and SPX3 are not particularly limited.

The first, second, and third subpixels SPX1, SPX2, and SPX3 may be arranged along the second direction DR2 (or the Y-axis direction). The first, second, and third subpixels SPX1, SPX2, and SPX3 may overlap with at least one of the red, green, and blue data lines RDL, GDL, and BDL, one of the first power supply lines VSL, one of the second power supply lines VDL, and one of the sensing lines SNL.

The first, second, and third subpixels SPX1, SPX2, and SPX3 may not overlap with the first power supply lines VSL and the first power supply bottom lines in a third direction DR3 (e.g., a thickness direction of the substrate SUB). Also, the first, second, and third subpixels SPX1, SPX2, and SPX3 may not overlap with the first scan line SL1, the second scan line SL2, the first horizontal power supply line HVSL, and the second horizontal power supply line HVDL in the third direction DR3. The first, second, and third subpixels SPX1, SPX2, and SPX3 may be located between the first and second scan lines SL1 and SL2.

Two adjacent first subpixels SPX1 with the red, green, and blue data lines RDL, GDL, and BDL interposed therebetween may be connected to the same data line, e.g., the red data line RDL. Two adjacent second subpixels SPX2 with the red, green, and blue data lines RDL, GDL, and BDL interposed therebetween may be connected to the same data line, e.g., the green data line GDL. Two adjacent third subpixels SPX3 with the red, green, and blue data lines RDL, GDL, and BDL interposed therebetween may be connected to the same data line, e.g., the blue data line BDL.

Alternatively, the two adjacent first subpixels SPX1 with the red, green, and blue data lines RDL, GDL, and BDL interposed therebetween may be connected to different data lines. In one example, the first subpixel SPX1 of the left first pixel PX1 may be connected to the blue data line BDL, and the first subpixel SPX1 of the right first pixel PX1 may be connected to the red data line RDL.

Also, alternatively, the two adjacent second subpixels SPX2 with the red, green, and blue data lines RDL, GDL, and BDL interposed therebetween may be connected to different data lines. In one example, the second subpixel SPX2 of the left first pixel PX1 may be connected to the red data line RDL, and the second subpixel SPX2 of the right first pixel PX1 may be connected to the blue data line BDL.

Also, alternatively, the two adjacent third subpixels SPX3 with the red, green, and blue data lines RDL, GDL, and BDL interposed therebetween may be connected to different data lines.

Referring to FIG. 11, a first subpixel SPX1 may include a first transistor ST1, a second transistor ST2, a third transistor ST3, and a capacitor CST.

The first transistor ST1 may include a first gate electrode GE1, a first active layer ACT1, a first source electrode SE1, and a first drain electrode DE1. The first gate electrode GE1 may be formed in one body with a first electrode CE1 of the capacitor CST. The first active layer ACT1 may overlap with the first gate electrode GE1 in the third direction DR3. The first source electrode SE1 may be located on one side of the first active layer ACT1, for example, on the right side of the first active layer ACT1. The first source electrode SE1 may be connected to a first anode connecting electrode ANDE and a first sub-electrode CE21 of a second electrode CE2 of the capacitor CST through a first source contact hole SST1. The first drain electrode DE1 may be located on the other side of the first active layer ACT1, for example, on the left side of the first active layer ACT1. The first drain electrode DE1 may be connected to a second power supply line VDL through a first drain contact hole DDT1. The anode connecting electrode ANDE may be connected to a pixel electrode 171 (e.g., see, FIG. 16), which is electrically connected to a light-emitting element LE (e.g., see, FIG. 16) through an anode contact hole ANCT.

The second transistor ST2 may include a second gate electrode GE2, a second active layer ACT2, a second source electrode SE2, and a second drain electrode DE2. The second active layer ACT2 may overlap with the second gate electrode GE2. The second source electrode SE2 may be located on one side of the second active layer ACT2, for example, on the right side of the second active layer ACT2. The second source electrode SE2 may be connected to a data connecting electrode DCE through a second data contact hole DCT2. The data connecting electrode DCE may be connected to one of the red, green, and blue data lines RDL, GDL, and BDL through a first data contact hole DCT1. The second drain electrode DE2 may be located on the other side of the second active layer ACT2, for example, on the left side of the second active layer ACT2. The second drain electrode DE2 may be connected to a connecting electrode BE1 through a first power supply connecting hole BCT1. The connecting electrode BE1 may be connected to the first gate electrode GE1 and the first electrode CE1 of the capacitor CST through the second power supply connecting hole BCT2.

The third transistor ST3 may include a third gate electrode GE3, a third active layer ACT3, a third source electrode SE3, and a third drain electrode DE3. The third active layer ACT3 may overlap with the third gate electrode GE3 in the third direction DR3. The third source electrode SE3 may be located on one side of the third active layer ACT3, for example, on the right side of the third active layer ACT3. The third source electrode SE3 may be connected to the first anode connecting electrode ANDE and the second electrode CE2 of the capacitor CST through a second source contact hole SST2. The third drain electrode DE3 may be located on the other side of the third active layer ACT3, for example, on the left side of the third active layer ACT3. The third drain electrode DE3 may be connected to a sensing connecting electrode SNE through a second drain contact hole DDT2.

The capacitor CST may include the first and second electrodes CE1 and CE2. The first electrode CE1 may be formed in one body with the first gate electrode GE1. The second electrode CE2 may include the first sub-electrode CE21 and a second sub-electrode CE22. The first sub-electrode CE21 may be formed in one body with the anode connecting electrode ANDE. The second sub-electrode CE22 may be connected to the first sub-electrode CE21 through a capacitor contact hole CET. The first electrode CE1, the first sub-electrode CE21, and the second sub-electrode CE22 of the capacitor CST may overlap with one another in the third direction DR3. The first electrode CE1 of the capacitor CST may be located between the first and second sub-electrodes CE21 and CE22 in the third direction DR3. As the first electrode CE1 and the first sub-electrode CE21 overlap with each other and the first electrode CE1 and the second sub-electrode CE22 overlap with each other, the capacitor CST may be formed.

Referring to FIG. 12, a second subpixel SPX2 may include a first transistor ST1', a second transistor ST2', a third transistor ST3', and a capacitor CST'.

The first transistor ST1' may include a first gate electrode GE1', a first active layer ACT1', a first source electrode SE1', and a first drain electrode DE1'. The first gate electrode GE1', the first active layer ACT1', the first source electrode SE1', and the first drain electrode DE1' of the first transistor ST1' are substantially the same as the first gate electrode GE1, the first active layer ACT1, the first source electrode SE1, and the first drain electrode DE1, respectively, of the first transistor ST1 of FIG. 11, and thus, detailed descriptions thereof will be omitted.

The second transistor ST2' may include a second gate electrode GE2', a second active layer ACT2', a second source electrode SE2', and a second drain electrode DE2'. The second gate electrode GE2', the second active layer ACT2', the second source electrode SE2', and the second drain electrode DE2' of the second transistor ST2' are substantially the same as the second gate electrode GE2, the second active layer ACT2, the second source electrode SE2, and the second drain electrode DE2, respectively, of the second transistor ST2 of FIG. 11, and thus, detailed descriptions thereof will be omitted.

The third transistor ST3' may include a third gate electrode GE3', a third active layer ACT3', a third source electrode SE3', and a third drain electrode DE3'. The third gate electrode GE3', the third active layer ACT3', the third source electrode SE3', and the third drain electrode DE3' of the third transistor ST3' are substantially the same as the third gate electrode GE3, the third active layer ACT3, the third source electrode SE3, and the third drain electrode DE3, respectively, of the third transistor ST3 of FIG. 11, and thus, detailed descriptions thereof will be omitted.

The capacitor CST' may include a first electrode CE1' and a second electrode CE2', and the second electrode CE2' may include first and second sub-electrodes CE21' and CE22'. The first electrode CE1' and the first and second sub-electrodes CE21' and CE22' of the second electrode CE2' may be the same as the first electrode CE1 and the first and second sub-electrodes CE21 and CE22 of the second electrode CE2, respectively, of FIG. 11, and thus, detailed descriptions thereof will be omitted.

A connecting electrode BE1', a data connecting electrode DCE', an anode connecting electrode ANDE', and contact holes (DCT1', DCT2', BCT1', BCT2', SST1', SST2', DDT1', DDT2', ANCT', and CET') of the second subpixel SPX2 are substantially the same as the connecting electrode BE1, the data connecting electrode DCE, the anode connecting electrode ANDE, and the contact holes (DCT1, DCT2, BCT1, BCT2, SST1, SST2, DDT1, DDT2, ANCT, and CET), respectively, of the first subpixel SPX1 of FIG. 11, and thus, detailed descriptions thereof will be omitted.

Referring to FIG. 13, a third subpixel SPX3 may include a first transistor ST1", a second transistor ST2", a third transistor ST3", and a capacitor CST".

The first transistor ST1" may include a first gate electrode GE1", a first active layer ACT1", a first source electrode SE1", and a first drain electrode DE1". The first gate electrode GE1", the first active layer ACT1", the first source electrode SE1", and the first drain electrode DE1" of the first transistor ST1" are substantially the same as the first gate electrode GE1, the first active layer ACT1, the first source electrode SE1, and the first drain electrode DE1, respectively, of the first transistor ST1 of FIG. 11, and thus, detailed descriptions thereof will be omitted.

The second transistor ST2" may include a second gate electrode GE2", a second active layer ACT2", a second source electrode SE2", and a second drain electrode DE2". The second gate electrode GE2", the second active layer ACT2", the second source electrode SE2", and the second drain electrode DE2" of the second transistor ST2" are substantially the same as the second gate electrode GE2, the second active layer ACT2, the second source electrode SE2, and the second drain electrode DE2, respectively, of the second transistor ST2 of FIG. 11, and thus, detailed descriptions thereof will be omitted.

The third transistor ST3" may include a third gate electrode GE3", a third active layer ACT3", a third source electrode SE3", and a third drain electrode DE3". The third gate electrode GE3", the third active layer ACT3", the third source electrode SE3", and the third drain electrode DE3" of the third transistor ST3" are substantially the same as the third gate electrode GE3, the third active layer ACT3, the third source electrode SE3, and the third drain electrode DE3, respectively, of the third transistor ST3 of FIG. 11, and thus, detailed descriptions thereof will be omitted.

The capacitor CST" may include a first electrode CE1" and a second electrode CE2", and the second electrode CE2" may include first and second sub-electrodes CE21" and CE22". The first electrode CE1" and the first and second sub-electrodes CE21" and CE22" of the second electrode CE2" may be the same as the first electrode CE1 and the first and second sub-electrodes CE21 and CE22 of the second electrode CE2, respectively, of FIG. 11, and thus, detailed descriptions thereof will be omitted.

A connecting electrode BE1", a data connecting electrode DCE", an anode connecting electrode ANDE", and contact holes (DCT1", DCT2", BCT1", BCT2", SST1", SST2", DDT1", DDT2", ANCT", and CET") of the third subpixel SPX3 are substantially the same as the connecting electrode BE1, the data connecting electrode DCE, the anode connecting electrode ANDE, and the contact holes (DCT1, DCT2, BCT1, BCT2, SST1, SST2, DDT1, DDT2, ANCT, and CET), respectively, of the first subpixel SPX1 of FIG. 11, and thus, detailed descriptions thereof will be omitted.

Figure 14:
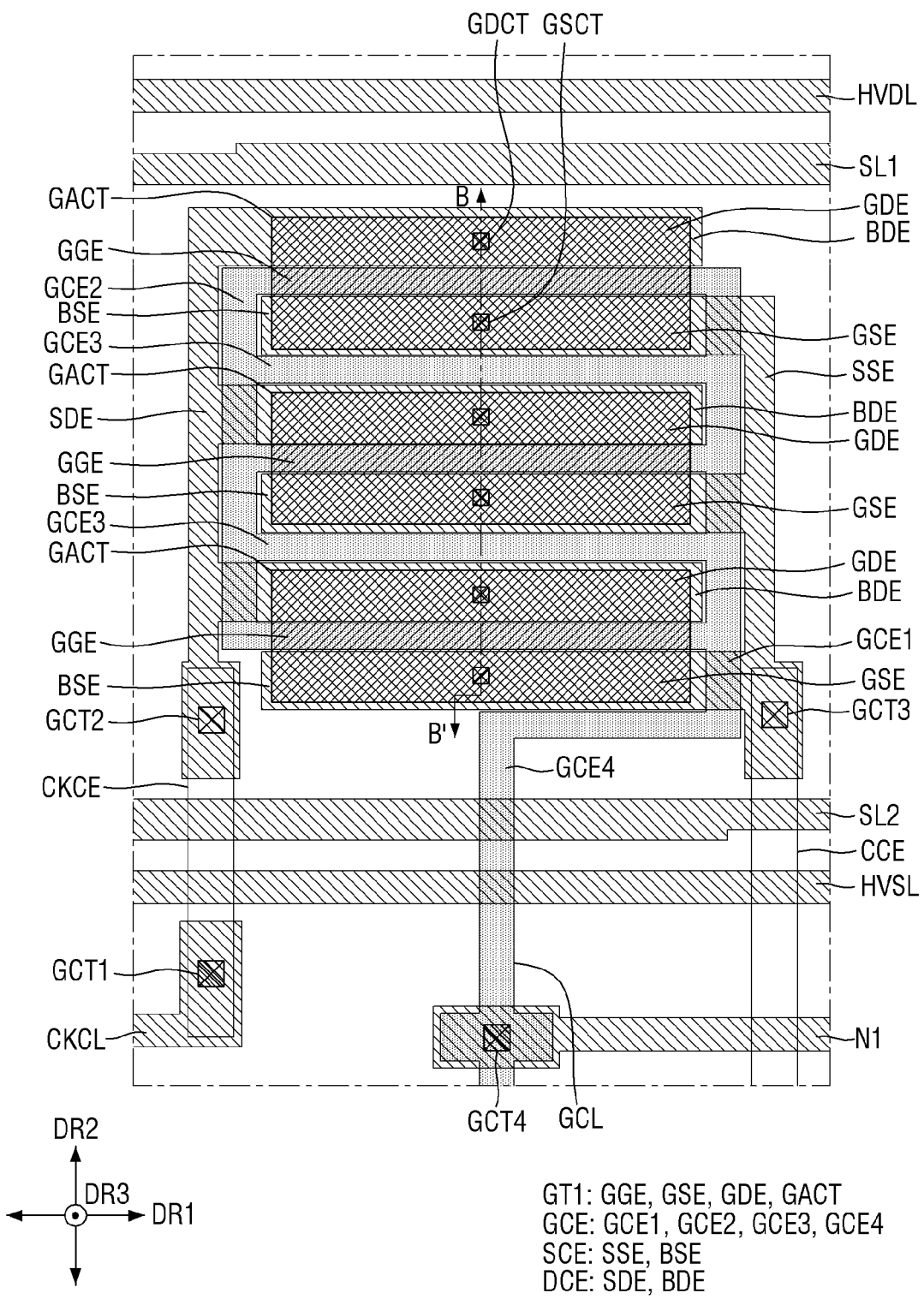
FIG. 14 is a layout view of a first scan transistor of FIG. 9.
Figure 15:
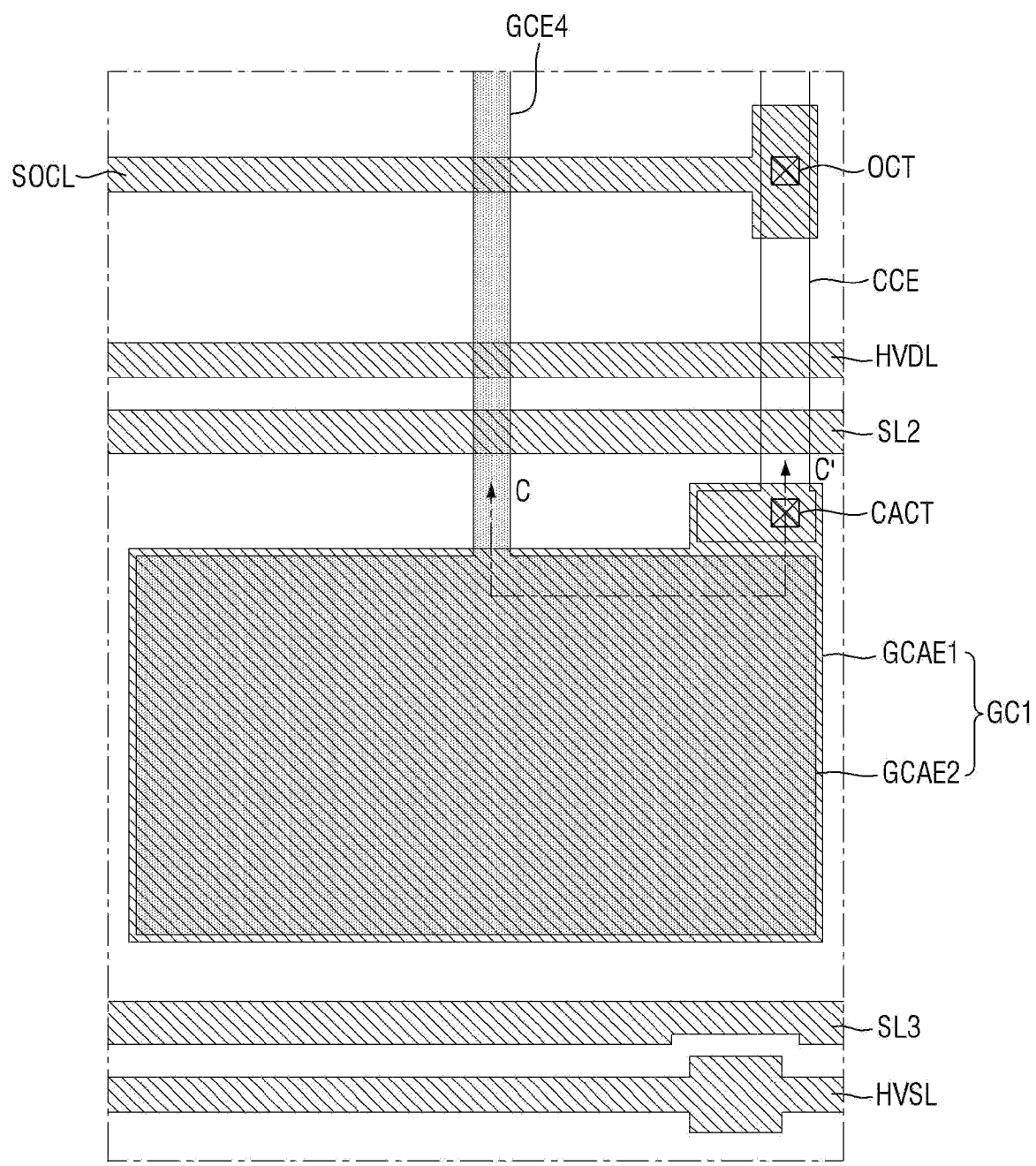
FIG. 15 is a layout view of a first scan capacitor of FIG. 9.

FIG. 14 is a layout view of the first scan transistor of FIG. 9. FIG. 15 is a layout view of the first scan capacitor of FIG. 9.

Referring to FIGS. 14 and 15, the first scan transistor GT1 may be located between the first and second scan lines SL1 and SL2 in the second direction DR2. The first scan transistor GT1 may include scan gate electrodes GGE, scan source electrodes GSE, scan drain electrodes GDE, and scan active layers GACT.

The first scan capacitor GC1 may be located between the second and third scan lines SL2 and SL3 in the second direction DR2. The first scan capacitor GC1 may include first and second scan capacitor electrodes GCAE1 and GCAE2.

The scan gate electrodes GGE may extend in the first direction DR1. The scan gate electrodes GGE may be connected to the gate connecting electrodes GCE. The gate connecting electrodes GCE may include a first gate connecting electrode GCE1, a second gate connecting electrode GCE2, third gate connecting electrodes GCE3, and a fourth gate connecting electrode GCE4. The first gate connecting electrode GCE1 may extend in the second direction DR2, and the second and the third gate connecting electrodes GCE2 and GCE3 may extend in the first direction DR1. In this case, first ends of the scan gate electrodes GGE may be connected to the first gate connecting electrode GCE1, and second ends of the scan gate electrodes GGE may be connected to the second gate connecting electrode GCE2. Also, first ends of the third gate connecting electrodes GCE3 may be connected to the first gate connecting electrode GCE1, and second ends of the third gate connecting electrodes GCE3 may be connected to the second gate connecting electrode GCE2. The fourth gate connecting electrode GCE4 may be connected to the first gate connecting electrode GCE1 and may be connected to a first node N1 through a gate connecting contact hole GCT4.

The scan active layers GACT may overlap with the scan gate electrodes GGE in the third direction DR3. The scan active layers GACT may not overlap with the third gate connecting electrodes GCE3 in the third direction DR3.

The scan source electrodes GSE may be located on first sides of the scan active layers GACT, for example, on the upper sides of the scan active layers GACT, and the scan drain electrodes GDE may be located on second sides of the scan active layers GACT, for example, on the lower sides of the scan active layers GACT.

The scan source electrodes GSE may be spaced from the scan drain electrodes GDE, which are adjacent to their respective scan source electrodes GSE, in the second direction DR2. The third gate connecting electrodes GCE3 may be located between the scan source electrodes GSE and the scan drain electrodes GDE, which are adjacent to their respective scan source electrodes GSE in the second direction DR2. The scan source electrodes GSE and the scan drain electrodes GDE may not overlap with the third gate connecting electrodes GCE3 in the third direction DR3.

The scan source electrodes GSE may be connected to a source connecting electrode SCE through scan source contact holes GSCT and to a data connecting electrode DCE through scan drain contact holes GDCT.

The source connecting electrode SCE may include a stem source connecting electrode SSE and branch source connecting electrodes BSE. The stem source connecting electrode SSE may extend in the second direction DR2, and the branch source connecting electrodes BSE may extend in the first direction DR1. The scan source electrodes GSE may be connected to the source connecting electrode BSE through scan source contact holes GSCT.

The stem source connecting electrode SSE may be connected to a capacitor connecting electrode CCE through a source connecting contact hole GCT3. The capacitor connecting electrode CCE may extend in the second direction DR2. The capacitor connecting electrode CCE may cross the second scan line SL2, the first horizontal power supply line HVSL, the first node N1, the second horizontal power supply line HVDL, and the second scan line SL2. The capacitor connecting electrode CCE may be connected to an output connecting line SOCL, which is connected to a scan signal output terminal SOUT through an output contact hole OCT. The capacitor connecting electrode CCE may be connected to a first scan capacitor electrode GCAE1 through a capacitor contact hole CACT.

The first scan capacitor electrode GCAE1 may overlap with a second scan capacitor electrode GCAE2, which is connected to the fourth gate connecting electrode GCE4, in the third direction DR3. A first scan capacitor GC1 may be formed by the first and second scan capacitor electrodes GCAE1 and GCAE2.

The data connecting electrode DCE may include a stem data connecting electrode SDE and branch data connecting electrodes BDE. The stem data connecting electrode SDE may extend in the second direction DR2, and the branch data connecting electrodes BDE may extend in the first direction DR1. The branch source connecting electrodes BSE and the branch data connecting electrodes BDE may be alternately arranged along the second direction DR2. The scan drain electrodes GDE may be connected to the branch data connecting electrodes BDE through the scan drain contact holes GDCT.

The stem data connecting electrode SDE may be connected to a clock connecting electrode CKCE through a drain connecting contact hole GCT2. The clock connecting electrode CKCE may cross the second scan line SL2 and the first horizontal power supply line HVSL. The clock connecting electrode CKCE may be connected to a scan clock connecting line CKCL, which is connected to the clock signal input terminal CKT, through a clock connecting contact hole GCT1.

As illustrated in FIG. 14, as the scan source electrodes GSE of the first scan transistor GT1 are connected to their respective branch source connecting electrodes BSE and the scan drain electrodes GDE are connected to their respective branch data connecting electrodes BDE, the scan active layers GACT may function as channels. Thus, the first scan transistor GT1 can stably output a clock signal input to the clock signal input terminal CKT, to the scan signal output terminal SOUT via multiple channels.

Figure 16:
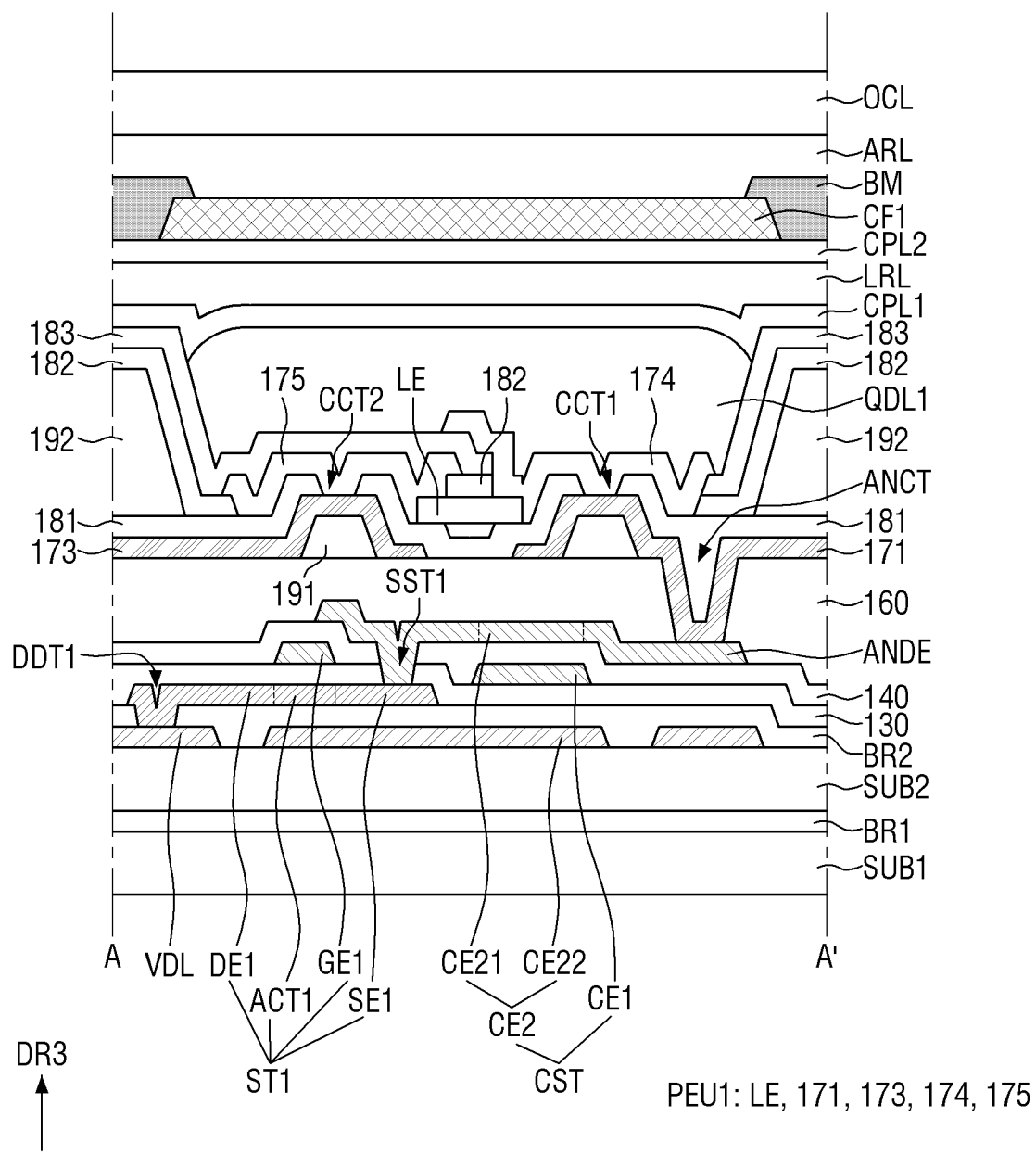
FIG. 16 is a cross-sectional view taken along the line A-A' of FIG. 11.
Figure 17:
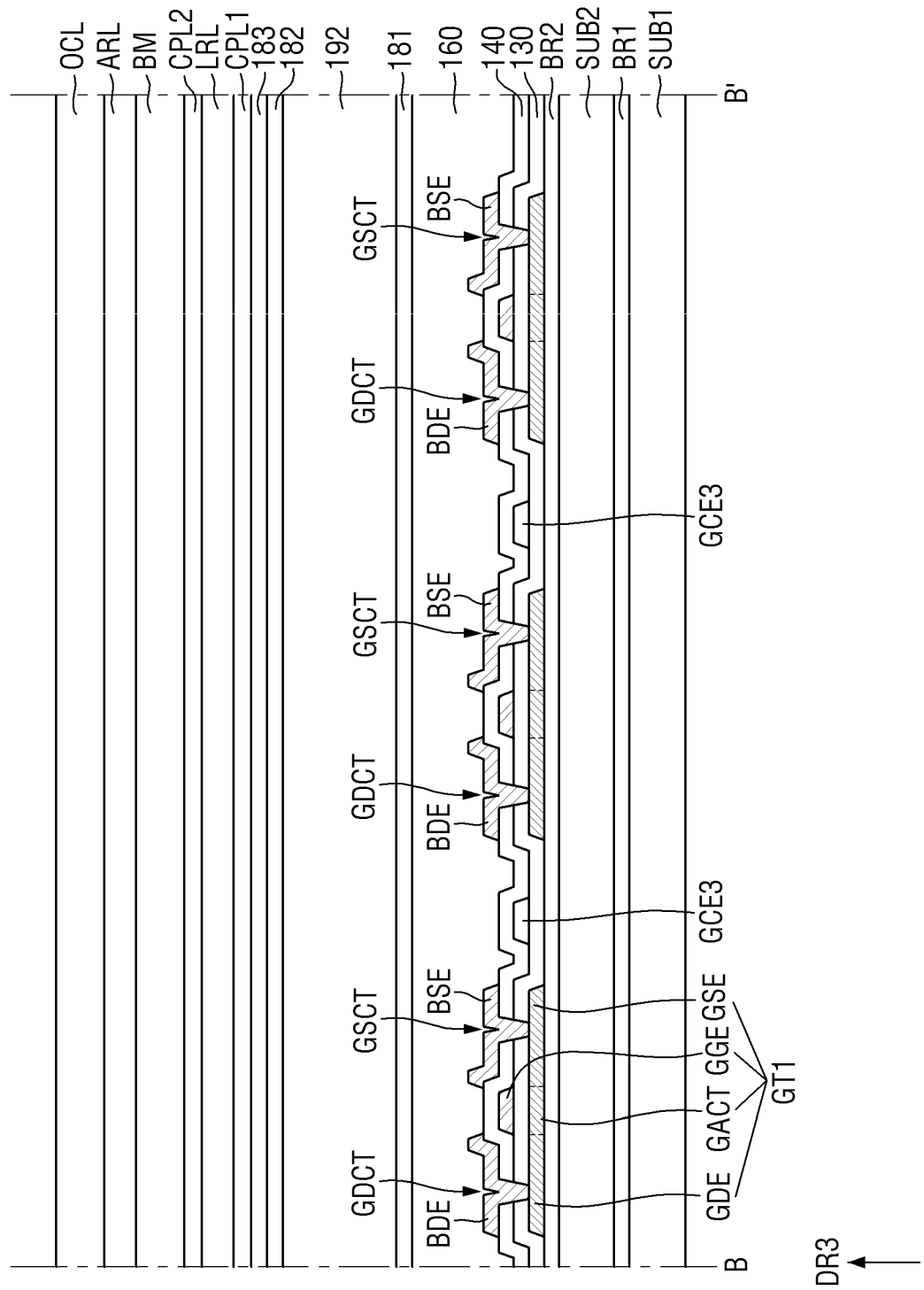
FIG. 17 is a cross-sectional view taken along the line B-B' of FIG. 14.
Figure 18:
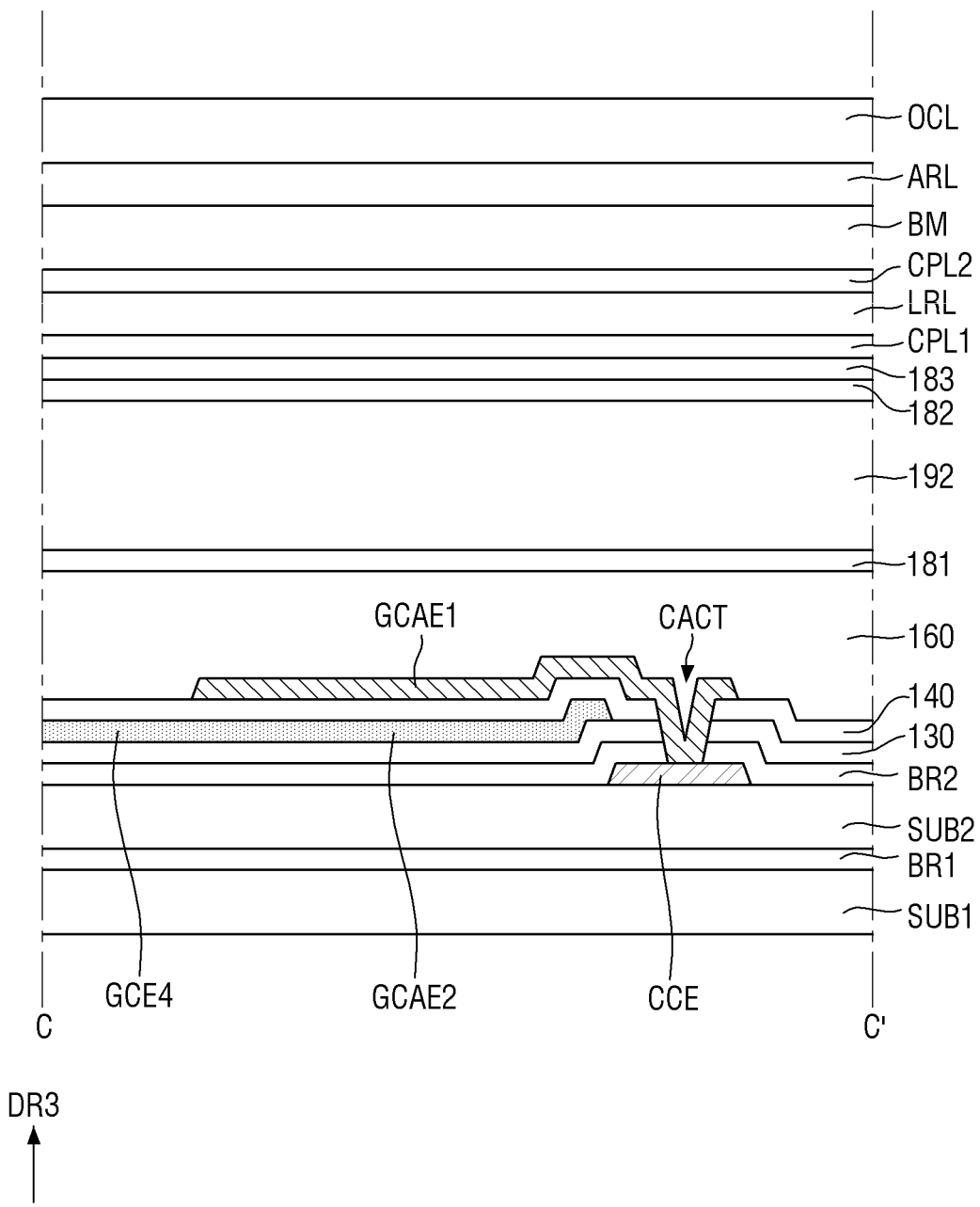
FIG. 18 is a cross-sectional view taken along the line C-C' of FIG. 15.

FIG. 16 is a cross-sectional view taken along the line A-A' of FIG. 11. FIG. 17 is a cross-sectional view taken along the line B-B' of FIG. 14. FIG. 18 is a cross-sectional view taken along the line C-C' of FIG. 15.

Referring to FIGS. 16-18, a first substrate SUB1 may be formed of an insulating material. In one example, the first substrate SUB1 may include an organic material such as polyimide.

A first barrier film BR1 may be located on the first substrate SUB1. The first barrier film BR1 is a film for protecting the first transistor ST1 and the light-emitting element LE from moisture that may penetrate through the first substrate SUB1, which is susceptible to moisture. The first barrier film BR1 may include at least one inorganic film. In one example, the first barrier film BR1 may be formed as a multifilm in which inorganic films including at least one of $SiO_x$, $SiN_x$, and SiON are alternately stacked.

A second substrate SUB2 may be located on the first barrier film BR1. The second substrate SUB2 may be formed of an insulating material. In one example, the second substrate SUB2 may include an organic material such as polyimide.

A first metal layer, which includes a first power supply line VSL, a second power supply line VDL, and the second sub-electrode CE22 of the second electrode CE2 of the capacitor CST, may be located on the second substrate SUB2. The first metal layer may further include a data line DL and a sensing line SNL. The first metal layer may further include the capacitor connecting electrode CCE and the clock connecting electrode CKCE. The first metal layer may be formed as a single film or a multifilm including one of molybdenum (Mo), aluminum (Al), chromium (Cr), gold (Au), titanium (Ti), nickel (Ni), neodymium (Nd), copper (Cu), and an alloy thereof.

A second barrier film BR2 may be located on the first metal layer. The second barrier film BR2 is a film for protecting the first transistor ST1 and the light-emitting element LE from moisture that may penetrate through a second substrate SUB2, which is susceptible to moisture. The second barrier film BR2 may include at least one inorganic film. In one example, the second barrier film BR2 may be formed as a multifilm in which inorganic films including at least one of $SiO_x$, $SiN_x$, and SiON are alternately stacked.

A semiconductor layer, which includes the first active layer ACT1, the first source electrode SE1, and the first drain electrode DE1 of the first transistor ST1 and the scan active layers GACT, the scan source electrodes GSE, and the scan drain electrodes GDE of the first scan transistor GT1, may be located on the second barrier film BR2. The semiconductor layer may further include the second active layer ACT2, the second source electrode SE2, and the second drain electrode DE2 of the second transistor ST2. The semiconductor layer may further include the third active layer ACT3, the third source electrode SE3, and the third drain electrode DE3 of the third transistor ST3. The first drain electrode DE1 may be connected to the second power supply line VDL through the first drain contact hole DDT1, which penetrates the second barrier film BR2.

The semiconductor layer may include polycrystalline silicon, monocrystalline silicon, low-temperature polycrystalline silicon, amorphous silicon, or an oxide semiconductor. The first source electrode SE1, the first drain electrode DE1, the scan source electrodes GSE, and the scan drain electrodes GDE may be obtained by doping a silicon semiconductor or an oxide semiconductor with ions or impurities and may thus have conductivity. The first active layer ACT1 may overlap with the first gate electrode GE1 in the third direction DR3, which is the thickness direction of the first or second substrate SUB1 or SUB2, and the first source electrode SE1 and the first drain electrode DE1 may not overlap with the first gate electrode GE1 in the third direction DR3. The scan active layers GACT may overlap with the scan gate electrodes GGE in the third direction DR3, and the scan source electrodes GSE and the scan drain electrodes GDE may not overlap with the scan gate electrodes GGE in the third direction DR3.

A gate insulating film 130 may be located on the semiconductor layer. The gate insulating film 130 may include an inorganic film of, for example, silicon oxide ($SiO_x$), silicon nitride ($SiN_x$), or silicon oxynitride (SiON).

A second metal layer, which includes the first gate electrode GE1 of the first transistor ST1, the first electrode CE1 of the capacitor CST, the scan gate electrodes GGE of the first scan transistor GT1, and the second scan capacitor electrode GACE2 of the first scan capacitor GC1, may be located on the gate insulating film 130. The second metal layer may further include the second gate electrode GE2 of the second transistor ST2, the third gate electrode GE3 of the third transistor ST3, and the gate connecting electrodes GCE. The second metal layer may be formed as a single film or a multifilm including one of Mo, Al, Cr, Au, Ti, Ni, Nd, Cu, and an alloy thereof.

An interlayer insulating film 140 may be located on the second metal layer. The interlayer insulating film 140 may include an inorganic film such as, for example, a film of $SiO_x$, $SiN_x$, or SiON.

A third metal layer, which includes the anode connecting electrode ANDE, the first sub-electrode CE21 of the second electrode CE2 of the capacitor CST, the source connecting electrode SCE, the data connecting electrode DCE, and the first scan capacitor electrode GCAE1 of the first scan capacitor GC1, may be located on the interlayer insulating film 140. The third metal layer may further include the first horizontal power supply line HVSL, the second horizontal power supply line HVDL, the first and second scan lines SL1 and SL2, the data connecting electrode DCE, and the connecting electrode BE1. The third metal layer may further include the scan clock connecting line CKCL and the output connecting line SOCL.

The anode connecting electrode ANDE may be connected to the first source electrode SE1 through the first source contact hole SST1, which penetrates the gate insulating film 130 and the interlayer insulating film 140. The third metal layer may be formed as a single film or a multifilm including one of Mo, Al, Cr, Au, Ti, Ni, Nd, Cu, and an alloy thereof.

A planarization film 160, which is for planarizing height differences formed by the first transistor ST1, may be located on the third metal layer. The planarization film 160 may be formed as an organic film including an acrylic resin, an epoxy resin, a phenolic resin, a polyamide resin, or a polyimide resin.

A first light-emitting unit PEU1 may be located on the planarization film 160. The first light-emitting unit PEU1 may include the pixel electrode 171, a common electrode 173, a first contact electrode 174, a second contact electrode 175, and the light-emitting element LE.

The pixel electrode 171, the common electrode 173, and first banks 191 may be located on the planarization film 160.

The first banks 191 may be located in an opening OA defined by a second bank 192. The light-emitting element LE may be located between a pair of adjacent first banks 191. Each of the first banks 191 may have a bottom surface that is in contact with the planarization film 160, a top surface that is opposite to the bottom surface, and side surfaces that are between the top surface and the bottom surface. The first banks 191 may have a trapezoidal shape in a cross-sectional view, but the present disclosure is not limited thereto.

The first banks 191 may be formed as organic films including a photosensitive resin, an acrylic resin, an epoxy resin, a phenolic resin, a polyamide resin, or a polyimide resin. In one example, the first banks 191 may be formed of a photosensitive resin such as positive photoresist or negative photoresist.

The pixel electrode 171 and the common electrode 173 may be located on the planarization film 160 and the first banks 191. The pixel electrode 171 and the common electrode 173 may be located to be spaced from each other and may be electrically isolated from each other.

The pixel electrode 171 may be located on at least one side surface and the top surface of one of the first banks 191. The pixel electrode 171 may be connected to the connecting electrode ANDE through an anode contact hole ANCT, which penetrates the planarization film 160. The common electrode 173 may be located on at least one side surface and the top surface of one of the first banks 191.

The pixel electrode 171 and the common electrode 173 may include a conductive material with high reflectance. In one example, the pixel electrode 171 and the common electrode 173 may include a metal such as silver (Ag), Cu, or Al. Accordingly, light traveling toward the pixel electrode 171 or the common electrode 173, among beams of light emitted from the light-emitting element LE may be reflected by the pixel electrode 171 or the common electrode 173 and may thus travel to the top of the light-emitting element LE.

A first insulating film 181 may be located on the pixel electrode 171 and the common electrode 173. The first insulating film 181 may be located on parts of the planarization film 160 that are not covered, but exposed by the pixel electrode 171 and the common electrode 173. The first insulating film 181 may include an inorganic film such as, for example, a film of $SiO_x$, $SiN_x$, or SiON.

The second bank 192 may be located on the first insulating film 181. The second bank 192 may define the opening OA. The second bank 192 may not overlap with the first banks 191. The second bank 192 may have a bottom surface that is in contact with the first insulating film 181, a top surface that is opposite to the bottom surface, and side surfaces that are between the top surface and the bottom surface. The second bank 192 may have a trapezoidal shape in a plan view, but the present disclosure is not limited thereto.

The second bank 192 may be formed as an organic film including a photosensitive resin, an acrylic resin, an epoxy resin, a phenolic resin, a polyamide resin, or a polyimide resin. In one example, in a case where the first banks 191 are formed of a photosensitive resin, the second bank 192 may be formed of positive photoresist or negative photoresist.

The light-emitting element LE may be located on the first insulating film 181. The light-emitting element LE may be an inorganic semiconductor element. The light-emitting element LE may have a rod, wire, or tube shape. In one example, the light-emitting element LE may be formed as a cylinder or a rod. In another example, the light-emitting element LE may have a polyhedral shape such as the shape of a regular cube or a rectangular parallelepiped or a polygonal column shape such as the shape of a hexagonal column. In yet another example, the light-emitting element LE may have a truncated cone shape that extends in one direction and has a partially inclined outer surface. The light-emitting element LE may have a length of 1 μm to 10 μm or 2 μm to 6 μm, preferably, 3 μm to 5 μm. The light-emitting element LE may have a diameter of 300 nm to 700 nm and may have an aspect ratio of 1.2 to 100.

A second insulating film 182 may be located on the light-emitting element LE. The second insulating film 182 may also be located on the second bank 192. The second insulating film 182 may include an inorganic film such as, for example, a film of $SiO_x$, $SiN_x$, or SiON.

The first contact electrode 174 may be connected to the pixel electrode 171 through a first contact hole CCT1, which penetrates the first insulating film 181. The first contact hole CCT1 may overlap with one of the first banks 191 in the third direction DR3. The first contact electrode 174 may be in contact with a first end of the light-emitting element LE. Accordingly, the first end of the light-emitting element LE may be electrically connected to the pixel electrode 171 via the first contact electrode 174. The first contact electrode 174 may be located on the second insulating film 182.

A third insulating film 183 may be located on the second contact electrode 175. The third insulating film 183 may be located to cover the second contact electrode 175 to electrically isolate the first and second contact electrodes 174 and 175. The third insulating film 183 may also cover parts of the second insulating film 182 on the second bank 192. The third insulating film 183 may include an inorganic film such as, for example, a film of $SiO_x$, $SiN_x$, or SiON.

The second contact electrode 175 may be connected to the common electrode 173 through a second contact hole CCT2, which penetrates the first insulating film 181. The second contact hole CCT2 may overlap with one of the first banks 191 in the third direction DR3. The second contact hole CCT2 may be in contact with a second end of the light-emitting element LE. Accordingly, the second end of the light-emitting element LE may be electrically connected to the common electrode 173 via the second contact electrode 175. The second contact electrode 175 may be located on the second insulating film 182.

The first and second contact electrodes 174 and 175 may be formed of a transparent conductive oxide (TCO) capable of transmitting light therethrough, such as, for example, indium tin oxide (ITO) or indium zinc oxide (IZO). Light emitted from the light-emitting element LE may be prevented from being blocked by the first and second contact electrodes 174 and 175.

The first end of the light-emitting element LE may be electrically connected to the drain electrode of a thin-film transistor via the first contact electrode 174 and the pixel electrode 171, and the second end of the light-emitting element LE may be electrically connected to a first power supply line VSL via the second contact electrode 175 and the common electrode 173. Thus, the light-emitting element LE may emit light in accordance with a current that flows from the first end to the second end thereof.

A first wavelength conversion layer QDL1 may be located in the first subpixel SPX1, a second wavelength conversion layer may be located in the second subpixel SPX2, and a transparent insulating film may be located in the third subpixel SPX3. Light-emitting elements LE of each of the first, second, and third subpixels SPX1, SPX2, and SPX3 may emit third-color light. The third-color light may be short-wavelength light having a central wavelength of 370 nm to 490 nm, such as, for example, blue light or ultraviolet (UV) light.

The first wavelength conversion layer QDL1 may convert third-color light emitted from the light-emitting elements LE of the first subpixel SPX1 into first-color light. The first-color light may be red light having a central wavelength of 600 nm to 750 nm.

The second wavelength conversion layer may convert third-color light emitted from the light-emitting elements LE of the second subpixel PX2 into second-color light. The second-color light may be green light having a central wavelength of 480 nm to 560 nm.

Each of the first wavelength conversion layer QDL1 and the second wavelength conversion layer may include a base resin, a wavelength shifter, and a scatterer.

The base resin may include a material having a high light transmittance and an suitable dispersion property for the wavelength shifter and the scatterer. In one example, the base resin may include an organic material such as an epoxy resin, an acrylic resin, a cardo resin, or an imide resin.

The wavelength shifter may convert or shift the wavelength of incident light. The wavelength shifter may be quantum dots, quantum rods, or a phosphor. The quantum-dot size of the first wavelength conversion layer QDL1 may be different from the quantum-dot size of the second wavelength conversion layer.

The scatterer may scatter incident light in random directions substantially without changing the wavelength of light passing through the first wavelength conversion layer QDL1 or the second wavelength conversion layer. Accordingly, the path of light passing through the first wavelength conversion layer QDL1 or the second wavelength conversion layer can be lengthened, and as a result, the color conversion efficiency of the wavelength shifter can be improved. The scatterer may be light-scattering particles. In one example, the scatterer may be particles of a metal oxide such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). Alternatively, the scatterer may be particles of an organic material such as an acrylic resin or a urethane resin.

The transparent insulating film may transmit short-wavelength light such as blue light or UV light therethrough. The transparent insulating film may be formed as an organic film having high transmittance. In one example, the transparent insulating film may be formed as an organic film including a photosensitive resin, an acrylic resin, an epoxy resin, a phenolic resin, a polyamide resin, or a polyimide resin.

The first wavelength conversion layer QDL1 may be located on the first contact electrode 174 and the third insulating film 183 of the first subpixel SPX1. The arrangement of the second wavelength conversion layer may be substantially the same as the arrangement of the first wavelength conversion layer QDL1 in the first subpixel SPX1, and thus, a detailed description thereof will be omitted.

A low refractive index film LRL may be located on the first wavelength conversion layer QDL1, the second wavelength conversion layer, and the transparent insulating film. The low refractive index film LRL may have a lower refractive index than the base resin of the first wavelength conversion layer QDL1, the base resin of the second wavelength conversion layer, and the transparent insulating film. The low-refractive index film LRL may be formed as an organic film including a photosensitive resin, an acrylic resin, an epoxy resin, a phenolic resin, a polyamide resin, or a polyimide resin.

The low refractive index film LRL is between a first capping layer CPL1 and a second capping layer CPL2. The refractive index difference between the low refractive index film LRL and the first capping layer CPL1 and the refractive index difference between the low refractive index film LRL and the second capping layer CPL2 may be less than 0.1. The first capping layer CPL1 and the second capping layer CPL2 may be formed of an inorganic film including at least one of $SiO_x$, $SiN_x$, and SiON.

A first color filter CF1, a second color filter, a third color filter, and a black matrix BM may be located on the low-refractive index film LRL.

The first color filter CF1 may overlap with the first wavelength conversion layer QDL1 in the third direction DR3. The first color filter CF1 may transmit first-color light, for example, red-wavelength light, therethrough. Thus, short-wavelength light that is emitted from the light-emitting elements LE of the first subpixel SPX1 and fails to be converted into first-color light may not be able to pass through the first color filter CF1. On the contrary, first-color light obtained by the first wavelength conversion layer QDL1 from the short-wavelength light emitted from the light-emitting elements LE of the first subpixel PX1 may be able to pass through the first color filter CF1.

The second color filter may overlap with the second wavelength conversion layer in the third direction (DR3). The second color filter may transmit second-color light, for example, green-wavelength light, therethrough. Thus, short-wavelength light that is emitted from the light-emitting elements LE of the second subpixel SPX2 and fails to be converted into second-color light may not be able to pass through the second color filter. On the contrary, second-color light obtained by the second wavelength conversion layer from the short-wavelength light emitted from the light-emitting elements LE of the second subpixel PX2 may be able to pass through the second color filter.

The third color filter may overlap with the transparent insulating film in the third direction DR3. The third color filter may transmit third-color light, for example, blue-wavelength light, therethrough. Thus, short-wavelength light emitted from the light-emitting elements LE of the third subpixel SPX3 may be able to pass through the third color filter.

The black matrix BM may be located between the first color filter CF1 and the second color filter, between the first color filter CF1 and the third color filter, and between the second color filter and the third color filter. The black matrix BM may cover the edges of the first color filter CF1, the edges of the second color filter, and the edges of the third color filter. The black matrix BM may include a light-blocking material capable of blocking the transmission of light. In this case, the black matrix BM may include an organic black pigment or an inorganic black pigment such as carbon black.

An anti-reflection layer ARL may be located on the first color filter CF1, the second color filter, the third color filter, and the black matrix BM. The anti-reflection layer ARL may include a first inorganic film, a second inorganic film, and an organic film. The second inorganic film may be located on the first inorganic film, and the first and second inorganic films may include different materials. In one example, the first inorganic film may include SiON, and the second inorganic film may include $SiO_x$. In this example, light reflected from the interface between the first inorganic film and the organic film and light reflected from the interface between the organic film and the second inorganic film can offset each other. Thus, any decrease in the visibility of an image that may be caused by the reflection of external light can be reduced by the anti-reflection layer ARL. The anti-reflection layer ARL may not be provided. The anti-reflection layer ARL may be replaced by a polarizing film, in which case, the polarizing film may be located on an overcoat layer OCL.

The overcoat layer OCL may be located on the anti-reflection layer ARL and may be a planarization layer. The overcoat layer OCL may be formed as an organic film including an acrylic resin, an epoxy resin, a phenolic resin, a polyamide resin, or a polyimide resin.

As illustrated in FIGS. 16-18, as the first scan transistor GT1 and the first scan capacitor GC1 are formed in the same layer as, and formed of the same material as, the first transistor TR1 and the capacitor CST of the first subpixel SPX1, the first scan transistor GT1 and the first scan capacitor GC1 can be formed without a requirement of an additional process.

Figure 19:
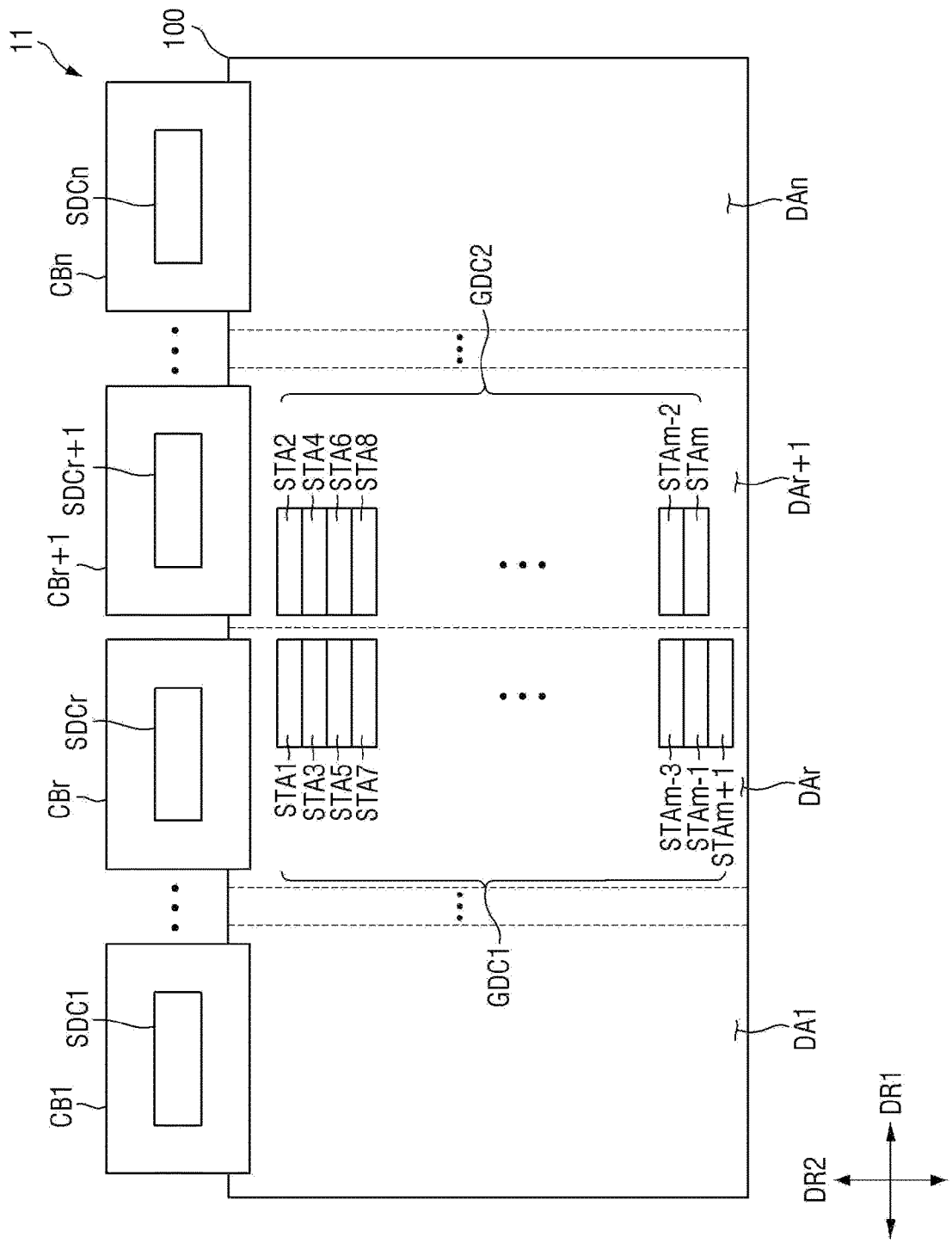
FIG. 19 is a layout view of a first display device according to some embodiments of the present disclosure.

FIG. 19 is a layout view of a first display device according to some embodiments of the present disclosure.

The embodiments of FIG. 19 differs from the embodiments of FIG. 5 in that first and second scan driving circuits GDC1 and GDC2 are located in r-th and (r+1)-th display area DAr and DAr+1 (where r is a positive integer of 2 or greater), respectively. The embodiments of FIG. 19 will hereinafter be described, focusing mainly on the differences with the embodiments of FIG. 5.

Referring to FIG. 19, a scan driving circuit GDC may include the first scan driving circuit GDC1, which is located in the r-th display area DAr, and the second scan driving circuit GDC2, which is located in the (r+1)-th display area DAr+1. The r-th display area DAr and the (r+1)-th display area DAr+1 may be display areas in the middle of a display panel 100.

The first scan driving circuit GDC1 may receive a first scan control signal from an r-th source driving circuit SDCr. The first scan control signal may include a first clock signal and a first clock bar signal. In one example, in a case where the first clock signal has a first-level voltage, the first clock bar signal may have a second-level voltage, and in a case where the first clock signal has the second-level voltage, the first clock bar signal may have the first-level voltage.

The first scan driving circuit GDC1 may be located in part of the r-th display area DAr. In one example, the first scan driving circuit GDC1 may be located along one edge of the r-th display area DAr, for example, along the right edge of the r-th display area DAr, but the present disclosure is not limited thereto. The first scan driving circuit GDC1 may be located along the left edge of the r-th display area DAr or in the middle of the r-th display area DAr.

The second scan driving circuit GDC2 may receive a second scan control signal from an (r+1)-th source driving circuit SDCr+1. The second scan control signal may include a second clock signal and a second clock bar signal. In one example, in a case where the second clock signal has the first-level voltage, the second clock bar signal may have the second-level voltage, and in a case where the second clock signal has the second-level voltage, the second clock bar signal may have the first-level voltage.

The second scan driving circuit GDC2 may be located in part of the (r+1)-th display area DAr+1. In one example, the second scan driving circuit GDC2 may be located along one edge of the (r+1)-th display area DAr+1, for example, along the left edge of the (r+1)-th display area DAr+1, but the present disclosure is not limited thereto. The second scan driving circuit GDC2 may be located along the right edge of the (r+1)-th display area DAr+1 or in the middle of the (r+1)-th display area DAr+1.

A plurality of odd-numbered stages (STA1, STA3, ..., STAm−3, STAm−1, and STAm+1) of the first scan driving circuit GDC1 and a plurality of even-numbered stages (STA2, STA4, ..., STAm−2, and STAm) of the second scan driving circuit GDC2 may be substantially the same as their respective counterparts of FIG. 6A or 6B, and thus, detailed descriptions thereof will be omitted.

As illustrated in FIG. 19, in a case where the first and second scan driving circuits GDC1 and GDC2 are located in the r-th and (r+1)-th display areas DAr and DAr+1, respectively, scan lines connected to the first scan driving circuit GDC1 may extend from the r-th display area DAr to a first display area DA1 and from the r-th display area DAr to an n-th display area DAn, and scan lines connected to the second scan driving circuit GDC2 may extend from the (r+1)-th display area DAr+1 to the first display area DA1 and from the (r+1)-th display area DAr+1 to the n-th display area DAn. In this case, the differences between the distance from the left ends of the scan lines to the first scan driving circuit GDC1, the distance from the first scan driving circuit GDC1 to the right ends of the scan lines, the distance from the second scan driving circuit GDC2 to the left ends of the scan lines, and the distance from the second scan driving circuit GDC2 to the right ends of the scan lines may be reduced or minimized. Thus, the differences in RC delays in scan signals between the first and second scan driving circuits GDC1 and GDC2 may be reduced or minimized.

Figure 20:
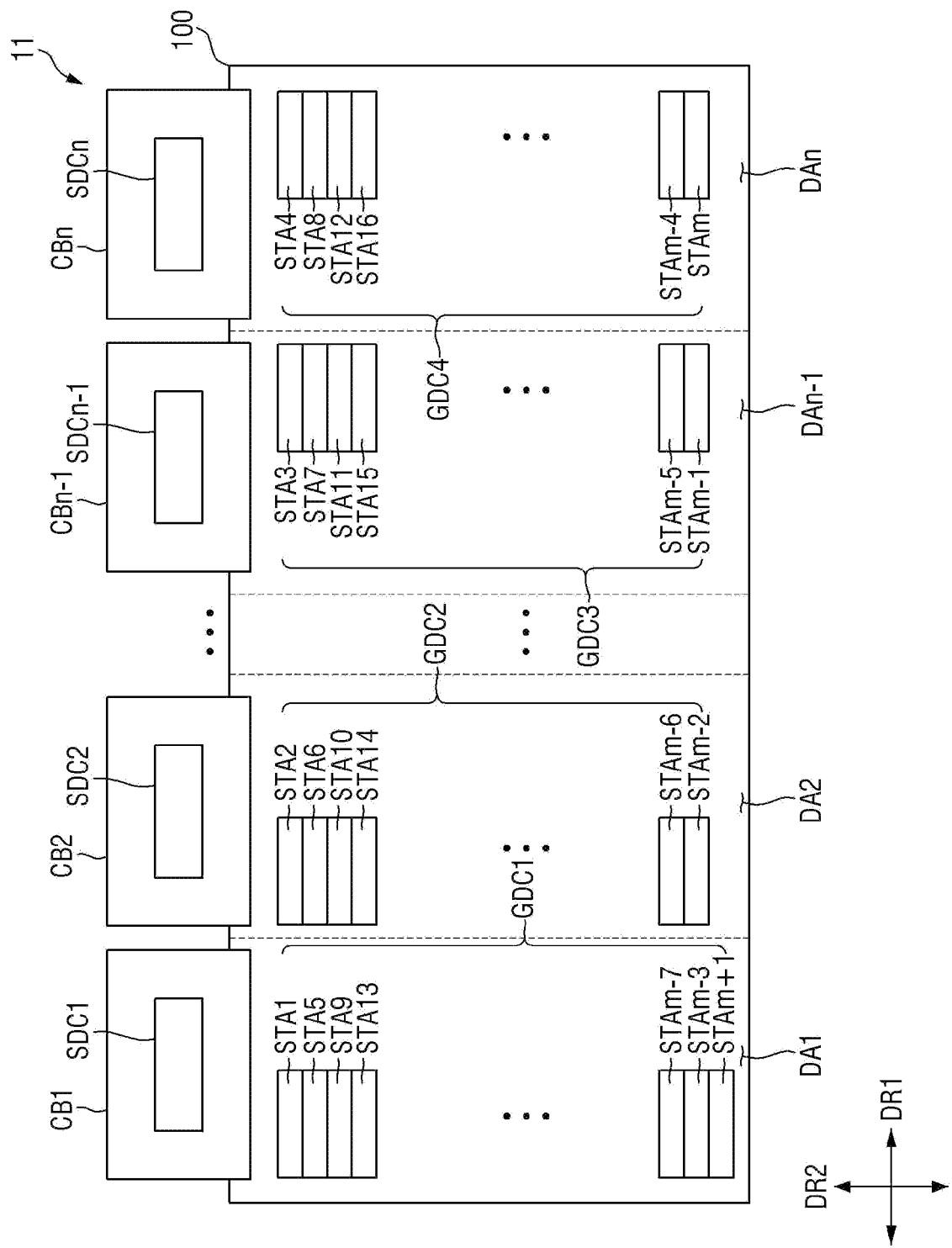
FIG. 20 is a layout view of a first display device according to some embodiments of the present disclosure.

FIG. 20 is a layout view of a first display device according to other embodiments of the present disclosure.

The embodiments of FIG. 20 differs from the embodiments of FIG. 5 in that a scan driving circuit GDC includes four scan driving circuits, e.g., first, second, third, and fourth scan driving circuits GDC1, GDC2, GDC3, and GDC4.

Referring to FIG. 20, the scan driving circuit GDC may include the first scan driving circuit GDC1, which is located in a first display area DA1, the second scan driving circuit GDC2, which is located in a second display area DA2, the third scan driving circuit GDC3, which is located in an (n−1)-th display area DAn−1, and the fourth scan driving circuit GDC4, which is located in an n-th display area DAn. The first and second display areas DA1 and DA2 may be located in one part (e.g., the left part) of a display panel 100, and the (n−1)-th and n-th display areas Dan−1 and DAn may be located in the other part (e.g., the right part) of the display panel 100. The first display area DA1 may be located closer than the second display area DA2 to one side of the display panel 100, and the n-th display area DAn may be located closer than the (n−1)-th display area DAn−1 to the other side of the display panel 100.

The first scan driving circuit GDC1 may include a plurality of (4s-3)-th stages (where s is a positive integer) (STA1, STA5, STA9, STA13, ..., STAm−7, STAm−3, and STAm+1). The (4s-3)-th stages (STA1, STA5, STA9, STA13, STAm−7, STAm−3, and STAm+1) may be defined as a first group of stages. The (4s-3)-th stages (STA1, STA5, STA9, STA13, ..., STAm−7, STAm−3, and STAm+1) may extend in a first direction DR1 and may be arranged along a second direction DR2. The (4s-3)-th stages (STA1, STA5, STA9, STA13, ..., STAm−7, STAm−3, and STAm+1) may generate scan signals in accordance with a first scan control signal from a first source driving circuit SDC1. The (4s-3)-th stages (STA1, STA5, STA9, STA13, ..., STAm−7, STAm−3, and STAm+1) may be connected to (4s-3)-th scan lines and may sequentially output scan signals.

The second scan driving circuit GDC2 may be located in part of the second display area DA2. In one example, the second scan driving circuit GDC2 may be located along one edge of the second display area DA2, for example, along the left edge of the second display area DA2, as illustrated in FIG. 20, but the present disclosure is not limited thereto. In another example, the second scan driving circuit GDC2 may be located along the right edge of the second display area DA2 or in the middle of the second display area DA2.

The second scan driving circuit GDC2 may include a plurality of (4s-2)-th stages (STA2, STA6, STA10, STA14, ..., STAm−6, and STAm−2). The (4s-2)-th stages (STA2, STA6, STA10, STA14, ..., STAm−6, and STAm−2) may be defined as a second group of stages. The (4s-2)-th stages (STA2, STA6, STA10, STA14, ..., STAm−6, and STAm−2) may extend in the first direction DR1 and may be arranged along the second direction DR2. The (4s-2)-th stages (STA2, STA6, STA10, STA14, ..., STAm−6, and STAm−2) may generate scan signals in accordance with a second scan control signal from a second source driving circuit SDC2. The (4s-2)-th stages (STA2, STA6, STA10, STA14, ..., STAm−6, and STAm−2) may be connected to (4s-2)-th scan lines and may sequentially output scan signals.

The third scan driving circuit GDC3 may receive a third scan control signal from an (n−1)-th source driving circuit SDCn−1. The third scan control signal may include a third clock signal and a third clock bar signal. For example, in a case where the third clock signal has a first-level voltage, the third clock bar signal may have a second-level voltage, and in a case where the third clock signal has the second-level voltage, the third clock bar signal may have the first-level voltage.

The third scan driving circuit GDC3 may be located in part of the (n−1)-th display area DAn−1. In one example, the third scan driving circuit GDC3 may be located along one edge of the (n−1)-th display area DAn−1, for example, along the right edge of the (n−1)-th display area DAn−1, as illustrated in FIG. 20, but the present disclosure is not limited thereto. In another example, the third scan driving circuit GDC3 may be located along the left edge of the (n−1)-th display area DAn−1 or in the middle of the (n−1)-th display area DAn−1.

The third scan driving circuit GDC3 may include a plurality of (4s-1)-th stages (STA3, STA7, STA11, STA15, ..., STAm−5, and STAm−1). The (4s-1)-th stages (STA3, STA7, STA11, STA15, ..., STAm−5, and STAm−1) may be defined as a third group of stages. The (4s-1)-th stages (STA3, STA7, STA11, STA15, ..., STAm−5, and STAm−1) may extend in the first direction DR1 and may be arranged along the second direction DR2. The (4s-1)-th stages (STA3, STA7, STA11, STA15, ..., STAm−5, and STAm−1) may generate scan signals in accordance with the third scan control signal from the (n−1)-th source driving circuit SDCn−1. The (4s-1)-th stages (STA3, STA7, STA11, STA15, ..., STAm−5, and STAm−1) may be connected to (4s-1)-th scan lines and may sequentially output scan signals.

The fourth scan driving circuit GDC4 may receive a fourth scan control signal from an n-th source driving circuit SDCn. The fourth scan control signal may include a fourth clock signal and a fourth clock bar signal. For example, in a case where the fourth clock signal has the first-level voltage, the fourth clock bar signal may have the second-level voltage, and in a case where the fourth clock signal has the second-level voltage, the fourth clock bar signal may have the first-level voltage.

The first, second, third, and fourth clock signals may be clock signals whose phases are sequentially delayed. The first, second, third, and fourth clock bar signals may be clock signals whose phases are sequentially delayed.

The fourth scan driving circuit GDC4 may be located in part of the n-th display area DAn. In one example, the fourth scan driving circuit GDC4 may be located along one edge of the n-th display area DAn, for example, along the right edge of the n-th display area DAn, as illustrated in FIG. 20, but the present disclosure is not limited thereto. In another example, the fourth scan driving circuit GDC4 may be located along the left edge of the n-th display area DAn or in the middle of the n-th display area DAn.

The fourth scan driving circuit GDC4 may include a plurality of 4s-th stages (STA4, STA8, STA12, STA16, ..., STAm−4, and STAm). The 4s-th stages (STA4, STA8, STA12, STA16, ..., STAm−4, and STAm) may be defined as a fourth group of stages. The 4s-th stages (STA4, STA8, STA12, STA16, ..., STAm−4, and STAm) may extend in the first direction DR1 and may be arranged along the second direction DR2. The 4s-th stages (STA4, STA8, STA12, STA16, ..., STAm−4, and STAm) may generate scan signals in accordance with the fourth scan control signal from the n-th source driving circuit SDCn−1. The 4s-th stages (STA4, STA8, STA12, STA16, ..., STAm−4, and STAm) may be connected to 4s-th scan lines and may sequentially output scan signals.

The (4s-3)-th stages (STA1, STA5, STA9, STA13, ..., STAm−7, STAm−3, and STAm+1) of the first scan driving circuit GDC1, the (4s-2)-th stages (STA2, STA6, STA10, STA14, ..., STAm−6, and STAm−2) of the second scan driving circuit GDC2, the (4s-1)-th stages (STA3, STA7, STA11, STA15, ..., STAm−5, and STAm−1) of the third scan driving circuit GDC3, and the 4s-th stages (STA4, STA8, STA12, STA16, ..., STAm−4, and STAm) of the fourth scan driving circuit GDC4 are substantially the same as their respective counterparts of FIG. 6A or 6B, and thus, detailed descriptions thereof will be omitted.

As illustrated in FIG. 20, in a case where the first and second scan driving circuits GDC1 and GDC2 are located in the first and second display areas DA1 and DA2, respectively, and the third and fourth scan driving circuits GDC3 and GDC4 are located in the (n−1)-th and n-th display areas DAn−1 and DAn, respectively, scan lines connected to the first scan driving circuit GDC1 may extend from the first display area DA1 to the n-th display area DAn, scan lines connected to the second scan driving circuit GDC2 may extend from the second display area DA2 to the first display area DA1 and from the second display area DA2 to the n-th display area DAn, scan lines connected to the third scan driving circuit GDC3 may extend from the (n−1)-th display area DAn−1 to the first display area DA1 and from the (n−1)-th display area DAn−1 to the n-th display area DAn, and scan lines connected to the fourth scan driving circuit GDC4 may extend from the n-th display area DAn to the first display area DA1. In this case, the differences between the distance from the first scan driving circuit GDC1 to the right ends of the scan lines, the distance from the second scan driving circuit GDC2 to the right ends of the scan lines, the distance from the third scan driving circuit GDC3 to the left ends of the scan lines, and the distance from the fourth scan driving circuit GDC4 to the left ends of the scan lines may be reduced or minimized. Thus, the differences in RC delays in scan signals between the first, second, third, and fourth scan driving circuits GDC1, GDC2, GDC3, and GDC4 may be reduced or minimized.

Figure 21A:
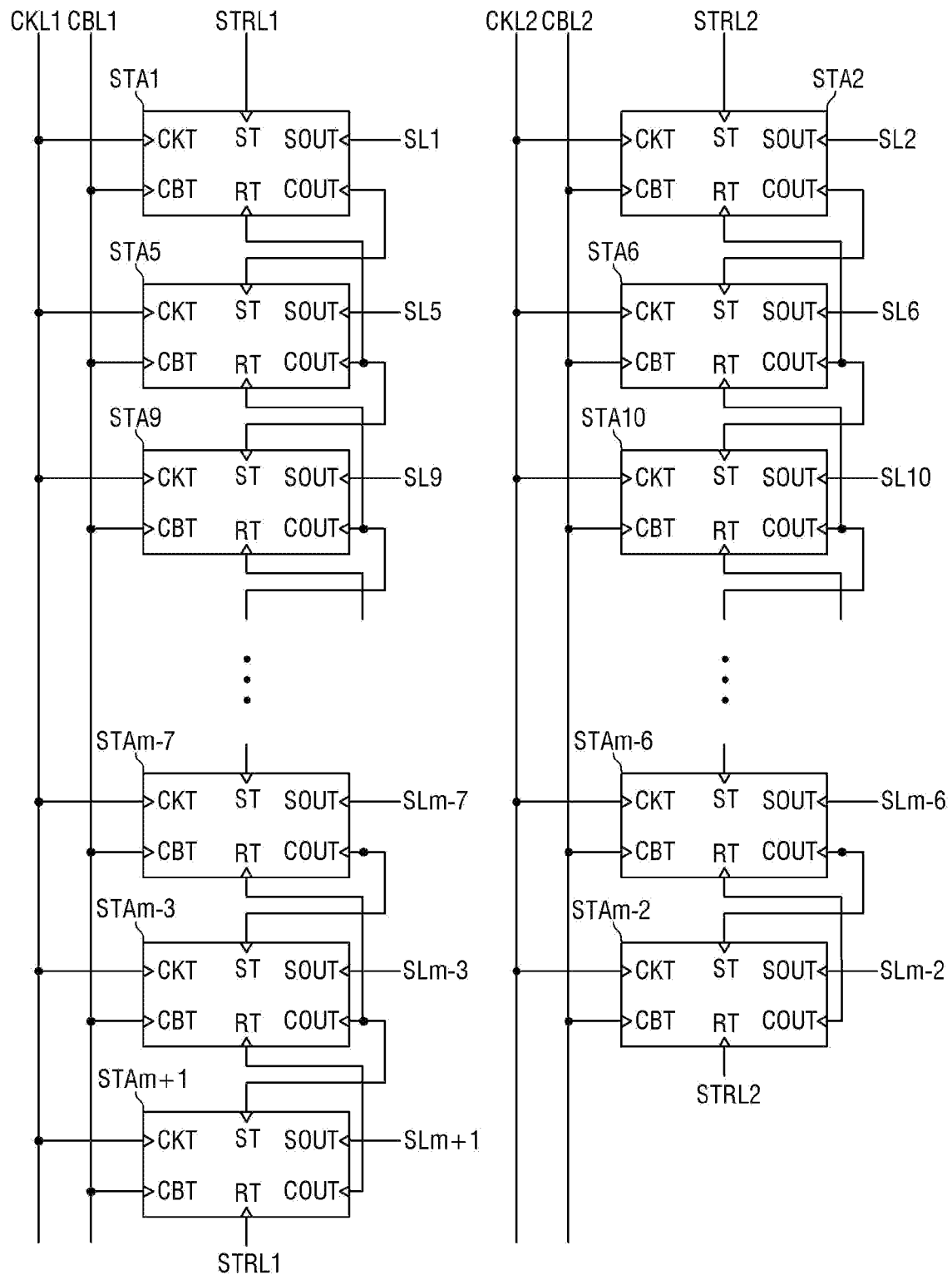
FIGS. 21A and 21B are circuit diagrams illustrating first through (m+1)-th stages of FIG. 20.
Figure 21B:
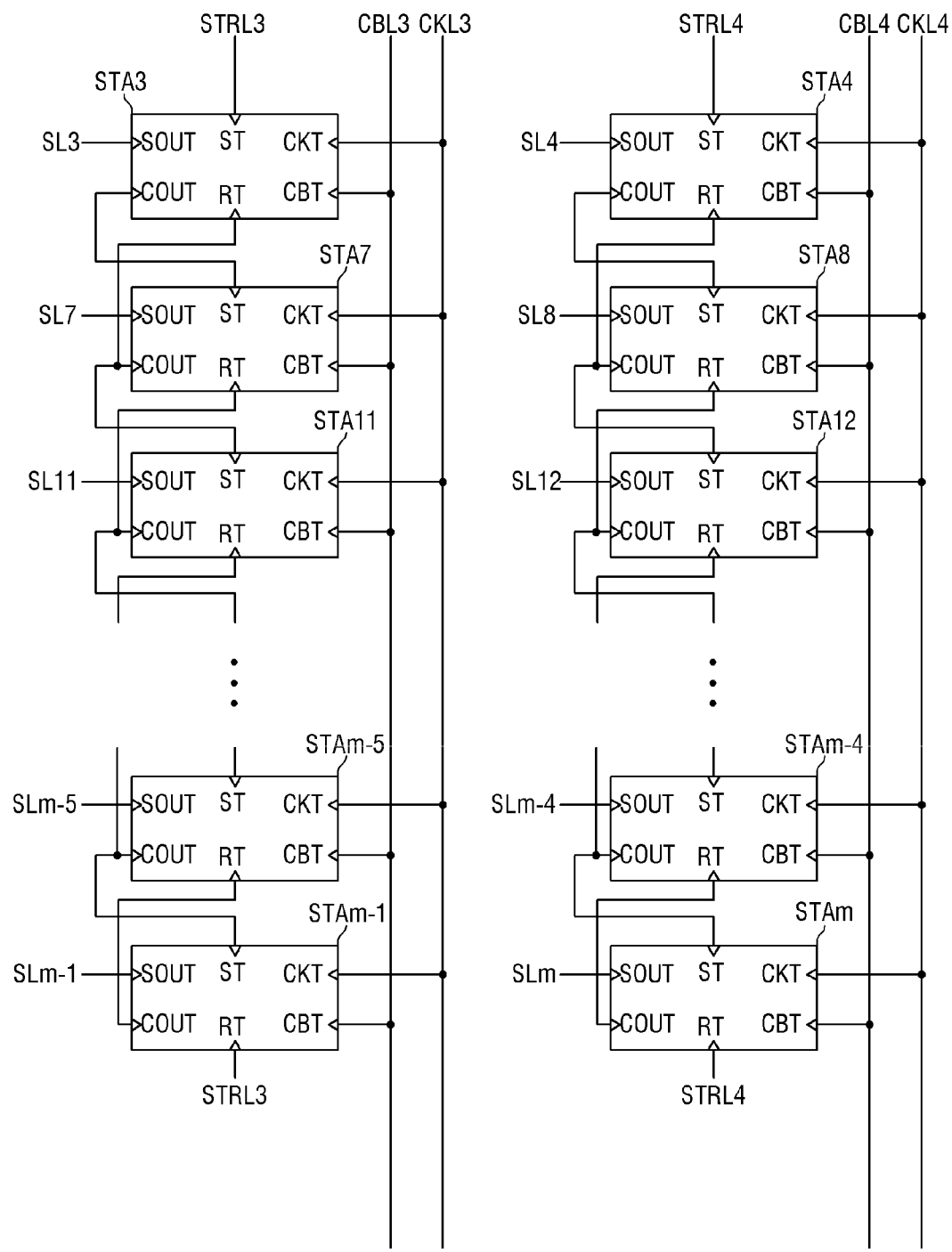

FIGS. 21A and 21B are circuit diagrams illustrating first through (m+1)-th stages of FIG. 20.

The embodiments of FIGS. 21A and 21B differs from the embodiments of FIG. 7 in that first through (m+1)-th stages are classified into (4s-3)-th stages (STA1, STA5, STA9, STA13, ..., STAm-7, STAm-3, and STAm+1) of a first scan driving circuit GDC1, (4s-2)-th stages (STA2, STA6, STA10, STA14, ..., STAm-6, and STAm-2) of a second scan driving circuit GDC2, (4s-1)-th stages (STA3, STA7, STA11, STA15, ..., STAm-5, and STAm-1) of a third scan driving circuit GDC3, and 4s-th stages (STA4, STA8, STA12, STA16, ..., STAm-4, and STAm) of a fourth scan driving circuit GDC4. The embodiments of FIGS. 21A and 21B will hereinafter be described, focusing mainly on the differences with the embodiments of FIG. 7.

Referring to FIGS. 21A and 21B, the (4s-3)-th stages (STA1, STA5, STA9, STA13, ..., STAm-7, STAm-3, and STAm+1), the (4s-2)-th stages (STA2, STA6, STA10, STA14, ..., STAm-6, and STAm-2), the (4s-1)-th stages (STA3, STA7, STA11, STA15, ..., STAm-5, and STAm-1), and the 4s-th stages (STA4, STA8, STA12, STA16, ..., STAm-4, and STAm) may each include a start signal input terminal ST, a reset signal input terminal RT, a clock signal input terminal CKT, a clock bar signal input terminal CBT, a scan signal output terminal SOUT, and a carry signal output terminal COUT.

The start signal input terminal ST may be connected to a first start line STRL1, a second start line STRL2, a third start line STRL3, a fourth start line STRL4, or a carry signal output terminal COUT of a previous stage. In one example, the start signal input terminal ST of a first stage STA1 may be connected to the first start line STRL1, and the start signal input terminals ST of all the (4s-3)-th stages (STA1, STA5, STA9, STA13, ..., STAm-7, STAm-3, and STAm+1) except for the first stage STA1 may be connected to the carry signal output terminals COUT of their respective previous stages. In one example, the start signal input terminal ST of a second stage STA2 may be connected to the second start line STRL2, and the start signal input terminals ST of all the (4s-2)-th stages (STA2, STA6, STA10, STA14, ..., STAm-6, and STAm-2) except for the second stage STA2 may be connected to the carry signal output terminals COUT of their respective previous stages. In one example, the start signal input terminal ST of a third stage STA3 may be connected to the third start line STRL3, and the start signal input terminals ST of all the (4s-1)-th stages (STA3, STA7, STA11, STA15, ..., STAm-5, and STAm-1) except for the third stage STA3 may be connected to the carry signal output terminals COUT of their respective previous stages. In one example, the start signal input terminal ST of a fourth stage STA4 may be connected to the fourth start line STRL4, and the start signal input terminals ST of all the 4s-th stages (STA4, STA8, STA12, STA16, ..., STAm-4, and STAm) except for the fourth stage STA4 may be connected to the carry signal output terminals COUT of their respective previous stages.

The reset signal input terminal RT of an (m+1)-th stage STAm+1 may be connected to the first start line STRL1 or a carry signal output terminal COUT of a dummy stage. The reset signal input terminals RT of all the (4s-3)-th stages (STA1, STA5, STA9, STA13, ..., STAm-7, and STAm-3) may be connected to the carry signal output terminals COUT of their respective subsequent stages.

The reset signal input terminal RT of an (m-2)-th stage STAm-2 may be connected to the second start line STRL2 or the carry signal output terminal COUT of the dummy stage. The reset signal input terminals RT of all the (4s-2)-th stages (STA2, STA6, STA10, STA14, ..., and STAm-6) may be connected to the carry signal output terminals COUT of their respective subsequent stages.

The reset signal input terminal RT of an (m-1)-th stage STAm-1 may be connected to the third start line STRL3 or the carry signal output terminal COUT of the dummy stage. The reset signal input terminals RT of all the (4s-1)-th stages (STA3, STA7, STA11, STA15, ..., and STAm-5) may be connected to the carry signal output terminals COUT of their respective subsequent stages.

The reset signal input terminal RT of an m-th stage STAm may be connected to the fourth start line STRL4 or the carry signal output terminal COUT of the dummy stage. The reset signal input terminals RT of all the 4s-th stages (STA4, STA8, STA12, STA16, ..., and STAm-4) may be connected to the carry signal output terminals COUT of their respective subsequent stages.

The (4s-3)-th stages (STA1, STA5, STA9, STA13, ..., STAm-7, STAm-3, and STAm+1) may be connected in common to a first clock line CKL1 and a first clock bar line CBL1. That is, the clock signal input terminals CKT of the (4s-3)-th stages (STA1, STA5, STA9, STA13, ..., STAm-7, STAm-3, and STAm+1) may be connected to the first clock line CKL1, and the clock bar signal input terminals CBT of the (4s-3)-th stages (STA1, STA5, STA9, STA13, ..., STAm-7, STAm-3, and STAm+1) may be connected to the first clock bar line CBL1.

The (4s-2)-th stages (STA2, STA6, STA10, STA14, ..., STAm-6, and STAm-2) may be connected in common to a second clock line CKL2 and a second clock bar line CBL2. That is, the clock signal input terminals CKT of the (4s-2)-th stages (STA2, STA6, STA10, STA14, ..., STAm-6, and STAm-2) may be connected to the second clock line CKL2, and the clock bar signal input terminals CBT of the (4s-2)-th stages (STA2, STA6, STA10, STA14, ..., STAm-6, and STAm-2) may be connected to the second clock bar line CBL2.

The (4s-1)-th stages (STA3, STA7, STA11, STA15, ..., STAm-5, and STAm-1) may be connected in common to a third clock line CKL3 and a third clock bar line CBL3. That is, the clock signal input terminals CKT of the (4s-1)-th stages (STA3, STA7, STA11, STA15, ..., STAm-5, and STAm-1) may be connected to the third clock line CKL3, and the clock bar signal input terminals CBT of the (4s-1)-th stages (STA3, STA7, STA11, STA15, ..., STAm-5, and STAm-1) may be connected to the third clock bar line CBL3.

The 4s-th stages (STA4, STA8, STA12, STA16, ..., STAm-4, and STAm) may be connected in common to a fourth clock line CKL4 and a fourth clock bar line CBL4. That is, the clock signal input terminals CKT of the 4s-th stages (STA4, STA8, STA12, STA16, ..., STAm-4, and STAm) may be connected to the fourth clock line CKL4, and the clock bar signal input terminals CBT of the 4s-th stages (STA4, STA8, STA12, STA16, ..., STAm-4, and STAm) may be connected to the fourth clock bar line CBL4.

The (4s-3)-th stages (STA1, STA5, STA9, STA13, ..., STAm-7, STAm-3, and STAm+1) may be connected to (4s-3)-th scan lines (SL1, SL5, SL9, SL13, ..., SLm-7, SLm−3, and SLm+1). The (4s−2)-th stages (STA2, STA6, STA10, STA14, . . . , STAm−6, and STAm−2) may be connected to (4s−2)-th scan lines (SL2, SL6, SL10, SL14, . . . , SLm−6, and SLm−2). The (4s−1)-th stages (STA3, STA7, STA11, STA15, . . . , STAm−5, and STAm−1) may be connected to (4s−1)-th scan lines (SL3, SL7, SL11, SL15, . . . , SLm−5, and SLm−1). The 4s-th stages (STA4, STA8, STA12, STA16, . . . , STAm−4, and STAm) may be connected to 4s-th scan lines (SL4, SL8, SL12, SL16, . . . , SLm−4, and SLm).

The (4s−3)-th scan lines (SL1, SL5, SL9, . . . , SLm−7, SLm−3, and SLm+1) may be defined as a first group of scan lines, and the (4s−2)-th scan lines (SL2, SL6, SL10, . . . , SLm−6, and SLm−2) may be defined as a second group of scan lines. The (4s−1)-th scan lines (SL3, SL7, SL11, . . . , SLm−5, and SLm−1) may be defined as a third group of scan lines, and the 4s-th scan lines (SL4, SL8, SL12, . . . , SLm−4, and SLm) may be defined as a fourth group of scan lines.

The carry signal output terminals COUT of the (4s−3)-th stages (STA1, STA5, STA9, STA13, . . . , STAm−7, STAm−3, and STAm+1) may be connected to the reset signal input terminals RT of their respective previous stages and the start signal input terminals ST of their respective subsequent stages. However, the carry signal output terminal COUT of the first stage STA1 may be connected to the start signal input terminal ST of a fifth stage STA5, which is subsequent to the first stage STA1, and the carry signal output terminal COUT of the (m+1)-th stage STAm+1 may be connected to the reset signal input terminal RT of an (m−3)-th stage STAm−3, which is previous to the (m+1)-th stage STAm+1.

The carry signal output terminals COUT of the (4s−2)-th stages (STA2, STA6, STA10, STA14, . . . , STAm−6, and STAm−2) may be connected to the reset signal input terminals RT of their respective previous stages and the start signal input terminals ST of their respective subsequent stages. However, the carry signal output terminal COUT of the second stage STA2 may be connected to the start signal input terminal ST of a sixth stage STA6, which is subsequent to the second stage STA2, and the carry signal output terminal COUT of the (m−2)-th stage STAm−2 may be connected to the reset signal input terminal RT of an (m−6)-th stage STAm−6, which is previous to the (m−2)-th stage STAm−2.

The carry signal output terminals COUT of the (4s−1)-th stages (STA3, STA7, STA11, STA15, . . . , STAm−5, and STAm−1) may be connected to the reset signal input terminals RT of their respective previous stages and the start signal input terminals ST of their respective subsequent stages. However, the carry signal output terminal COUT of the third stage STA3 may be connected to the start signal input terminal ST of a seventh stage STA7, which is subsequent to the third stage STA3, and the carry signal output terminal COUT of the (m−1)-th stage STAm−1 may be connected to the reset signal input terminal RT of an (m−5)-th stage STAm−5, which is previous to the (m−1)-th stage STAm−1.

The carry signal output terminals COUT of the 4s-th stages (STA4, STA8, STA12, STA16, . . . , STAm−4, and STAm) may be connected to the reset signal input terminals RT of their respective previous stages and the start signal input terminals ST of their respective subsequent stages. However, the carry signal output terminal COUT of the fourth stage STA4 may be connected to the start signal input terminal ST of an eighth stage STA8, which is subsequent to the fourth stage STA4, and the carry signal output terminal COUT of the m-th stage STAm may be connected to the reset signal input terminal RT of an (m−4)-th stage STAm−4, which is previous to the m-th stage STAm, and the fourth start signal line STRL4 or to the carry signal output terminal COUT of the dummy stage.

FIG. 22 is a layout view of a first display device according to an embodiments of the present disclosure.

The embodiments of FIG. 22 differs from the embodiments of FIG. 20 in that first, second, third, and fourth scan driving circuits GDC1, GDC2, GDC3, and GDC4 are located in (r−1)-th, r-th, (r+1)-th, and (r+2)-th display areas DAr−1, DAr, DAr+1, and DAr+2, respectively. The embodiments of FIG. 22 will hereinafter be described, focusing mainly on the differences with the embodiments of FIG. 20.

Referring to FIG. 22, the (r−1)-th, r-th, (r+1)-th, and (r+2)-th display areas DAr−1, DAr, DAr+1, and DAr+2 may be display areas located in the middle of a display panel 100. The r-th display area DAr may be located closer than the (r−1)-th display area DAr−1 to the center of the display panel 100, and the (r+1)-th display area DAr+1 may be closer than the (r+2)-th display area DAr+2 to the center of the display panel 100.

The first scan driving circuit GDC1 may receive a first scan control signal from an (r−1)-th source driving circuit SDCr−1. The first scan control signal may include a first clock signal and a first clock bar signal.

The first scan driving circuit GDC1 may be located in part of the (r−1)-th display area DAr−1. In one example, the first scan driving circuit GDC1 may be located along one edge of the (r−1)-th display area DAr−1, for example, along the right edge of the (r−1)-th display area DAr−1, as illustrated in FIG. 22, but the present disclosure is not limited thereto. In an example, the first scan driving circuit GDC1 may be located along the left edge of the (r−1)-th display area DAr−1 or in the middle of the (r−1)-th display area DAr−1.

The second scan driving circuit GDC2 may receive a second scan control signal from an r-th source driving circuit SDCr. The second scan control signal may include a second clock signal and a second clock bar signal.

The second scan driving circuit GDC2 may be located in part of the r-th display area DAr. In one example, the second scan driving circuit GDC2 may be located along one edge of the r-th display area DAr, for example, along the right edge of the r-th display area DAr, as illustrated in FIG. 22, but the present disclosure is not limited thereto. In an example, the second scan driving circuit GDC2 may be located along the left edge of the r-th display area DAr or in the middle of the r-th display area DAr.

The third scan driving circuit GDC3 may receive a third scan control signal from an (r+1)-th source driving circuit SDCr+1. The third scan control signal may include a third clock signal and a third clock bar signal.

The third scan driving circuit GDC3 may be located in part of the (r+1)-th display area DAr+1. In one example, the third scan driving circuit GDC3 may be located along one edge of the (r+1)-th display area DAr+1, for example, along the right edge of the (r+1)-th display area DAr+1, as illustrated in FIG. 22, but the present disclosure is not limited thereto. In an example, the third scan driving circuit GDC3 may be located along the left edge of the (r+1)-th display area DAr+1 or in the middle of the (r+1)-th display area DAr+1.

The fourth scan driving circuit GDC4 may receive a fourth scan control signal from an (r+2)-th source driving circuit SDCr+2. The fourth scan control signal may include a fourth clock signal and a fourth clock bar signal.

The fourth scan driving circuit GDC4 may be located in part of the (r+2)-th display area DAr+2. In one example, the fourth scan driving circuit GDC4 may be located along one edge of the (r+2)-th display area DAr+2, for example, along the right edge of the (r+2)-th display area DAr+2, as illustrated in FIG. 22, but the present disclosure is not limited thereto. In an example, the fourth scan driving circuit GDC4 may be located along the left edge of the (r+2)-th display area DAr+2 or in the middle of the (r+2)-th display area DAr+2.

The (4s-3)-th stages (STA1, STA5, STA9, STA13, . . . , STAm−7, STAm−3, and STAm+1) of the first scan driving circuit GDC1, the (4s-2)-th stages (STA2, STA6, STA10, STA14, . . . , STAm−6, and STAm−2) of the second scan driving circuit GDC2, the (4s-1)-th stages (STA3, STA7, STA11, STA15, . . . , STAm−5, and STAm−1) of the third scan driving circuit GDC3, and the 4s-th stages (STA4, STA8, STA12, STA16, . . . , STAm−4, and STAm) of the fourth scan driving circuit GDC4 are substantially the same as their respective counterparts of FIG. 6A or 6B, and thus, detailed descriptions thereof will be omitted.

As illustrated in FIG. 22, in a case where the first and second scan driving circuits GDC1 and GDC2 are located in the (r−1)-th and r-th display areas DAr−1 and DAr, respectively, and the third and fourth scan driving circuits GDC3 and GDC4 are located in the (r+1)-th and (r+2)-th display areas DAr+1 and DAr+2, respectively, scan lines connected to the first scan driving circuit GDC1 may extend from the (r−1)-th display area DAr−1 to the first display area DA1 and from the (r−1)-th display area DAr−1 to an n-th display area DAn, scan lines connected to the second scan driving circuit GDC2 may extend from the r-th display area DAr to the first display area DA1 and from the r-th display area DAr to the n-th display area DAn, scan lines connected to the third scan driving circuit GDC3 may extend from the (r+1)-th display area DAr+1 to the first display area DA1 and from the (r+1)-th display area DAr+1 to the n-th display area DAn, and scan lines connected to the fourth scan driving circuit GDC4 may extend from the (r+2)-th display area DAr+2 to the first display area DA1 and from the (r+2)-th display area DAr+2 to the n-th display area DAn.

In this case, the differences between the distance from the first scan driving circuit GDC1 to the left ends of the scan lines, the distance from the first scan driving circuit GDC1 to the right ends of the scan lines, the distance from the second scan driving circuit GDC2 to the left ends of the scan lines, the distance from the second scan driving circuit GDC2 to the right ends of the scan lines, the distance from the third scan driving circuit GDC3 to the left ends of the scan lines, the distance from the third scan driving circuit GDC3 to the right ends of the scan lines, the distance from the fourth scan driving circuit GDC4 to the left ends of the scan lines, and the distance from the fourth scan driving circuit GDC4 to the right ends of the scan lines may be reduced or minimized. Thus, the differences in RC delays in scan signals between the first, second, third, and fourth scan driving circuits GDC1, GDC2, GDC3, and GDC4 may be reduced or minimized.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
a display panel comprising a plurality of display areas, the plurality of display areas comprising scan lines, data lines, and pixels connected to the scan lines and the data lines;
a first source driving circuit connected to the data lines of a first display area from among the plurality of display areas;
a second source driving circuit connected to the data lines of a second display area from among the plurality of display areas;
a first scan driving circuit configured to receive a first clock signal from the first source driving circuit and to output first scan signals to a first group of scan lines from among the scan lines based on the first clock signal; and
a second scan driving circuit configured to receive a second clock signal from the second source driving circuit and to output second scan signals to a second group of scan lines from among the scan lines.

2. The display device of claim 1, wherein:
the first scan driving circuit is located adjacent to a first side of the display panel; and
the second scan driving circuit is located adjacent to a second side of the display panel.

3. The display device of claim 1, wherein the first and second scan driving circuits are located in a middle of the display panel.

4. The display device of claim 1, wherein:
the first group of scan lines are odd-numbered scan lines; and
the second group of scan lines are even-numbered scan lines.

5. The display device of claim 1, wherein:
the first scan driving circuit comprises a first group of stages that are connected to the first group of scan lines;
clock terminals of the first group of stages are connected in common to a first clock line for receiving the first clock signal; and
clock bar terminals of the first group of stages are connected in common to a first clock bar line for receiving a first clock bar signal having a different phase from the first clock signal.

6. The display device of claim 1, wherein:
the second scan driving circuit comprises a second group of stages that are connected to the second group of scan lines;
clock terminals of the second group of stages are connected in common to a second clock line for receiving the second clock signal; and
clock bar terminals of the second group of stages are connected in common to a second clock bar line for receiving a second clock bar signal having a different phase from the second clock signal.

7. The display device of claim 1, wherein:
the first scan driving circuit comprises a first group of stages that are connected to the first group of scan lines; and
each of the first group of stages comprises a first scan transistor configured to output the first clock signal, applied to clock terminals in accordance with a voltage of a first node, to one of the first group of scan lines, and a first scan capacitor that is located between a gate electrode and a source electrode of the first scan transistor.

8. The display device of claim 7, wherein:
the first scan transistor is located between a pair of pixels adjacent to each other in a first direction; and
the first scan transistor is located between another pair of pixels adjacent to each other in the first direction.

9. The display device of claim 8, wherein the first scan transistor and the first scan capacitor are arranged along a second direction that intersects the first direction.

10. The display device of claim 9, wherein:
the first direction is a direction in which the first group of scan lines extend; and
the second direction is a direction in which the data lines extend.

11. A display device comprising:
a display panel comprising a plurality of display areas, the plurality of display areas comprising scan lines, data lines, and pixels connected to the scan lines and the data lines;
a first source driving circuit connected to the data lines of a first display area from among the plurality of display areas;
a second source driving circuit connected to the data lines of a second display area from among the plurality of display areas;
a first scan driving circuit configured to receive a first clock signal from the first source driving circuit and to output first scan signals to a first group of scan lines from among the scan lines based on the first clock signal;
a second scan driving circuit configured to receive a second clock signal from the second source driving circuit and to output second scan signals to a second group of scan lines from among the scan lines;
a third source driving circuit connected to the data lines of a third display area from among the plurality of display areas;
a fourth source driving circuit connected to the data lines of a fourth display area from among the plurality of display areas;
a third scan driving circuit configured to receive a third clock signal from the third source driving circuit and to output third scan signals to a third group of scan lines from among the scan lines based on the third clock signal; and
a fourth scan driving circuit configured to receive a fourth clock signal from the fourth source driving circuit and to output fourth scan signals to a fourth group of scan lines from among the scan lines based on the fourth clock signal.

12. The display device of claim 11, wherein:
the first and second scan driving circuits are located on a first side of the display panel; and
the third and fourth scan driving circuits are located on a second side of the display panel.

13. The display device of claim 12, wherein:
the first scan driving circuit is located closer to the first side of the display panel than the second scan driving circuit; and
the fourth scan driving circuit is located closer to the second side of the display panel than the third scan driving circuit.

14. The display device of claim 11, wherein:
the first group of scan lines are (4s-3)-th scan lines, s being a positive integer;
the second group of scan lines are (4s-2)-th scan lines;
the third group of scan lines are (4s-1)-th scan lines; and
the fourth group of scan lines are 4s-th scan lines.

15. The display device of claim 11, wherein:
the third scan driving circuit comprises a third group of stages that are connected to the third group of scan lines;
clock terminals of the third group of stages are connected in common to a third clock line for receiving the third clock signal; and
clock bar terminals of the third group of stages are connected in common to a third clock bar line for receiving a third clock bar signal having a different phase from the third clock signal.

16. The display device of claim 11, wherein:
the fourth scan driving circuit comprises a fourth group of stages that are connected to the fourth group of scan lines;
clock terminals of the fourth group of stages are connected in common to a fourth clock line for receiving the fourth clock signal; and
clock bar terminals of the fourth group of stages are connected in common to a fourth clock bar line for receiving a fourth clock bar signal having a different phase from the fourth clock signal.

17. The display device of claim 11, wherein phases of the first, second, third, and fourth clock signals are sequentially delayed.

18. A tiled display device comprising:
a plurality of display devices; and
a seam located between the display devices,
wherein each of the display devices comprises a display panel comprising a plurality of display areas, the plurality of display areas comprising scan lines, data lines, and pixels connected to the scan lines and the data lines, a first scan driving circuit being located in a first display area from among the plurality of display areas, and a second scan driving circuit being located in a second display area from among the plurality of display areas,
wherein the first scan driving circuit includes a plurality of odd stages configured to output first scan signals to a first group of scan lines among the scan lines, and
wherein the second scan driving circuit includes a plurality of even stages configured to output second scan signals to a second group of scan lines among the scan lines, and
wherein a first stage of the plurality of odd stages and a second stage of the plurality of even stages are arranged in a same row.

19. The tiled display device of claim 18, wherein:
the first display area is located on a first side of the display panel; and
the second display area is located on a second side of the display panel.

20. The tiled display device of claim 18, wherein the first and second display areas are located in a middle of the display panel.

* * * * *